US011798487B2

(12) United States Patent
Feng et al.

(10) Patent No.: US 11,798,487 B2
(45) Date of Patent: Oct. 24, 2023

(54) DISPLAY PANEL AND DISPLAY DEVICE

(71) Applicants: Hefei BOE Joint Technology Co., Ltd., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Anhui (CN); BOE TECHNOLOGY GROUP CO., LTD, Beijing (CN)

( * ) Notice: Subject to any disclaimer, the term of this patent is extended or adjusted under 35 U.S.C. 154(b) by 34 days.

(21) Appl. No.: 17/769,457

(22) PCT Filed: Mar. 1, 2021

(86) PCT No.: PCT/CN2021/078538
§ 371 (c)(1),
(2) Date: Apr. 15, 2022

(87) PCT Pub. No.: WO2022/183343
PCT Pub. Date: Sep. 9, 2022

(65) Prior Publication Data
US 2023/0162686 A1 May 25, 2023

(51) Int. Cl.
*G09G 3/3266* (2016.01)
*H10K 59/126* (2023.01)
*H10K 59/131* (2023.01)
*G11C 19/28* (2006.01)

(52) U.S. Cl.
CPC ........... *G09G 3/3266* (2013.01); *G11C 19/28* (2013.01); *H10K 59/126* (2023.02); *H10K 59/1315* (2023.02); *G09G 2310/0286* (2013.01)

(58) Field of Classification Search
CPC ......... G09G 3/3266; G09G 2310/0286; G09G 2300/0408; G09G 2300/0819;
(Continued)

(56) References Cited

U.S. PATENT DOCUMENTS

| 2016/0064467 A1 | 3/2016 | Ota et al. |
| 2017/0062546 A1 | 3/2017 | Kim et al. |

(Continued)

FOREIGN PATENT DOCUMENTS

| CN | 103839915 | 6/2014 |
| CN | 104934005 | 9/2015 |

(Continued)

OTHER PUBLICATIONS

PCT International Search Report (with English translation) and Written Opinion for corresponding PCT Application No. PCT/CN2021/078538, dated Dec. 8, 2021, 11 pages.

*Primary Examiner* — Mihir K Rayan
(74) *Attorney, Agent, or Firm* — Dority & Manning, P.A.

(57) ABSTRACT

A display panel has a display area including a plurality of pixel areas arranged in an array and a plurality of gate driving circuit areas. Each pixel area includes a pixel light-emitting sub-area and a pixel circuit sub-area arranged in a first direction. Pixel areas in each row correspond to at least two gate driving circuit areas each located between two adjacent pixel areas in this row. The display panel includes a gate driving circuit and a plurality of light-shielding portions. The gate driving circuit includes a plurality of shift registers that are cascaded. Each shift register includes a plurality of transistor groups, and each transistor group includes at least one transistor. Each light-shielding portion is located in a gate driving circuit area in which a transistor (Continued)

group is disposed, and is disposed on a periphery of the transistor group, and is electrically connected to a power supply signal line.

20 Claims, 13 Drawing Sheets

(58) Field of Classification Search
CPC ..... G09G 2310/062; G09G 2320/0295; G09G 2320/045; G09G 3/3258; G09G 3/32; G09G 3/20; G11C 19/28; H10K 59/126; H10K 59/1315; H10K 59/00

See application file for complete search history.

(56) References Cited

U.S. PATENT DOCUMENTS

| | | | |
|---|---|---|---|
| 2017/0117341 | A1 | 4/2017 | Chen et al. |
| 2018/0308987 | A1 | 10/2018 | Sakai et al. |
| 2019/0027549 | A1 | 1/2019 | Ai et al. |
| 2019/0288056 | A1* | 9/2019 | Xiao ................... H10K 59/1216 |
| 2020/0006461 | A1 | 1/2020 | Cho et al. |
| 2020/0044093 | A1 | 2/2020 | Liu et al. |
| 2020/0219901 | A1 | 7/2020 | Gao et al. |
| 2021/0013232 | A1 | 1/2021 | Zang et al. |
| 2021/0201837 | A1* | 7/2021 | Kuo ..................... G09G 3/3677 |
| 2021/0335221 | A1* | 10/2021 | Ma ....................... H10K 59/131 |

FOREIGN PATENT DOCUMENTS

| | | |
|---|---|---|
| CN | 207425860 | 5/2018 |
| CN | 109494257 | 3/2019 |
| CN | 110729313 | 1/2020 |
| CN | 110911424 | 3/2020 |
| JP | 2013168341 | 8/2013 |
| KR | 20060069186 | 6/2006 |
| KR | 20160073928 | 6/2016 |

* cited by examiner

DISPLAY PANEL AND DISPLAY DEVICE

CROSS-REFERENCE TO RELATED APPLICATION

This application is a national phase entry under 35 USC 371 of International Patent Application No. PCT/CN 2021/078538 filed on Mar. 1, 2021, which is incorporated herein by reference in its entirety.

TECHNICAL FIELD

The present disclosure relates to the field of display technologies, and in particular, to a display panel and a display device.

BACKGROUND

A gate driving circuit is an important component of a display device. The gate driving circuit may include a plurality of stages of shift registers that are cascaded. The shift register generates a scan signal to scan sub-pixels in rows in the display device, so that the display device is able to display a screen.

The gate driving circuit is provided in a display panel of the display device, so that a bezel of the display device is able to be narrowed, and a process is able to be simplified.

SUMMARY

In an aspect, a display panel is provided. The display panel has a display area, and the display area includes a plurality of pixel areas arranged in an array and a plurality of gate driving circuit areas. Each pixel area includes a pixel light-emitting sub-area and a pixel circuit sub-area arranged in a first direction. Pixel areas in each row correspond to at least two gate driving circuit areas each located between two adjacent pixel areas in this row. The first direction is a column direction of the plurality of pixel areas arranged in the array.

The display panel includes a plurality of sub-pixels, a gate driving circuit, a plurality of power supply signal lines and a plurality of light-shielding portions. Each pixel area is provided with at least two sub-pixels therein. The gate driving circuit includes a plurality of shift registers that are cascaded. Each shift register is electrically connected to sub-pixels in a row, and includes a plurality of transistor groups that are respectively disposed in at least two gate driving circuit areas corresponding to pixel areas in this row. Each transistor group is located between pixel light-emitting sub-areas of two adjacent pixel areas, and includes at least one transistor.

Each power supply signal line is disposed on a side of a column of pixel areas in a second direction. In a gate driving circuit area in which a transistor group is disposed, a power supply signal line is located between a pixel area adjacent to the gate driving circuit area and the transistor group. The second direction is a row direction of the plurality of pixel areas arranged in the array. Each light-shielding portion is located in a gate driving circuit area in which a transistor group is disposed. The light-shielding portion is disposed on a periphery of the transistor group, and is electrically connected to a power supply signal line.

In some embodiments, the light-shielding portion includes a first sub-light-shielding portion located between the transistor group and the power supply signal line.

In some embodiments, two pixel light-emitting sub-areas that are located on two sides of the transistor group and adjacent to the transistor group are a first pixel light-emitting sub-area and a second pixel light-emitting sub-area, respectively. The first sub-light-shielding portion and the power supply signal line are located on a side of the transistor group proximate to the second pixel light-emitting sub-area. The light-shielding portion further includes a second sub-light-shielding portion disposed between the transistor group and the first pixel light-emitting sub-area. The second sub-light-shielding portion is electrically connected to the first sub-light-shielding portion.

In some embodiments, the first sub-light-shielding portion extends in the first direction, and a dimension of the first sub-light-shielding portion in the first direction is greater than or equal to a dimension of the transistor group in the first direction; and/or the second sub-light-shielding portion extends in the first direction and a dimension of the second sub-light-shielding portion in the first direction is greater than or equal to the dimension of the transistor group in the first direction.

In some embodiments, a dimension of the first sub-light-shielding portion in the second direction is less than a dimension of the second sub-light-shielding portion in the second direction.

In some embodiments, the light-shielding portion further includes a third sub-light-shielding portion disposed on a side of the transistor group proximate to a pixel circuit sub-area of pixel areas adjacent to the transistor group. Two ends of the third sub-light-shielding portion are electrically connected to the first sub-light-shielding portion and the second sub-light-shielding portion, respectively.

In some embodiments, a dimension of the third sub-light-shielding portion in the first direction is greater than a dimension of the first sub-light-shielding portion in the second direction.

In some embodiments, the display panel includes a substrate, a semiconductor layer disposed on the substrate, and a light-emitting layer disposed on a side of the semiconductor layer away from the substrate. The semiconductor layer includes active layers of transistors in the transistor groups. A film layer in which the plurality of light-shielding portions are located is located between the semiconductor layer and the light-emitting layer in a direction perpendicular to the substrate.

In some embodiments, the display panel further includes a source-drain metal layer disposed between the semiconductor layer and the light-emitting layer. The plurality of power supply signal lines, sources and drains of the transistors in the transistor groups, and the plurality of light-shielding portions are disposed in the source-drain metal layer. The first sub-light-shielding portion of the light-shielding portion is spaced apart from a source and a drain of a transistor proximate to the first sub-light-shielding portion. In a case where the light-shielding portion further includes the second sub-light-shielding portion, the second sub-light-shielding portion is spaced apart from a source and a drain of a transistor proximate to the second sub-light-shielding portion. In a case where the light-shielding portion further includes the third sub-light-shielding portion, the third sub-light-shielding portion is spaced apart from a source and a drain of a transistor proximate to the third sub-light-shielding portion.

In some embodiments, the first sub-light-shielding portion of the light-shielding portion and the power supply signal line adjacent to the first sub-light-shielding portion are of an integrative structure.

In some embodiments, the display panel further includes a gate metal layer and a source-drain metal layer that are disposed between the semiconductor layer and the light-emitting layer. The source-drain metal layer is away from the substrate relative to the gate metal layer. The plurality of light-shielding portions are disposed in the gate metal layer. The plurality of power supply signal lines, and sources and drains of the transistors in the transistor groups are disposed in the source-drain metal layer.

In some embodiments, in a case where the light-shielding portion includes the first sub-light-shielding portion and the second sub-light-shielding portion, the light-shielding portion further includes a fourth sub-light-shielding portion disposed on a side of the transistor group away from a pixel circuit sub-area of pixel areas adjacent to the transistor group. Two ends of the fourth sub-light-shielding portion are electrically connected to the first sub-light-shielding portion and the second sub-light-shielding portion, respectively.

In some embodiments, in a case where the light-shielding portion further includes the third sub-light-shielding portion, the first sub-light-shielding portion, the second sub-light-shielding portion, the third sub-light-shielding portion and the fourth sub-light-shielding portion are connected to be frame-shaped.

In some embodiments, the display panel further includes a plurality of auxiliary power supply signal lines disposed in the gate metal layer. A power supply signal line corresponds to at least one auxiliary power supply signal line. Orthographic projections of the power supply signal line and an auxiliary power supply signal line in the at least one auxiliary power supply signal line on a plane where the display panel is located are at least partially overlapped with each other. The power supply signal line and the auxiliary power supply signal line are electrically connected through at least one first via hole. The light-shielding portion is electrically connected to the power supply signal line through an auxiliary power supply signal line.

In some embodiments, the first sub-light-shielding portion of the light-shielding portion and the auxiliary power supply signal line are of an integrative structure.

In some embodiments, the power supply signal line is electrically connected to auxiliary power supply signal lines. A dimension of each auxiliary power supply signal line in the first direction is substantially equal to a dimension of the pixel light-emitting sub-area in the first direction. Each auxiliary power supply signal line is electrically connected to a corresponding power supply signal line through a plurality of first via holes, and the plurality of first via holes are arranged in the first direction. A distance between two farthest first via holes is less than the dimension of the auxiliary power supply signal line in the first direction.

In some embodiments, the display panel includes a substrate, and a gate metal layer and a source-drain metal layer that are disposed on the substrate. The source-drain metal layer is away from the substrate relative to the gate metal layer. A plurality of first connection lines are disposed in the gate metal layer, and extend in the first direction. A gate of each transistor in a same transistor group is electrically connected to a first connection line. A plurality of second connection lines are disposed in the source-drain metal layer, and extend in the first direction. An end of each second connection line is electrically connected to a first connection line through a second via hole, and another end of the second connection line is electrically connected to another transistor group.

In some examples, in a case where the light-shielding portion is disposed in the source-drain metal layer, in a same gate driving circuit area, orthographic projections of a first connection line and a portion of a second connection line located in the gate driving circuit area on the substrate do not intersect with an orthographic projection of a light-shielding portion on the substrate.

In some other examples, in a case where the light-shielding portion is disposed in the gate metal layer, and the light-shielding portion further includes a fourth sub-light-shielding portion, in a same gate driving circuit area, a fourth sub-light-shielding portion is located on a side of a second via hole away from a transistor group, and two ends of the fourth sub-light-shielding portion are electrically connected to a first sub-light-shielding portion and a second sub-light-shielding portion, respectively.

In some embodiments, a plurality of third connection lines are disposed in the source-drain metal layer, and extend in the first direction. A source and a drain of each transistor in a same transistor group are electrically connected to two third connection lines, respectively. A plurality of fourth connection lines are disposed in the gate metal layer, and extend in the second direction. Each second connection line is further electrically connected to a fourth connection line, so as to be electrically connected to another transistor group. Each third connection line is further electrically connected to a fourth connection line, so as to be electrically connected to another transistor group.

In another aspect, a display device is provided. The display device includes the display panel in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings.

In addition, the accompanying drawings to be described below may be regarded as schematic diagrams, but are not limitations on an actual size of a product, an actual process of a method and an actual timing of a signal involved in the embodiments of the present disclosure.

DETAILED DESCRIPTION

Figure 1:
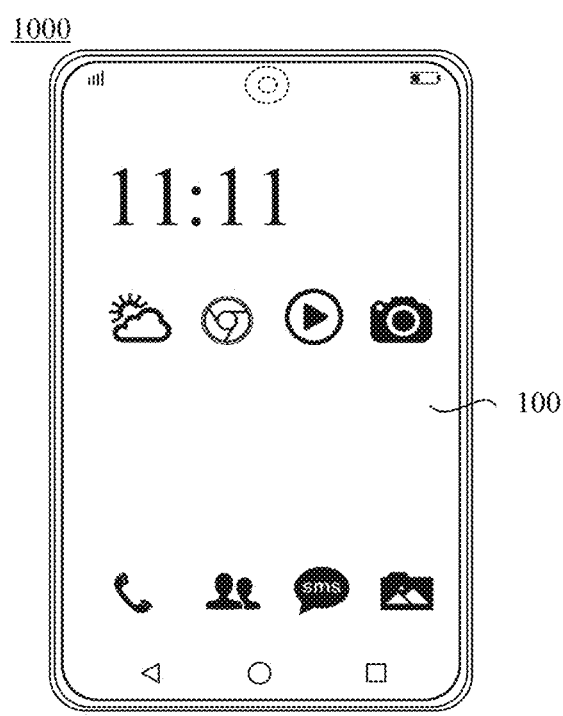
FIG. 1 is a structural diagram of a display device, in accordance with some embodiments.

Technical solutions in some embodiments of the present disclosure will be described dearly and completely with reference to the accompanying drawings below.

Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms such as "coupled" and "connected" and extensions thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact with each other. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

As used herein, the term "if" is optionally construed to mean "when" or "in a case where" or "in response to determining" or "in response to detecting", depending on the context. Similarly, the phrase "if it is determined" or "if [a stated condition or event] is detected" is optionally construed to mean "when it is determined" or "in response to determining" or "when [the stated condition or event] is detected" or "in response to detecting [the stated condition or event]", depending on the context.

The use of "applicable to" or "configured to" herein means an open and inclusive expression, which does not exclude devices that are applicable to or configured to perform additional tasks or steps.

In additional, the use of "based on" is meant to be open and inclusive, in that a process, step, calculation, or other action "based on" one or more stated conditions or values may, in practice, be based on additional conditions or values beyond those stated.

The term such as "about," "substantially," or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a display panel and a display device. The display panel and the display device will be introduced below.

As shown in FIG. 1, some embodiments of the present disclosure provide the display device 1000. The display device 1000 may be any device that displays images whether moving (e.g., videos) or stationary (e.g., still images). It is anticipated that the embodiments may be implemented in, or associated with, a variety of electronic apparatuses. The variety of electronic apparatuses are, but are not limited to, mobile phones, wireless apparatuses, personal data assistants (PDAs), hand-held or portable computers, GPS receivers/navigators, cameras, MP4 video players, video cameras, game consoles, watches, docks, calculators, television monitors, flat panel displays, computer monitors, automobile displays (e.g., odometer displays), navigators, cockpit controllers and/or displays, camera view displays (e.g., rearview camera displays in vehicles), electronic photos, electronic billboards or signs, projectors, architectural structures, packagings and aesthetic structures (e.g., displays for displaying an image of a piece of jewelry).

In some examples, as shown in FIG. 1, the display device 1000 includes a frame, and the display panel 100, a circuit board, a display driving integrated circuit (IC) and other electronic accessories that are provided in the frame.

In some examples, a shape of the display panel 100 may be a non-rectangular shape. For example, in a case where the display panel 100 is applied to a building, the shape of the display panel 100 may be set according to a shape of the building and requirements of an application site environment.

For example, the shape of the display panel 100 may be a circle, ellipse, arc or rhombus.

The display panel 100 may be, for example, an organic light-emitting diode (OLED) display panel, a quantum dot light-emitting diode (QLED) display panel, or a micro light-emitting diode (Micro LED) display panel, which is not limited.

A schematic description will be made in some embodiments of the present disclosure below in an example where the display panel 100 is the OLED display panel.

Figure 2:
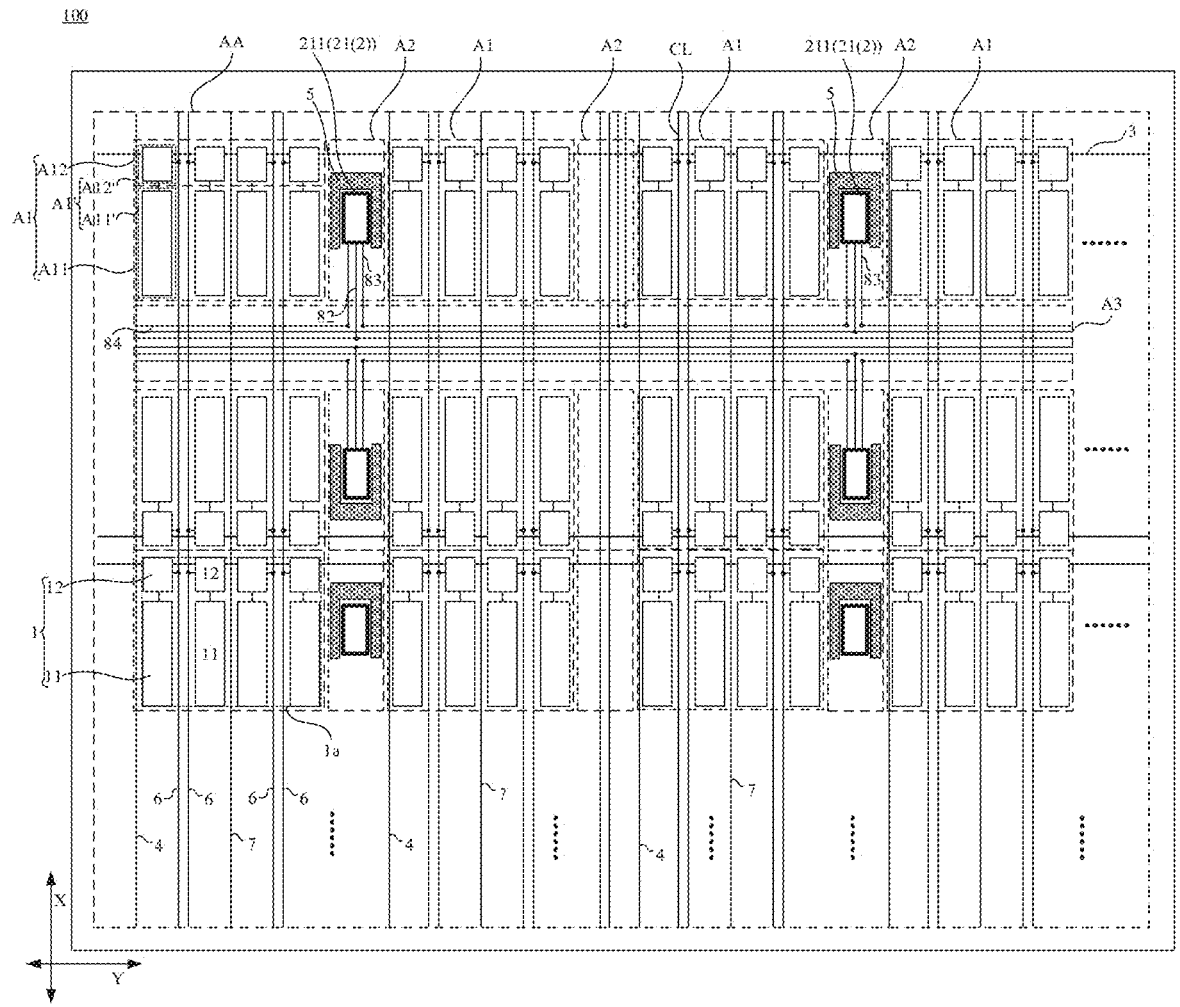
FIG. 2 is an overall structural diagram of a display panel, in accordance with some embodiments.

As shown in FIG. 2, some embodiments of the present disclosure provide the display panel 100. The display panel includes a plurality of sub-pixels 1, a gate driving circuit 2, and a plurality of gate lines 3.

In some examples, the plurality of sub-pixels 1 are arranged in an array, and sub-pixels 1 in each row are electrically connected to a gate line 3. Each sub-pixel 1 includes a pixel circuit 12 and a light-emitting device 11 electrically connected to the pixel circuit 12. The pixel circuit 12 is configured to drive the light-emitting device 11 to emit light, and thus the light-emitting devices 11 each emit light under a driving of a corresponding pixel circuit 12, so that the display panel 100 is able to display a screen.

The gate driving circuit 2 is electrically connected to the plurality of sub-pixels 1 through the plurality of gate lines 3. The gate driving circuit 2 includes a plurality of stages of shift registers 21 that are cascaded. The gate driving circuit 2 is configured to realize a shift register function, i.e., providing a scan signal (or referred to as a gate signal) to each gate line row by row in a frame. The scan signal is a pulse signal with a certain pulse width, so as to drive each gate line, and thus the plurality of sub-pixels 1 start to operate under a control of the scan signal transmitted by each gate line, so that the display panel 100 display a screen.

Exemplary structures of the pixel circuit 12 included in the sub-pixel 1 and the gate driving circuit 2 will be introduced below.

In the display panel 100, the pixel circuit 12 included in each sub-pixel 1 includes various structures, which may be selectively set according to actual requirements. For example, the pixel circuit 12 may include a structure such as "2T1C," "6T1C," "7T1C," "6T2C," or "7T2C". Here, "T" represents a thin film transistor, the number before "T" represents the number of thin film transistors, "C" represents a storage capacitor, and the number before "C" represents the number of storage capacitors. The pixel circuit 12 may include a switching transistor and a driving transistor.

Here, during the use of the display panel 100, the thin film transistor in the pixel circuit 12 and the light-emitting device 11 may each have a decreased stability (e.g., a threshold voltage shift of the driving transistor), which affects a display effect of the display panel 100. In this way, the sub-pixel 1 is required to be compensated.

There are various methods to compensate the sub-pixel 1, which may be selectively set according to actual requirements. For example, a pixel compensation circuit may be provided in the sub-pixel 1 to internally compensate the sub-pixel 1 by using the pixel compensation circuit. For another example, the driving transistor or the light-emitting device 11 may be sensed through a thin film transistor in the sub-pixel 1, and sensed data may be transmitted to an external sensing circuit, so as to calculate a driving voltage value to be compensated by using the external sensing circuit and perform feedback, thereby realizing an external compensation of the sub-pixel 1.

Considering the external compensation method (i.e., the method of sensing the driving transistor) and the pixel circuit 12 of the 3T1C structure as an example, a structure and an operating process of the sub-pixel 1 will be schematically described.

Figure 3A:
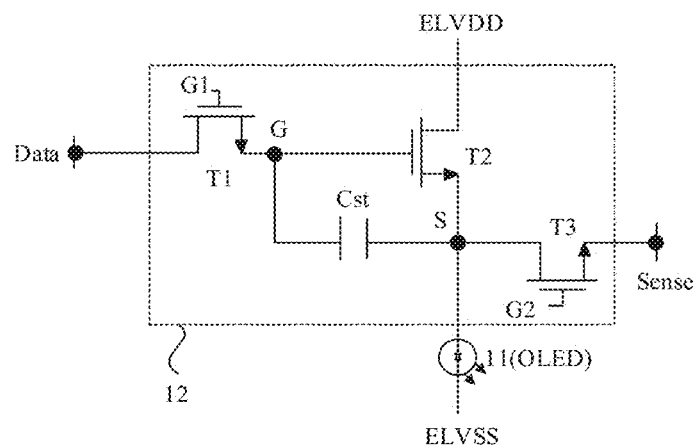
FIG. 3A is a structural diagram of a pixel circuit, in accordance with some embodiments.

For example, as shown in FIG. 3A, the pixel circuit 12 may include the switching transistor T1, the driving transistor T2, a sensing transistor T3 and a storage capacitor Cst.

For example, as shown in FIG. 3A, a control electrode of the switching transistor T1 is electrically connected to a first gate signal terminal G1, a first electrode of the switching transistor T1 is electrically connected to a data signal terminal Data, and a second electrode of the switching transistor T1 is electrically connected to a first node G. The switching transistor T1 is configured to transmit one of data signals received at the data signal terminal Data to the first node G in response to a first gate signal received at the first gate signal terminal G1.

Here, the data signals include, for example, a detection data signal and a display data signal.

For example, as shown in FIG. 3A, a control electrode of the driving transistor T2 is electrically connected to the first node G, a first electrode of the driving transistor T2 is electrically connected to a fourth voltage signal terminal ELVDD, and a second electrode of the driving transistor T2 is electrically connected to a second node S. The driving transistor T2 is configured to transmit a fourth voltage signal received at the fourth voltage signal terminal ELVDD to the second node S under a control of a voltage of the first node G.

For example, as shown in FIG. 3A, a first terminal of the storage capacitor Cst is electrically connected to the first node G, and a second terminal of the storage capacitor Cst is electrically connected to the second node S. The switching transistor T1 charges the first node G and the storage capacitor Cst synchronously.

For example, as shown in FIG. 3A, an anode of the light-emitting device 11 is electrically connected to the second node S, and a cathode of the light-emitting device 11 is electrically connected to a fifth voltage signal terminal ELVSS. The light emitting device 11 is configured to emit light under a cooperation of the fourth voltage signal from the second node S and a fifth voltage signal transmitted by the fifth voltage signal terminal ELVSS.

For example, as shown in FIG. 3A, a control electrode of the sensing transistor T3 is electrically connected to a second gate signal terminal G2, a first electrode of the sensing transistor T3 is electrically connected to the second node S, and a second electrode of the sensing transistor T3 is electrically connected to a sensing signal terminal Sense. The sensing transistor T3 is configured to detect electrical characteristic(s) of the driving transistor T2 in response to a second gate signal received at the second gate signal terminal G2, so as to realize the external compensation. The electrical characteristic(s) include, for example, a threshold voltage and/or a carrier mobility of the driving transistor T2.

Here, the sensing signal terminal Sense may provide a reset signal or acquire a sensing signal. The reset signal is used for resetting the second node S, and the sensing signal is used for acquiring the threshold voltage of the driving transistor T2.

Based on the above structure of the pixel circuit 12, in some embodiments, the first gate signal received at the first gate signal terminal G1 and the second gate signal received at the second gate signal terminal G2 may be same for each sub-pixel 1. In some examples, pixel circuits 12 in sub-pixels 1 in a same row may be electrically connected to two gate lines 3 (i.e., a first gate line and a second gate line), and a first gate signal transmitted by the first gate line and a second gate signal transmitted by the second gate line are the same. Alternatively, pixel circuits 12 in sub-pixels 1 in a same row may be electrically connected to a gate line, and this gate line transmits the first gate signal and the second gate signal.

In these examples, a display phase of a frame may include, for example, a display period and a blanking period that are performed sequentially.

In the display period in the display phase of the frame, the operating process of the sub-pixel 1 may include, for example, a reset phase, a data writing phase and a light-emitting phase. Hereinafter, circuits in the embodiments of the present disclosure will be described in an example where transistors are all N-type transistors.

In the reset phase, a level of the second gate signal provided by the second gate signal terminal G2 is a high level, and the sensing signal terminal Sense provides the reset signal (a level of the reset signal is, for example, a low level). The sensing transistor T3 is turned on under a control of the second gate signal, so as to receive the reset signal and transmit the reset signal to the second node S to reset the second node S.

In the data writing phase, a level of the first gate signal provided by the first gate signal terminal G1 is a high level, and a level of the display data signal provided by the data signal terminal Data is a high level. The switching transistor T1 is turned on under a control of the first gate signal, so as to receive the display data signal and transmit the display data signal to the first node G. The storage capacitor Cst is charged synchronously.

In the light-emitting phase, the level of the first gate signal provided by the first gate signal terminal G1 is a low level, the level of the second gate signal provided by the second gate signal terminal G2 is a low level, and a level of the fourth voltage signal provided by the fourth voltage signal terminal ELVDD is a high level. The switching transistor T1 is turned off under the control of the first gate signal, and the sensing transistor T3 is turned off under the control of the second gate signal. The storage capacitor Cst starts to discharge, so that the voltage of the first node G is maintained at a high level. The driving transistor T2 is turned on under the control of the voltage of the first node G, so as to receive the fourth voltage signal and transmit the fourth voltage signal to the second node S, so that the light-emitting device 11 emits light under the cooperation of the fourth voltage signal and the fifth voltage signal transmitted by the fifth voltage signal terminal ELVSS.

In the blanking period in the display phase of the frame, the operating process of the sub-pixel 1 may include, for example, a first phase and a second phase.

In the first phase, the level of the first gate signal provided by the first gate signal terminal G1 and the level of the second gate signal provided by the second gate signal terminal G2 are high levels, and a level of the detection data signal provided by the data signal terminal Data is a high level. The switching transistor T1 is turned on under the control of the first gate signal, so as to receive the detection data signal and transmit the detection data signal to the first node G to charge the first node G. The sensing transistor T3 is turned on under the control of the second gate signal, so as to receive the reset signal provided by the sensing signal terminal Sense and transmit the reset signal to the second node S.

In the second phase, the sensing signal terminal Sense is in a floating state. The driving transistor T2 is turned on under the control of the voltage of the first node G, so as to receive the fourth voltage signal provided by the fourth voltage signal terminal ELVDD and transmit the fourth voltage signal to the second node S to charge the second node S, so that a voltage of the second node S is increased until the driving transistor T2 is turned off. In this case, a voltage difference Vgs between the first node G and the second node S is equal to the threshold voltage Vth of the driving transistor T2.

Since the sensing transistor T3 is in an on state, and the sensing signal terminal Sense is in the floating state, the driving transistor T2 charges the second node S and the sensing signal terminal Sense synchronously. By sampling a voltage of the sensing signal terminal Sense (i.e., acquiring the sensing signal), the threshold voltage Vth of the driving transistor T2 may be calculated according to a relationship between the voltage of the sensing signal terminal Sense and the level of the detection data signal.

After the threshold voltage Vth of the driving transistor T2 is calculated, the threshold voltage Vth may be compensated into a display data signal in a display period in a display phase of a next frame, so that the external compensation of the sub-pixel 1 is completed.

In some examples, the gate driving circuit 2 may include the plurality of stages of shift registers 21 that are cascaded. A stage of shift register 21 may be electrically connected to pixel circuits 12 in sub-pixels 1 in a row.

It will be noted that in the display phase of the frame, the gate driving circuit 2 provides both the first gate signal transmitted by the first gate signal terminal G1 and the second gate signal transmitted by the second gate signal terminal G2. That is, each stage of shift register 21 in the gate driving circuit 2 may be electrically connected to the first gate signal terminal G1 through the first gate line to transmit the first gate signal to the first gate signal terminal G1 through the first gate line, and may be electrically connected to the second gate signal terminal G2 through the second gate line to transmit the second gate signal to the second gate signal terminal G2 through the second gate line.

The shift register 21 includes various structures, which may be selectively set according to actual requirements. Two structures of the shift register 21 will be schematically described below, but the shift register 21 is not limited thereto.

Figure 3B:
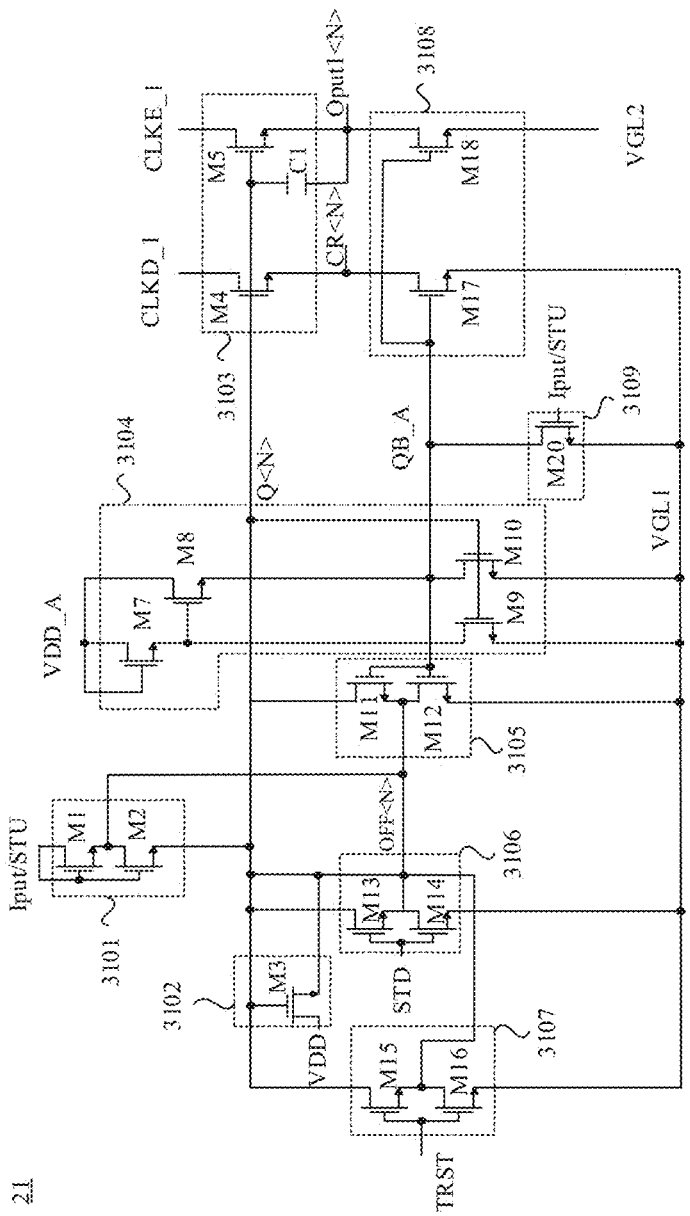
FIG. 3B is a structural diagram of a shift register, in accordance with some embodiments.
Figure 3C:
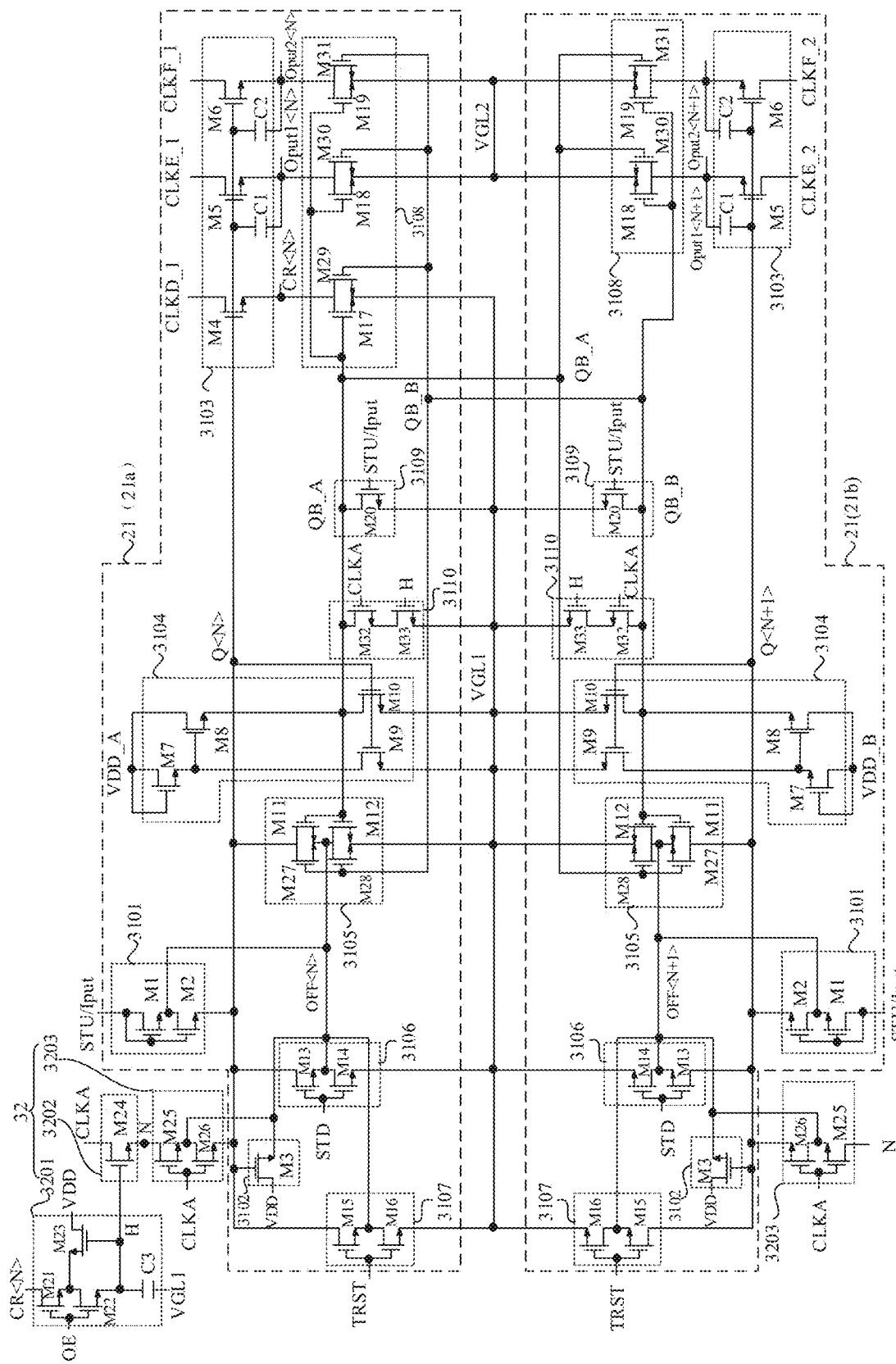
FIG. 3C is a structural diagram of another shift register, in accordance with some embodiments.

In some examples, as shown in FIGS. 3B and 3C, the shift register 21 may include a first input circuit 3101, an anti-leakage circuit 3102, an output circuit 3103, a control circuit 3104, a first reset circuit 3105, a second reset circuit 3106, a third reset circuit 3107, a fourth reset circuit 3108 and a fifth reset circuit 3109.

For example, as shown in FIGS. 3B and 3C, the first input circuit 3101 is electrically connected to an input signal terminal Input (i.e., I put in the drawings and in the following), a pull-up node Q<N> and an anti-leakage node OFF<N>. The first input circuit 3101 is configured to, in the display period in the display phase of the frame, in response to an input signal received at the input signal terminal Iput, transmit the input signal to the pull-up node Q<N>. Here, N is a positive integer representing a row number of sub-pixels.

For example, in the display period in the display phase of the frame, in a case where a level of the input signal is a high level, the first input circuit 3101 may be turned on due to an action of the input signal to transmit the input signal to the pull-up node Q<N>, so as to charge the pull-up node Q<N>, so that a voltage of the pull-up node Q<N> is increased.

As shown in FIGS. 3B and 3C, the first input circuit 3101 may include a first transistor M1 and a second transistor M2.

For example, as shown in FIGS. 3B and 3C, a control electrode of the first transistor M1 is electrically connected to the input signal terminal Iput, a first electrode of the first transistor M1 is electrically connected to the input signal terminal Iput, and a second electrode of the first transistor M1 is electrically connected to a first electrode of the second transistor M2 and the anti-leakage node OFF<N>. A control electrode of the second transistor M2 is electrically connected to the input signal terminal Iput, and a second electrode of the second transistor M2 is electrically connected to the pull-up node Q<N>.

Here, in the display period in the display phase of the frame, in the case where the level of the input signal transmitted by the input signal terminal Iput is a high level, the first transistor M1 and the second transistor M2 may be turned on synchronously due to the action of the input signal. The first transistor M1 may receive the input signal transmitted by the input signal terminal Iput, and transmit the received input signal to the first electrode of the second transistor M2 and the anti-leakage node OFF<N>. The second transistor M2 may transmit the received input signal to the pull-up node Q<N> to charge the pull-up node Q<N>, so that the voltage of the pull-up node Q<N> is increased.

For example, as shown in FIGS. 3B and 3C, the anti-leakage circuit 3102 is electrically connected to the pull-up node Q<N>, a first voltage signal terminal VDD and the anti-leakage node OFF<N>. The anti-leakage circuit 3102 is configured to transmit a first voltage signal transmitted by the first voltage signal terminal VDD to the anti-leakage node OFF<N> under a control of the voltage of the pull-up node Q<N>, so as to avoid an electric leakage of the pull-up node Q<N>. The first voltage signal is, for example, a constant high voltage signal.

For example, in a case where the voltage of the pull-up node Q<N> is at a high level, the anti-leakage circuit 3102 may be turned on under the control of the voltage of the pull-up node Q<N>, so as to receive and transmit the first voltage signal to the anti-leakage node OFF<N>, so that a voltage of the anti-leakage node OFF<N> is increased.

As shown in FIGS. 3B and 3C, the anti-leakage circuit 3102 may include a third transistor M3.

For example, as shown in FIGS. 3B and 3C, a control electrode of the third transistor M3 is electrically connected to the pull-up node Q<N>, a first electrode of the third transistor M3 is electrically connected to the first voltage signal terminal VDD, and a second electrode of the third transistor M3 is electrically connected to the anti-leakage node OFF<N>.

Here, in the case where the voltage of the pull-up node Q<N> is at a high level, the third transistor M3 may be turned on under the control of the voltage of the pull-up node Q<N> to transmit the first voltage signal to the anti-leakage node OFF<N>, so that the voltage of the anti-leakage node OFF<N> is increased, and a voltage difference between the control electrode and the second electrode of the second transistor M2 is less than zero, thereby ensuring that the second transistor M2 is completely or relatively completely turned off. In this way, the electric leakage of the pull-up node Q<N> through the first input circuit 3101 may be avoided, so that the pull-up node Q<N> is able to be maintained at a high and stable voltage.

For example, as shown in FIGS. 3B and 3C, the output circuit 3103 is electrically connected to the pull-up node Q<N>, a first clock signal terminal CLKE_1 and a first output signal terminal Output1<N> (i.e., Oput1<N> in the drawings and in the following). The output circuit 3103 is configured to, in the display period in the display phase of the frame, transmit a first clock signal received at the first clock signal terminal CLKE_1 to the first output signal terminal Oput1<N> under the control of the voltage of the pull-up node Q<N>.

Of course, as shown in FIGS. 3B and 3C, the output circuit 3103 may be further electrically connected to, for example, a third clock signal terminal CLKD_1 and a shift signal terminal CR<N>. The output circuit 3103 is further configured to, in the display period in the display phase of the frame, transmit a third clock signal received at the third clock signal terminal CLKD_1 to the shift signal terminal CR<N> under the control of the voltage of the pull-up node Q<N>.

Of course, as shown in FIG. 3C, the output circuit 3103 may be further electrically connected to, for example, a fourth clock signal terminal CLKF_1 and a second output signal terminal Output2<N> (i.e., Oput2<N> in the drawings and in the following). The output circuit 3103 is further configured to, in the blanking period in the display phase of the frame, transmit a fourth clock signal received at the fourth clock signal terminal CLKF_1 to the second output signal terminal Oput2<N> under the control of the voltage of the pull-up node Q<N>.

For example, in the display period in the display phase of the frame, in a case where the voltage of the pull-up node Q<N> is increased, the output circuit 3103 may be turned on under the control of the voltage of the pull-up node Q<N>, so that the third clock signal received at the third clock signal terminal CLKD_1 is output as a shift signal from the shift signal terminal CR<N>, and the first clock signal received at the first clock signal terminal CLKE_1 is output as a first output signal from the first output signal terminal Oput1<N>. In the blanking period in the display phase of the frame, in the case where the voltage of the pull-up node Q<N> is increased, the output circuit 3103 may be turned on under the control of the voltage of the pull-up node Q<N>, so that the fourth clock signal received at the fourth clock signal terminal CLKF_1 is output as a second output signal from the second output signal terminal Oput2<N>.

In these examples, the first output signal terminal Oput1<N> may be electrically connected to the first gate line, and the first output signal output from the first output signal terminal Oput1<N> may be transmitted as the first gate signal to the pixel circuit 12 sequentially through the first gate line and the first gate signal terminal G1. The second output signal terminal Oput2<N> may be electrically connected to the second gate line, and the second output signal output from the second output signal terminal Oput2<N> may be transmitted as the second gate signal to the pixel circuit 12 sequentially through the second gate line and the second gate signal terminal G2.

As shown in FIG. 3C, the output circuit 3103 may include a fourth transistor M4, a fifth transistor M5, a sixth transistor M6, a first capacitor C1 and a second capacitor C2.

For example, as shown in FIG. 3C, a control electrode of the fourth transistor M4 is electrically connected to the pull-up node Q<N>, a first electrode of the fourth transistor M4 is electrically connected to the third dock signal terminal CLKD_1, and a second electrode of the fourth transistor M4 is electrically connected to the shift signal terminal CR<N>.

In the display period in the display phase of the frame, in a case where the first input circuit 3101 is turned on such that the voltage of the pull-up node Q<N> is increased, the fourth transistor M4 may be turned on under a control of a high voltage of the pull-up node Q<N> to transmit the third clock signal to the shift signal terminal CR<N>, and the third clock signal is output as the shift signal from the shift signal terminal CR<N>.

For example, as shown in FIG. 3C, a control electrode of the fifth transistor M5 is electrically connected to the pull-up node Q<N>, a first electrode of the fifth transistor M5 is electrically connected to the first clock signal terminal CLKE_1, and a second electrode of the fifth transistor M5 is electrically connected to the first output signal terminal Oput1<N>. A first terminal of the first capacitor C1 is electrically connected to the pull-up node Q<N>, and a second terminal of the first capacitor C1 is electrically connected to the first output signal terminal Oput1<N>.

In the display period in the display phase of the frame, when the first input circuit 3101 is turned on such that the voltage of the pull-up node Q<N> is increased, the first capacitor C1 is charged. In a case where the first input circuit 3101 is turned off, the first capacitor C1 may be discharged, so that the pull-up node Q<N> is maintained at a high level, and thus the fifth transistor M5 may be maintained in an on state, so as to transmit the first clock signal to the first output signal terminal Oput1<N> and output the first dock signal as the first output signal from the first output signal terminal Oput1<N>.

For example, as shown in FIG. 3, a control electrode of the sixth transistor M6 is electrically connected to the pull-up node Q<N>, a first electrode of the sixth transistor M6 is electrically connected to the fourth dock signal terminal CLKF_1, and a second electrode of the sixth transistor M6 is electrically connected to the second output signal terminal Oput2<N>. A first terminal of the second capacitor C2 is electrically connected to the pull-up node Q<N>, and a second terminal of the second capacitor C2 is electrically connected to the second output signal terminal Oput2<N>.

In the blanking period in the display phase of the frame, when the voltage of the pull-up node Q<N> is increased, the second capacitor C2 is charged. In a corresponding phase, the second capacitor C2 may be discharged, so that the pull-up node Q<N> is maintained at a high level, and thus the sixth transistor M6 may be maintained in an on state, so as to transmit the fourth dock signal to the second output signal terminal Oput2<N> and output the fourth dock signal as the second output signal from the second output signal terminal Oput2<N>.

Here, after the plurality of stages of shift registers 21 are cascaded to form the gate driving circuit 2, a shift signal terminal CR<N> in an N-th stage shift register 21 may be electrically connected to, for example, an input signal terminal Iput in an (N+1)-th stage shift register 21, so that a shift signal output from the shift signal terminal CR<N> in the N-th stage shift register 21 serves as an input signal in the (N+1)-th stage shift register 21. Of course, the cascade relationship of the plurality of stages of shift registers 21 is not limited thereto.

In addition, input signal terminal(s) Iput in a part of the shift registers 21 may be electrically connected to an initial signal terminal STU, so as to receive an initial signal transmitted by the initial signal terminal STU as the input signal. The part of shift registers 21 may be, for example, a first stage shift register 21 in the gate driving circuit 2, or may be, for example, a first stage shift register 21 and a second stage shift register 21.

Here, the number of shift registers 21 electrically connected to the initial signal terminal STU is not limited, which may be selectively set according to actual requirements.

For example, as shown in FIGS. 3B and 3C, the control circuit 3104 is electrically connected to the pull-up node Q<N>, a sixth voltage signal terminal VDD_A, a pull-down node QB_A and a second voltage signal terminal VGL1. The control circuit 3104 is configured to control a voltage of the pull-down node QB_A under a control of the voltage of the pull-up node Q<N> and a sixth voltage signal transmitted by the sixth voltage signal terminal VDD_A. For example, a level of the sixth voltage signal may be constant in the display phase of the frame. The second voltage signal terminal VGL1 may be configured to transmit a direct current low level signal (e.g., lower than or equal to a low level section of a dock signal). For example, the second voltage signal terminal VGL1 may be grounded.

For example, in the case where the voltage of the pull-up node Q<N> is increased, the control circuit 3104 may transmit a second voltage signal transmitted by the second voltage signal terminal VGL1 to the pull-down node QB_A, so as to pull down the voltage of the pull-down node QB_A to a low voltage. In a case where the voltage of the pull-up node Q<N> is a low voltage, the control circuit 3104 may transmit the sixth voltage signal transmitted by the sixth voltage signal terminal VDD_A to the pull-down node QB_A, so as to pull up the voltage of the pull-down node QB_A to be at a high level.

As shown in FIGS. 3B and 3C, the control circuit 3104 may include a seventh transistor M7, an eighth transistor M8, a ninth transistor M9 and a tenth transistor M10.

For example, as shown in FIGS. 3B and 3C, a control electrode of the seventh transistor M7 is electrically connected to the sixth voltage signal terminal VDD_A, a first electrode of the seventh transistor M7 is electrically connected to the sixth voltage signal terminal VDD_A, and a second electrode of the seventh transistor M7 is electrically connected to a control electrode of the eighth transistor M8 and a first electrode of the ninth transistor M9. A first electrode of the eighth transistor M8 is electrically connected to the sixth voltage signal terminal VDD_A, and a second electrode of the eighth transistor M8 is electrically connected to the pull-down node QB_A and a first electrode of the tenth transistor M10. A control electrode of the ninth transistor M9 is electrically connected to the pull-up node Q<N>, and a second electrode of the ninth transistor M9 is electrically connected to the second voltage signal terminal VGL1. A control electrode of the tenth transistor M10 is electrically connected to the pull-up node Q<N>, and a second electrode of the tenth transistor M10 is electrically connected to the second voltage signal terminal VGL1.

In a case where the level of the sixth voltage signal transmitted by the sixth voltage signal terminal VDD_A is a high level, the seventh transistor M7 may be turned on due to an action of the sixth voltage signal, so as to receive and transmit the sixth voltage signal to the control electrode of the eighth transistor M8 and the first electrode of the ninth transistor M9. The eighth transistor M8 may be turned on due to the action of the sixth voltage signal, so as to receive and transmit the sixth voltage signal to the pull-down node QB_A and the first electrode of the tenth transistor M10.

In the case where the voltage of the pull-up node Q<N> is at a high level, the ninth transistor M9 and the tenth transistor M10 may be turned on under the control of the voltage of the pull-up node Q<N>. The ninth transistor M9 may transmit the second voltage signal transmitted by the second voltage signal terminal VGL1 to the control electrode of the eighth transistor M8, so that the eighth transistor M8 is turned off. The tenth transistor M10 may transmit the second voltage signal to the pull-down node QB_A to pull down the voltage of the pull-down node QB_A to be at a low level.

In a case where the voltage of the pull-up node Q<N> is at a low level, the ninth transistor M9 and the tenth transistor M10 may be turned off under the control of the voltage of the pull-up node Q<N>. The eighth transistor M8 may transmit the received sixth voltage signal to the pull-down node QB_A to pull up the voltage of the pull-down node QB_A to be at a high level.

For example, as shown in FIGS. 3B and 3C, the first reset circuit 3105 is electrically connected to the pull-down node QB_A, the pull-up node Q<N>, the second voltage signal terminal VGL1 and the anti-leakage node OFF<N>. The first reset circuit 3105 is configured to reset the pull-up node Q<N> under a control of the voltage of the pull-down node QB_A.

For example, in a case where the voltage of the pull-down node QB_A is at a high level, the first reset circuit 3105 may be turned on due to an action of the voltage of the pull-down node QB_A to transmit the second voltage signal transmitted by the second voltage signal terminal VGL1 to the pull-up node Q<N>, so as to pull down and reset the pull-up node Q<N>.

As shown in FIGS. 3B and 3C, the first reset circuit 3105 may include an eleventh transistor M11 and a twelfth transistor M12.

For example, as shown in FIGS. 3B and 3C, a control electrode of the eleventh transistor M11 is electrically connected to the pull-down node QB_A, a first electrode of the eleventh transistor M11 is electrically connected to the pull-up node Q<N>, and a second electrode of the eleventh transistor M11 is electrically connected to a first electrode of the twelfth transistor M12 and the anti-leakage node OFF<N>. A control electrode of the twelfth transistor M12 is electrically connected to the pull-down node QB_A, and a second electrode of the twelfth transistor M12 is electrically connected to the second voltage signal terminal VGL1.

In the case where the voltage of the pull-down node QB_A is at a high level, the eleventh transistor M11 and the twelfth transistor M12 may be turned on synchronously due to the action of the voltage of the pull-down node QB_A, so that the twelfth transistor M12 may transmit the second voltage signal transmitted by the second voltage signal terminal VGL1 to the anti-leakage node OFF<N>, and the eleventh transistor M11 may transmit the second voltage signal from the anti-leakage node OFF<N> to the pull-up node Q<N>, so as to reset the pull-up node Q<N>.

Here, in a case where a potential of the pull-up node Q<N> is a high potential, and the first reset circuit 3105 is in a non-operating state, the third transistor M3 may be turned on under the control of the voltage of the pull-up node Q<N> to transmit the first voltage signal to the anti-leakage node OFF<N>, so that the voltage of the anti-leakage node OFF<N> is increased. Thus, a voltage difference between the control electrode and the second electrode of the eleventh transistor M11 is less than zero, thereby ensuring that the eleventh transistor M11 is completely or relatively completely turned off. In this way, the electric leakage of the pull-up node Q<N> through the first reset circuit 3105 may be avoided, so that the pull-up node Q<N> is able to be maintained at a high and stable voltage.

For example, as shown in FIGS. 3B and 3C, the second reset circuit 3106 is electrically connected to a display reset signal terminal STD, the pull-up node Q<N>, the second voltage signal terminal VGL1 and the anti-leakage node OFF<N>. The second reset circuit 3106 is configured to reset the pull-up node Q<N> under a control of a display reset signal transmitted by the display reset signal terminal STD.

For example, in a case where a level of the display reset signal is a high level, the second reset circuit 3106 may be turned on due to an action of the display reset signal to transmit the second voltage signal transmitted by the second voltage signal terminal VGL1 to the pull-up node Q<N>, so as to pull down and reset the pull-up node Q<N>.

As shown in FIGS. 3B and 3C, the second reset circuit 3106 may include a thirteenth transistor M13 and a fourteenth transistor M14.

For example, as shown in FIGS. 3B and 3C, a control electrode of the thirteenth transistor M13 is electrically connected to the display reset signal terminal STD, a first electrode of the thirteenth transistor M13 is electrically connected to the pull-up node Q<N>, and a second electrode of the thirteenth transistor M13 is electrically connected to a first electrode of the fourteenth transistor M14 and the anti-leakage node OFF<N>. A control electrode of the fourteenth transistor M14 is electrically connected to the display reset signal terminal STD, and a second electrode of the fourteenth transistor M14 is electrically connected to the second voltage signal terminal VGL1.

In a case where a voltage of the display reset signal is at a high level, the thirteenth transistor M13 and the fourteenth transistor M14 may be turned on synchronously due to the action of the display reset signal, so that the fourteenth transistor M14 may transmit the second voltage signal transmitted by the second voltage signal terminal VGL1 to the anti-leakage node OFF<N>, and the thirteenth transistor M13 may transmit the second voltage signal from the anti-leakage node OFF<N> to the pull-up node Q<N> to reset the pull-up node Q<N>.

Here, in a case where the potential of the pull-up node Q<N> is a high potential, and the second reset circuit 3106 is in a non-operating state, the third transistor M3 may be turned on under the control of the voltage of the pull-up node Q<N> to transmit the first voltage signal to the anti-leakage node OFF<N>, so that the voltage of the anti-leakage node OFF<N> is increased. Thus, a voltage difference between the control electrode and the second electrode of the thirteenth transistor M13 is less than zero, thereby ensuring that the thirteenth transistor M13 is completely or relatively completely turned off. In this way, the electric leakage of the pull-up node Q<N> through the second reset circuit 3106 may be avoided, so that the pull-up node Q<N> is able to be maintained at a high and stable voltage.

Here, after the plurality of stages of shift registers 21 are cascaded to form the gate driving circuit 2, a display reset signal terminal STD in the N-th stage shift register 21 may be electrically connected to, for example, a shift signal terminal CR<N> in an (N+4)-th stage shift register 21, so that a shift signal output from the shift signal terminal CR<N> in the (N+4)-th stage shift register 21 serves as a display reset signal of the N-th stage shift register 21. Of course, the cascade relationship of the plurality of stages of shift registers 21 is not limited thereto.

For example, as shown in FIGS. 3B and 3C, the third reset circuit 3107 is electrically connected to a global reset signal terminal TRST, the pull-up node Q<N>, the second voltage signal terminal VGL1 and the anti-leakage node OFF<N>. The third reset circuit 3107 is configured to reset the pull-up node Q<N> under a control of a global reset signal transmitted by the global reset signal terminal TRST.

For example, in a case where a level of the global reset signal is a high level, the third reset circuit 3107 may be turned on due to an action of the global reset signal to transmit the second voltage signal transmitted by the second voltage signal terminal VGL1 to the pull-up node Q<N>, so as to pull down and reset the pull-up node Q<N>.

As shown in FIGS. 3B and 3C, the third reset circuit 3107 may include a fifteenth transistor M15 and a sixteenth transistor M16.

For example, as shown in FIGS. 3B and 3C, a control electrode of the fifteenth transistor M15 is electrically connected to the global reset signal terminal TRST, the first electrode of the fifteenth transistor M15 is electrically connected to the pull-up node Q<N>, and a second electrode of the fifteenth transistor M15 is electrically connected to a first electrode of the sixteenth transistor M16 and the anti-leakage node OFF<N>. A control electrode of the sixteenth transistor M16 is electrically connected to the global reset signal terminal TRST, and a second electrode of the sixteenth transistor M16 is electrically connected to the second voltage signal terminal VGL1.

In a case where a voltage of the global reset signal is at a high level, the fifteenth transistor M15 and the sixteenth transistor M16 may be turned on synchronously due to the action of the global reset signal, so that the sixteenth transistor M16 may transmit the second voltage signal transmitted by the second voltage signal terminal VGL1 to the anti-leakage node OFF<N>, and the fifteenth transistor M15 may transmit the second voltage signal from the anti-leakage node OFF<N> to the pull-up node Q<N> to reset the pull-up node Q<N>.

Here, in a case where the potential of the pull-up node Q<N> is a high electric potential, and the third reset circuit 3107 is in a non-operating state, the third transistor M3 may be turned on under the control of the voltage of the pull-up node Q<N> to transmit the first voltage signal to the anti-leakage node OFF<N>, so that the voltage of the anti-leakage node OFF<N> is increased. Thus, a voltage difference between the control electrode and the second electrode of the fifteenth transistor M15 is less than zero, thereby ensuring that the fifteenth transistor M15 is completely or relatively completely turned off. In this way, the electric leakage of the pull-up node Q<N> through the third reset circuit 3107 may be avoided, so that the pull-up node Q<N> is able to be maintained at a high and stable voltage.

For example, as shown in FIG. 3C, the fourth reset circuit 3108 is electrically connected to the pull-down node QB_A, the shift signal terminal CR<N>, the first output signal terminal Oput1<N>, the second output signal terminal Oput2<N>, the second voltage signal terminal VGL1 and a third voltage signal terminal VGL2. The fourth reset circuit 3108 is configured to reset the shift signal terminal CR<N>, the first output signal terminal Oput1<N> and the second output signal terminal Oput2<N> under the control of the voltage of the pull-down node QB_A. The third voltage signal terminal VGL2 is configured to transmit a direct current low level signal (e.g., less than or equal to a low level section of a dock signal). For example, the third voltage signal terminal VGL2 may be grounded. The low level signals transmitted by the second voltage signal terminal VGL1 and the third voltage signal terminal VGL2 may be same or different.

For example, in the case where the voltage of the pull-down node QB_A is at a high level, the fourth reset circuit 3108 may be turned on due to the action of the voltage of the pull-down node QB_A, so as to transmit the second voltage signal transmitted by the second voltage signal terminal VGL1 to the shift signal terminal CR<N> to pull down and reset the shift signal terminal CR<N>, to transmit a third voltage signal transmitted by the third voltage signal terminal VGL2 to the first output signal terminal Oput1<N> to pull down and reset the first output signal terminal Oput1<N>, and to transmit the third voltage signal transmitted by the third voltage signal terminal VGL2 to the second output signal terminal Oput2<N> to pull down and reset the second output signal terminal Oput2<N>.

As shown in FIG. 3C, the fourth reset circuit 3108 may include a seventeenth transistor M17, an eighteenth transistor M18 and a nineteenth transistor M19.

For example, as shown in FIG. 3C, a control electrode of the seventeenth transistor M17 is electrically connected to the pull-down node QB_A, a first electrode of the seventeenth transistor M17 is electrically connected to the shift signal terminal CR<N>, and a second electrode of the seventeenth transistor M17 is electrically connected to the second voltage signal terminal VGL1.

In the case where the voltage of the pull-down node QB_A is at a high level, the seventeenth transistor M17 may be turned on due to the action of the voltage of the pull-down node QB_A to transmit the second voltage signal transmitted by the second voltage signal terminal VGL1 to the shift signal terminal CR<N>, so as to pull down and reset the shift signal terminal CR<N>.

For example, as shown in FIG. 3C, a control electrode of the eighteenth transistor M18 is electrically connected to the pull-down node QB_A, a first electrode of the eighteenth transistor M18 is electrically connected to the first output signal terminal Oput1<N>, and a second electrode of the eighteenth transistor M18 is electrically connected to the third voltage signal terminal VGL2.

In the case where the voltage of the pull-down node QB_A is at a high level, the eighteenth transistor M18 may be turned on due to the action of the voltage of the pull-down node QB_A to transmit the third voltage signal transmitted by the third voltage signal terminal VGL2 to the first output signal terminal Oput1<N>, so as to pull down and reset the first output signal terminal Oput1<N>.

For example, as shown in FIG. 3C, a control electrode of the nineteenth transistor M19 is electrically connected to the pull-down node QB_A, a first electrode of the nineteenth transistor M19 is electrically connected to the second output signal terminal Oput2<N>, and a second electrode of the nineteenth transistor M19 is electrically connected to the third voltage signal terminal VGL2.

In the case where the voltage of the pull-down node QB_A is at a high level, the nineteenth transistor M19 may be turned on due to the action of the voltage of the pull-down node QB_A to transmit the third voltage signal transmitted by the third voltage signal terminal VGL2 to the second output signal terminal Oput2<N>, so as to pull down and reset the second output signal terminal Oput2<N>.

For example, as shown in FIGS. 3B and 3C, the fifth reset circuit 3109 is electrically connected to the input signal terminal Iput, the pull-down node QB_A and the second voltage signal terminal VGL1. The fifth reset circuit 3109 is configured to reset the pull-down node QB_A under a control of the input signal transmitted by the input signal terminal Iput.

For example, in the case where the level of the input signal is a high level, the fifth reset circuit 3109 may be turned on due to the action of the input signal to transmit the second voltage signal transmitted by the second voltage signal terminal VGL1 to the pull-down node QB_A, so as to pull down and reset the pull-down node QB_A.

As shown in FIGS. 3B and 3C, the fifth reset circuit 3109 may include a twentieth transistor M20.

For example, as shown in FIGS. 3B and 3C, a control electrode of the twentieth transistor M20 is electrically connected to the input signal terminal Iput, a first electrode of the twentieth transistor M20 is electrically connected to the pull-down node QB_A, and a second electrode of the twentieth transistor M20 is electrically connected to the second voltage signal terminal VGL1.

In the case where the level of the input signal is a high level, the twentieth transistor M20 may be turned on due to the action of the input signal to transmit the second voltage signal transmitted by the second voltage signal terminal VGL1 to the pull-down node QB_A, so as to pull down and reset the pull-down node QB_A.

It will be noted that as shown in FIG. 3C, the gate driving circuit 2 may further include a plurality of blanking input circuits 32. The blanking input circuit 32 may be electrically connected to at least two stages of shift registers 21 that are adjacent to each other. That is, the at least two stages of shift registers 21 share the blanking input circuit 32. The blanking input circuit 32 is configured to, in the blanking period in the display phase of the frame, control a corresponding shift register 21 to input a blanking control signal (i.e., the second gate signal) to pixel circuits 12 in a corresponding row, so that the pixel circuits 12 acquire the sensing signal.

Here, as shown in FIG. 3C, the blanking input circuit 32 may include, for example, a selection control circuit 3201, a second input circuit 3202 and at least two transmission circuits 3203.

For example, as shown in FIG. 3C, the selection control circuit 3201 is electrically connected to a selection control signal terminal OE, the shift signal terminal CR<N>, the second voltage signal terminal VGL1 and a first blanking node H. The selection control circuit 3201 is configured to transmit the shift signal received at the shift signal terminal CR<N> to the first blanking node H under a control of a selection control signal transmitted by the selection control signal terminal OE.

For example, in a case where a level of the selection control signal is a high level, the selection control circuit 3201 may be turned on under the control of the selection control signal to transmit the received shift signal to the first blanking node H to charge the first blanking node H, so that a voltage of the first blanking node H is increased.

In the blanking period in the display phase of the frame, in a case where the sensing signal is required to be acquired, a waveform and a timing of the selection control signal may be same as a waveform and a timing of the input signal, respectively, so that the selection control circuit 3201 is turned on.

As shown in FIG. 3C, the selection control circuit 3201 may include a twenty-first transistor M21, a twenty-second transistor M22 and a third capacitor C3.

For example, as shown in FIG. 3C, a control electrode of the twenty-first transistor M21 is electrically connected to the selection control signal terminal OE, a first electrode of the twenty-first transistor M21 is electrically connected to the shift signal terminal CR<N>, and a second electrode of the twenty-first transistor M21 is electrically connected to a first electrode of the twenty-second transistor M22. A control electrode of the twenty-second transistor M22 is electrically connected to the selection control signal terminal OE, and a second electrode of the twenty-second transistor M22 is electrically connected to the first blanking node H.

In the case where the level of the selection control signal transmitted by the selection control signal terminal OE is a high level, the twenty-first transistor M21 and the twenty-second transistor M22 may be turned on synchronously due to an action of the selection control signal, so that the twenty-first transistor M21 may transmit the shift signal transmitted by the shift signal terminal CR<N> to the first electrode of the twenty-second transistor M22, and the twenty-second transistor M22 may receive and transmit the shift signal to the first blanking node H to charge the first blanking node H.

For example, as shown in FIG. 3C, a first terminal of the third capacitor C3 is electrically connected to the first blanking node H, and a second terminal of the third capacitor C3 is electrically connected to the second voltage signal terminal VGL1.

In a process of charging the first blanking node H, the selection control circuit 3201 also charges the third capacitor C3. In this way, in a case where the selection control circuit 3201 is turned off, the third capacitor C3 is discharged, so that the voltage of the first blanking node H is maintained at a high level.

In addition, as shown in FIG. 3C, the selection control circuit 3201 may further include, for example, a twenty-third transistor M23. A control electrode of the twenty-third transistor M23 is electrically connected to the first blanking node H, a first electrode of the twenty-third transistor M23 is electrically connected to the first voltage signal terminal VDD, and a second electrode of the twenty-third transistor M23 is electrically connected to the first electrode of the twenty-second transistor M22.

In a case where the voltage of the first blanking node H is at a high level, and the twenty-first transistor M21 and the twenty-second transistor M22 are in a non-operating state, the twenty-third transistor M23 may be turned on under a control of the voltage of the first blanking node H to transmit the first voltage signal transmitted by the first voltage signal terminal VDD to the first electrode of the twenty-second transistor M22, so that a voltage of the first electrode of the twenty-second transistor M22 is increased. Thus, a voltage difference between the control electrode and the first electrode of the twenty-second transistor M22 is less than zero, thereby ensuring that the twenty-second transistor M22 is completely or relatively completely turned off. In this way, an electric leakage of the first blanking node H through the twenty-second transistor M22 may be avoided, so that the first blanking node H is able to be maintained at a high and stable voltage.

For example, as shown in FIG. 3C, the second input circuit 3202 is electrically connected to the first blanking node H, a second blanking node N, and a second clock signal terminal CLKA or the first voltage signal terminal VDD. The second input circuit 3202 is configured to transmit a second clock signal received at the second dock signal terminal CLKA or the first voltage signal received at the first voltage signal terminal VDD to the second blanking node N under the control of the voltage of the first blanking node H.

For example, in a case where the selection control circuit 3201 is turned on such that the voltage of the first blanking node H is increased, the second input circuit 3202 may be turned on under the control of the voltage of the first blanking node H, so as to receive the second dock signal transmitted by the second dock signal terminal CLKA and transmit the second dock signal to the second blanking node N.

As shown in FIG. 3C, the second input circuit 3202 may include a twenty-fourth transistor M24.

For example, as shown in FIG. 3C, a control electrode of the twenty-fourth transistor M24 is electrically connected to the first blanking node H, a first electrode of the twenty-fourth transistor M24 is electrically connected to the second dock signal terminal CLKA or the first voltage signal terminal VDD, and a second electrode of the twenty-fourth transistor M24 is electrically connected to the second blanking node N.

In a case where the voltage of the first blanking node H is at a high level, the twenty-fourth transistor M24 may be turned on under the control of the voltage of the first blanking node H, so as to transmit the second clock signal received at the second dock signal terminal CLKA or the first voltage signal received at the first voltage signal terminal VDD to the second blanking node N.

For example, as shown in FIG. 3C, the at least two transmission circuits 3203 may be electrically connected to at least two shift registers 21 in one-to-one correspondence. One of the transmission circuits 3203 is electrically connected to the second blanking node N, the second dock signal terminal CLKA, and the pull-up node Q<N> in a stage of shift register 21. The transmission circuit 3202 is configured to transmit the second dock signal or the first voltage signal received at the second blanking node N to the pull-up node Q<N> under a control of the second dock signal transmitted by the second dock signal terminal CLKA.

For example, in a case where a level of the second dock signal transmitted by the second dock signal terminal CLKA is a high level, the transmission circuit 3202 may be turned on under the control of the second clock signal, so as to receive the second clock signal or the first voltage signal from the second blanking node N and transmit the received second dock signal or the first voltage signal to the pull-up node Q<N>, so that the voltage of the pull-up node Q<N> is increased. Thus, the output circuit 3103 is turned on, so that the second output signal terminal Oput2<N> in the output circuit 3103 outputs the second output signal.

As shown in FIG. 3C, the transmission circuit 3203 may include a twenty-fifth transistor M25 and a twenty-sixth transistor M26.

For example, as shown in FIG. 3C, a control electrode of the twenty-fifth transistor M25 is electrically connected to the second clock signal terminal CLKA, a first electrode of the twenty-fifth transistor M25 is electrically connected to the second blanking node N, and a second electrode of the twenty-fifth transistor M25 is electrically connected to a first electrode of the twenty-sixth transistor M26. A control electrode of the twenty-sixth transistor M26 is electrically connected to the second clock signal terminal CLKA, and a second electrode of the twenty-sixth transistor M26 is electrically connected to the pull-up node Q<N>.

In the case where the level of the second clock signal transmitted by the second clock signal terminal CLKA is a high level, the twenty-fifth transistor M25 and the twenty-sixth transistor M26 may be turned on synchronously due to an action of the second dock signal, so that the twenty-fifth transistor M25 may transmit the second dock signal or the first voltage signal from the second blanking node N to the first electrode of the twenty-sixth transistor M26, and the twenty-sixth transistor M26 may receive and transmit the second dock signal or the first voltage signal to the pull-up node Q<N> to charge the pull-up node Q<N>. The sixth transistor M6 in the output circuit 3103 may be turned on under the control of the voltage of the pull-up node Q<N>, so as to receive the fourth clock signal and output the fourth clock signal as the second output signal from the second output signal terminal Oput2<N>.

In a case where the transmission circuit 3203 is further electrically connected to the anti-leakage node OFF<N>, as shown in FIG. 3C, the first electrode of the twenty-sixth transistor M26 may be electrically connected to the anti-leakage node OFF<N> and the second electrode of the twenty-fifth transistor M25.

Here, in a case where the potential of the pull-up node Q<N> is a high electric potential, and the transmission circuit 3203 is in a non-operating state, the third transistor M3 may be turned on under the control of the voltage of the pull-up node Q<N> to transmit the first voltage signal to the anti-leakage node OFF<N>, so that the voltage of the anti-leakage node OFF<N> is increased. Thus, a voltage difference between the control electrode and the first electrode of the twenty-sixth transistor M26 is less than zero, thereby ensuring that the twenty-sixth transistor M26 is completely or relatively completely turned off. In this way, the electric leakage of the pull-up node Q<N> through the transmission circuit 3203 may be avoided, so that the pull-up node Q<N> is able to be maintained at a high and stable voltage.

For example, as shown in FIG. 3C, in a case where the gate driving circuit 2 further includes the blanking input circuits 32, the shift register 21 may further include a sixth reset circuit 3110. The sixth reset circuit 3110 is electrically connected to the second clock signal terminal CLKA, the first blanking node H, the pull-down node QB_A and the second voltage signal terminal VGL1. The sixth reset circuit 3110 is configured to reset the pull-down node QB_A under a common control of the second clock signal transmitted by the second clock signal terminal CLKA and the voltage of the first blanking node H in the blanking period in the display phase of the frame.

For example, in the blanking period in the display phase of the frame, in a case where the level of the second clock signal is a high level, and the voltage of the first blanking node H is at a high level, the sixth reset circuit 3110 may be turned on under the common control of the second clock signal and the voltage of the first blanking node H to transmit the second voltage signal transmitted by the second voltage signal terminal VGL1 to the pull-down node QB_A, so as to pull down and reset the pull-down node QB_A.

As shown in FIG. 3C, the sixth reset circuit 3110 may include a thirty-second transistor M32 and a thirty-third transistor M33.

For example, as shown in FIG. 3C, a control electrode of the thirty-second transistor M32 is electrically connected to the second clock signal terminal CLKA, a first electrode of the thirty-second transistor M32 is electrically connected to the pull-down node QB_A, and a second electrode of the thirty-second transistor M32 is electrically connected to a first electrode of the thirty-third transistor M33. A control electrode of the thirty-third transistor M33 is electrically connected to the first blanking node H, and a second electrode of the thirty-third transistor M33 is electrically connected to the second voltage signal terminal VGL1.

In the case where the level of the second clock signal is a high level, and the voltage of the first blanking node H is at a high level, the thirty-third transistor M33 may be turned on under the control of the voltage of the first blanking node H to transmit the second voltage signal to the first electrode of the thirty-third transistor M33, and the thirty-second transistor M32 may be turned on under the control of the second dock signal to transmit the second voltage signal from the first electrode of the thirty-third transistor M33 to the pull-down node QB_A, so as to pull-down and reset the pull-down node QB_A.

As shown in FIG. 3C, a structure of the gate driving circuit 2 will be schematically described in an example where two stages of shift registers 21 that are adjacent to each other share the blanking input circuit 32. Further, N represents a positive odd number.

Here, as shown in FIG. 3C, in the two stages of shift registers 21 that are adjacent to each other, an output circuit 3103 in a next stage of shift register 21 may be provided without the fourth transistor M4, and is not electrically connected to the third clock signal terminal CLKD_1.

Based on this, the shift signal terminal CR<N> in the N-th stage shift register 21 may be electrically connected to input signal terminals Iput in an (N+2)-th stage shift register 21 and an (N+3)-th stage shift register 21, so that the shift signal output from the shift signal terminal CR<N> in the N-th stage shift register 21 serves as both an input signal of the (N+2)-th stage shift register 21 and an input signal of the (N+3)-th stage shift register 21. Display reset signal terminals STD in the N-th stage shift register 21 and the (N+1)-th stage shift register 21 may be electrically connected to, for example, the shift signal terminal CR<N> in the (N+4)-th stage shift register 21, so that the shift signal output from the shift signal terminal CR<N> in the (N+4)-th stage shift register 21 serves as both the display reset signal of the N-th stage shift register 21 and a display reset signal of the (N+1)-th stage shift register 21. Of course, the cascade relationship of the plurality of stages of shift registers 21 is not limited thereto.

For example, a shift signal terminal CR<N> in the first stage shift register 21 may be electrically connected to input signal terminals Iput in a third stage shift register 21 and a fourth stage shift register 21. A shift signal terminal CR<N> in a fifth stage shift register 21 may be electrically connected to display reset signal terminals STD in the first stage shift register 21 and the second stage shift register 21.

This is beneficial to simplifying the structure of the gate driving circuit 2 and reducing a space occupation of the gate driving circuit 2 in the display panel 100.

For example, as shown in FIG. 3C, in the two stages of shift registers 21 that are adjacent to each other, a previous stage (i.e., the N-th stage) of shift register 21 may be referred to as a first scan unit 21a, and a next stage (i.e., the (N+1)-th stage) of shift register 21 may be referred to as a second scan unit 21b. In this case, a pull-up node Q<N> in the first scan unit 21a may be referred to as a first pull-up node Q<N>, and a pull-up node Q<N> in the second scan unit 21b may be referred to as a second pull-up node Q<N+1>. A pull-down node QB_A in the first scan unit 21a may be referred to as a first pull-down node QB_A, and a pull-down node QB_A in the second scan unit 21b may be referred to as a second pull-down node QB_B. An anti-leakage node OFF<N> in the first scan unit 21a may be referred to as a first anti-leakage node OFF<N>, and an anti-leakage node OFF<N> in the second scan unit 21b may be referred to as a second anti-leakage node OFF<N+1>. A first clock signal terminal CLKE_1 in the second scan unit 21b may be referred to as a fifth dock signal terminal CLKE_2, and a fourth clock signal terminal CLKF_1 in the second scan unit 21b may be referred to as a sixth clock signal terminal CLKF_2. A first output signal terminal Oput1<N> in the first scan unit 21a may be referred to as a first sub-output signal terminal Oput1<N>, a second output signal terminal Oput2<N> in the first scan unit 21a may be referred to as a second sub-output signal terminal Oput2<N>, a first output signal terminal Oput1<N> in the second scan unit 21b may be referred to as a third sub-output signal terminal Oput1<N+1>, and a second output signal terminal Oput2<N> in the second scan unit 21b may be referred to as a fourth sub-output signal terminal Oput2<N+1>.

For example, as shown in FIG. 3C, a control circuit 3104 in the second scan unit 21b may be electrically connected to a seventh voltage signal terminal VDD_B, so as to replace the sixth voltage signal terminal VDD_A with the seventh voltage signal terminal VDD_B. In the display phase of the frame, the sixth voltage signal transmitted by the sixth voltage signal terminal VDD_A and a seventh voltage signal transmitted by the seventh voltage signal terminal VDD_B are mutually inverted signals.

For example, as shown in FIG. 3C, a first reset circuit 3105 in the first scan unit 21a may be further electrically connected to the second pull-down node QB_B. The first reset circuit 3105 is further configured to reset the first pull-up node Q<N> under a control of a voltage of the second pull-down node QB_B.

For example, in a case where the voltage of the second pull-down node QB_B is at a high level, the first reset circuit 3105 may be turned on due to an action of the voltage of the second pull-down node QB_B to transmit the second voltage signal transmitted by the second voltage signal terminal VGL1 to the first pull-up node Q<N>, so as to pull-down and reset the first pull-up node Q<N>.

As shown in FIG. 3C, the first reset circuit 3105 in the first scan unit 21a may further include a twenty-seventh transistor M27 and a twenty-eighth transistor M28.

For example, as shown in FIG. 3C, in the first scan unit 21a, a control electrode of the twenty-seventh transistor M27 is electrically connected to the second pull-down node QB_B, a first electrode of the twenty-seventh transistor M27 is electrically connected to the first pull-up node Q<N>, and a second electrode of the twenty-seventh transistor M27 is electrically connected to a first electrode of the twenty-eighth transistor M28 and the first anti-leakage node OFF<N>. A control electrode of the twenty-eighth transistor M28 is electrically connected to the second pull-down node QB_B, and a second electrode of the twenty-eighth transistor M28 is electrically connected to the second voltage signal terminal VGL1.

In the case where the voltage of the second pull-down node QB_B is at a high level, the twenty-seventh transistor M27 and the twenty-eighth transistor M28 may be turned on synchronously due to the action of the voltage of the second pull-down node QB_B, so that the twenty-eighth transistor M28 may transmit the second voltage signal transmitted by the second voltage signal terminal VGL1 to the first anti-leakage node OFF<N>, and the twenty-seventh transistor M27 may transmit the second voltage signal from the first anti-leakage node OFF<N> to the first pull-up node Q<N> to reset the first pull-up node Q<N>.

For example, as shown in FIG. 3C, a first reset circuit 3105 in the second scan unit 21b may be further electrically connected to the first pull-down node QB_A. The first reset circuit 3105 is further configured to reset the second pull-up node Q<N+1> under a control of a voltage of the first pull-down node QB_A.

For example, in a case where the voltage of the first pull-down node QB_A is at a high level, the first reset circuit 3105 may be turned on due to an action of the voltage of the first pull-down node QB_A to transmit the second voltage signal transmitted by the second voltage signal terminal VGL1 to the second pull-up node Q<N+1>, so as to pull-down and reset the second pull-up node Q<N+1>.

As shown in FIG. 3C, the first reset circuit 3105 in the second scan unit 21b may further include a twenty-seventh transistor M27 and a twenty-eighth transistor M28.

For example, as shown in FIG. 3C, in the second scan unit 21b, a control electrode of the twenty-seventh transistor M27 is electrically connected to the first pull-down node QB_A, a first electrode of the twenty-seventh transistor M27 is electrically connected to the second pull-up node Q<N+1>, and a second electrode of the twenty-seventh transistor M27 is electrically connected to a first electrode of the twenty-eighth transistor M28 and the second anti-leakage node OFF<N+1>. A control electrode of the twenty-eighth transistor M28 is electrically connected to the first pull-down node QB_A, and a second electrode of the twenty-eighth transistor M28 is electrically connected to the second voltage signal terminal VGL1.

In the case where the voltage of the first pull-down node QB_A is at a high level, the twenty-seventh transistor M27 and the twenty-eighth transistor M28 may be turned on synchronously due to the action of the voltage of the first pull-down node QB_A, so that the twenty-eighth transistor M28 may transmit the second voltage signal transmitted by the second voltage signal terminal VGL1 to the second anti-leakage node OFF<N+1>, and the twenty-seventh transistor M27 may transmit the second voltage signal from the second anti-leakage node OFF<N+1> to the second pull-up node Q<N+1> to reset the second pull-up node Q<N+1>.

For example, as shown in FIG. 3C, a fourth reset circuit 3108 in the first scan unit 21a may be further electrically connected to the second pull-down node QB_B. The fourth reset circuit 3108 is further configured to reset the shift signal terminal CR<N>, the first sub-output signal terminal Oput1<N> and the second-sub-output signal terminal Oput2<N> under a control of the voltage of the second pull-down node QB_B.

For example, in the case where the voltage of the second pull-down node QB_B is at a high level, the fourth reset circuit 3108 may be turned on due to the action of the voltage of the second pull-down node QB_B, so as to transmit the second voltage signal transmitted by the second voltage signal terminal VGL1 to the shift signal terminal CR<N> to pull down and reset the shift signal terminal CR<N>, and to transmit the third voltage signal transmitted by the third voltage signal terminal VGL2 to the first sub-output signal terminal Oput1<N> and the second sub-output signal terminal Oput2<N> to pull-down and reset the first sub-output signal terminal Oput1<N> and the second sub-output signal terminal Oput2<N>.

As shown in FIG. 3C, the fourth reset circuit 3108 in the first scan unit 21a may further include a twenty-ninth transistor M29, a thirtieth transistor M30 and a thirty-first transistor M31.

For example, as shown in FIG. 3C, a control electrode of the twenty-ninth transistor M29 is electrically connected to the second pull-down node QB_B, a first electrode of the twenty-ninth transistor M29 is electrically connected to the shift signal terminal CR<N>, and a second electrode of the twenty-ninth transistor M29 is electrically connected to the second voltage signal terminal VGL1.

In the case where the voltage of the second pull-down node QB_B is at a high level, the twenty-ninth transistor M29 may be turned on due to the action of the voltage of the second pull-down node QB_B to transmit the second voltage signal transmitted by the second voltage signal terminal VGL1 to the shift signal terminal CR<N>, so as to pull down and reset the shift signal terminal CR<N>.

For example, as shown in FIG. 3C, a control electrode of the thirtieth transistor M30 is electrically connected to the second pull-down node QB_B, a first electrode of the thirtieth transistor M30 is electrically connected to the first sub-output signal terminal Oput1<N>, and a second electrode of the thirtieth transistor M30 is electrically connected to the third voltage signal terminal VGL2.

In the case where the voltage of the second pull-down node QB_B is at a high level, the thirtieth transistor M30 may be turned on due to the action of the voltage of the second pull-down node QB_B to transmit the third voltage signal transmitted by the third voltage signal terminal VGL2 to the first sub-output signal terminal Oput1<N>, so as to pull down and reset the first sub-output signal terminal Oput1<N>.

For example, as shown in FIG. 3C, a control electrode of the thirty-first transistor M31 is electrically connected to the second pull-down node QB_B, a first electrode of the thirty-first transistor M31 is electrically connected to the second sub-output signal terminal Oput2<N>, and a second electrode of the thirty-first transistor M31 is electrically connected to the third voltage signal terminal VGL2.

In the case where the voltage of the second pull-down node QB_B is at a high level, the thirty-first transistor M31 may be turned on due to the action of the voltage of the second pull-down node QB_B to transmit the third voltage signal transmitted by the third voltage signal terminal VGL2 to the second sub-output signal terminal Oput2<N>, so as to pull down and reset the second sub-output signal terminal Oput2<N>.

For example, as shown in FIG. 3C, a fourth reset circuit 3108 in the second scan unit 21b may be further electrically connected to the first pull-down node QB_A. The fourth reset circuit 3108 is further configured to reset the third sub-output signal terminal Oput1<N+1> and the fourth sub-output signal terminal Oput2<N+1> under a control of the voltage of the first pull-down node QB_A.

For example, in the case where the voltage of the first pull-down node QB_A is at a high level, the fourth reset circuit 3108 may be turned on due to the action of the voltage of the first pull-down node QB_A, so as to transmit the third voltage signal transmitted by the third voltage signal terminal VGL2 to the third sub-output signal terminal Oput1<N+1> to pull down and reset the third sub-output signal terminal Oput1<N+1>, and to transmit the third voltage signal transmitted by the third voltage signal terminal VGL2 to the fourth sub-output signal terminal Oput2<N+1> to pull down and reset the fourth sub-output signal terminal Oput2<N+1>.

As shown in FIG. 3C, the fourth reset circuit 3108 in the second scan unit 21b may further include a thirtieth transistor M30 and a thirty-first transistor M31.

For example, as shown in FIG. 3C, a control electrode of the thirtieth transistor M30 is electrically connected to the first pull-down node QB_A, a first electrode of the thirtieth transistor M30 is electrically connected to the third sub-output signal terminal Oput1<N+1>, and a second electrode of the thirtieth transistor M30 is electrically connected to the third voltage signal terminal VGL2.

In the case where the voltage of the first pull-down node QB_A is at a high level, the thirtieth transistor M30 may be turned on due to the action of the voltage of the first pull-down node QB_A to transmit the third voltage signal transmitted by the third voltage signal terminal VGL2 to the third sub-output signal terminal Oput1<N+1>, so as to pull down and reset the third sub-output signal terminal Oput1<N+1>.

For example, as shown in FIG. 3C, a control electrode of the thirty-first transistor M31 is electrically connected to the first pull-down node QB_A, a first electrode of the thirty-first transistor M31 is electrically connected to the fourth sub-output signal terminal Oput2<N+1>, and a second electrode of the thirty-first transistor M31 is electrically connected to the third voltage signal terminal VGL2.

In the case where the voltage of the first pull-down node QB_A is at a high level, the thirty-first transistor M31 may be turned on due to the action of the voltage of the first pull-down node QB_A to transmit the third voltage signal transmitted by the third voltage signal terminal VGL2 to the fourth sub-output signal terminal Oput2<N+1>, so as to pull-down and reset the fourth sub-output signal terminal Oput2<N+1>.

Figure 3D:
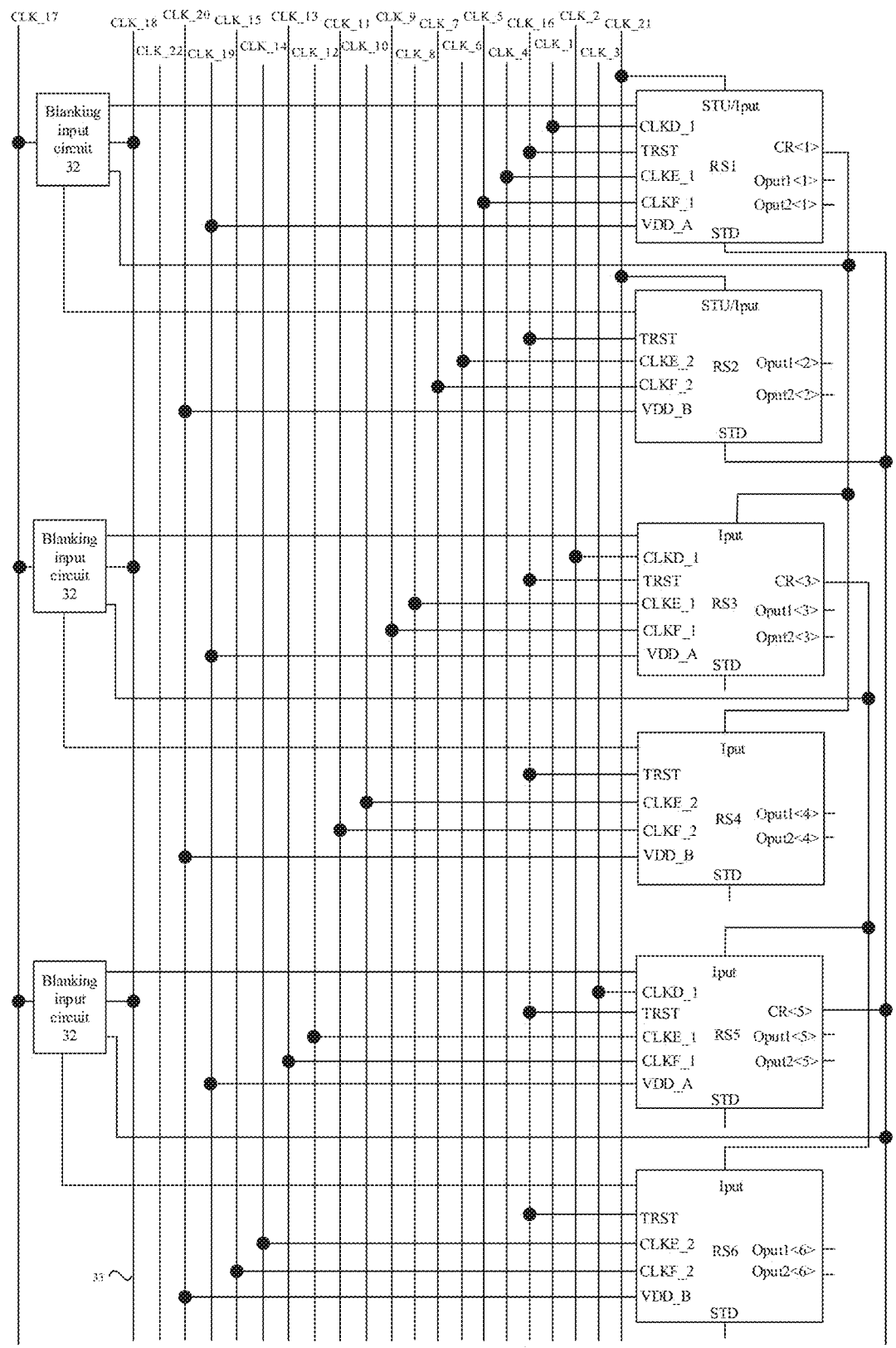
FIG. 3D is a structural diagram of a gate driving circuit, in accordance with some embodiments.
Figure 3E:
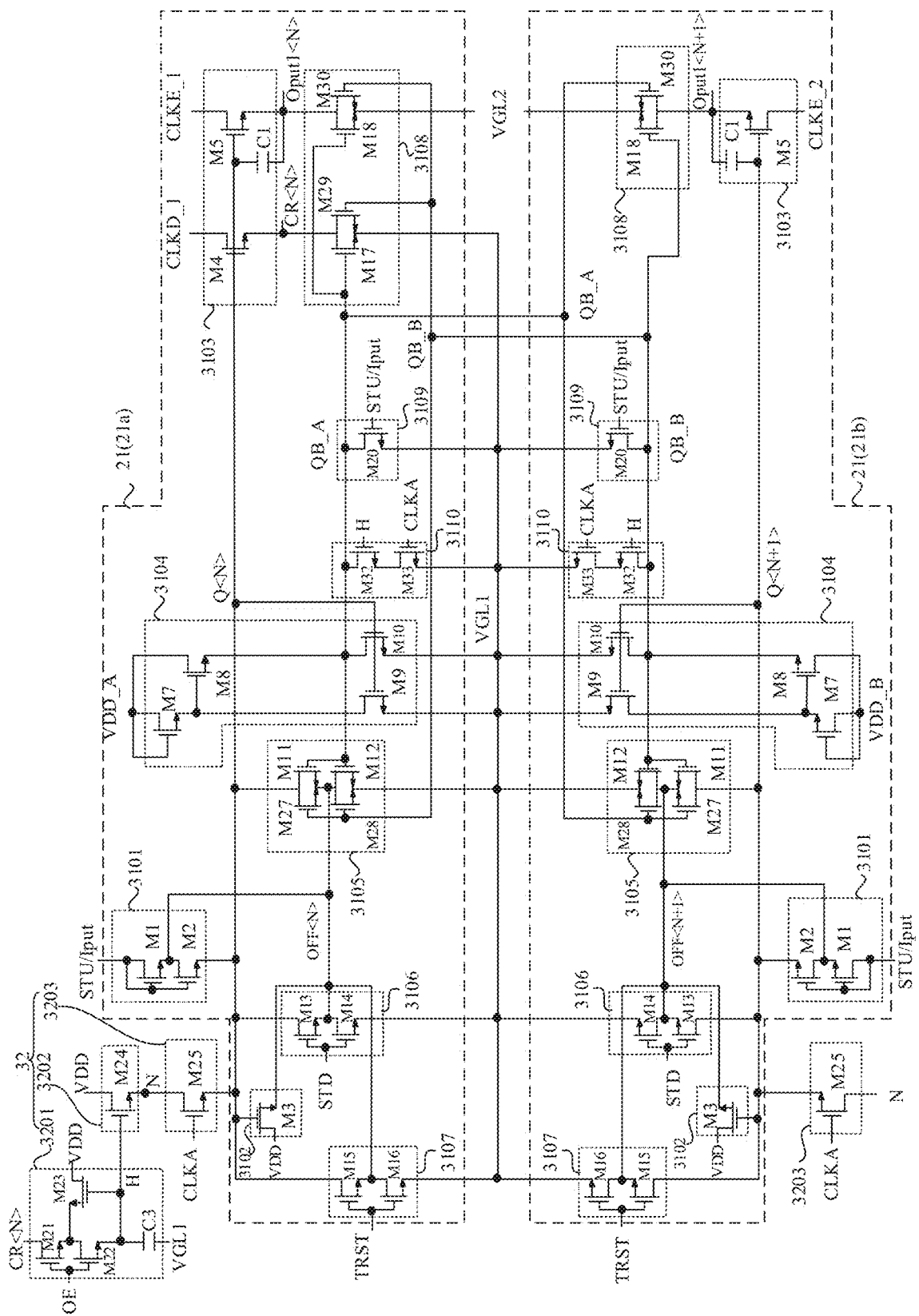
FIG. 3E is a structural diagram of yet another shift register, in accordance with some embodiments.

In some other examples, as shown in FIGS. 3B and 3E, the shift register 21 may include a first input circuit 3101, an anti-leakage circuit 3102, an output circuit 3103, a control circuit 3104, a first reset circuit 3105, a second reset circuit 3106, a third reset circuit 3107, a fourth reset circuit 3108 and a fifth reset circuit 3109.

For example, the first input circuit 3101 in these examples may be same in structure and function as the first input circuit 3101 in some of the above examples. The anti-leakage circuit 3102 in these examples may be same in structure and function as the anti-leakage circuit 3102 in some of the above examples. The control circuit 3104 in these examples may be same in structure and function as the control circuit 3104 in some of the above examples. The first reset circuit 3105 in these examples may be same in structure and function as the first reset circuit 3105 in some of the above examples. The second reset circuit 3106 in these examples may be same in structure and function as the second reset circuit 3106 in some of the above examples. The third reset circuit 3107 in these examples may be same in structure and function as the third reset circuit 3107 in some of the above examples. The fifth reset circuit 3109 in these examples may be same in structure and function as the fifth reset circuit in some of the above examples. The same structure and function of circuits will not be repeated here.

For example, as shown in FIGS. 3B and 3E, the output circuit 3103 is electrically connected to the pull-up node Q<N>, the first clock signal terminal CLKE_1 and the first output signal terminal Oput1<N>. The output circuit 3103 is configured to: in the display period in the display phase of the frame, transmit the first dock signal received at the first clock signal terminal CLKE_1 to the first output signal terminal Oput1<N> under the control of the voltage of the pull-up node Q<N>; and in the blanking period in the display phase of the frame, transmit the first clock signal received at the first clock signal terminal CLKE_1 to the first output signal terminal Oput1<N> under the control of the voltage of the pull-up node Q<N>.

Of course, as shown in FIGS. 3B and 3E, the output circuit 3103 may be further electrically connected to, for example, the third clock signal terminal CLKD_1 and the shift signal terminal CR<N>. The output circuit 3103 is further configured to, in the display period in the display phase of the frame, transmit the third clock signal received at the third clock signal terminal CLKD_1 to the shift signal terminal CR<N> under the control of the voltage of the pull-up node Q<N>.

For example, in the display period in the display phase of the frame, in the case where the voltage of the pull-up node Q<N> is increased, the output circuit 3103 may be turned on under the control of the voltage of the pull-up node Q<N>, so as to output the third clock signal received at the third clock signal terminal CLKD_1 as the shift signal from the shift signal terminal CR<N>, and to output the first clock signal received at the first clock signal terminal CLKE_1 as an output signal (i.e., the first gate signal received by the pixel circuit 12) from the first output signal terminal Oput1<N>. In the blanking period in the display phase of the frame, in the case where the voltage of the pull-up node Q<N> is increased, the output circuit 3103 may be turned on under the control of the voltage of the pull-up node Q<N> to output the first clock signal received at the first clock signal terminal CLKE_1 as an output signal (i.e., the second gate signal received by the pixel circuit 12) from the first output signal terminal Oput1<N>.

In these examples, for example, the first output signal terminal Oput1<N> in the shift register 21 may be electrically connected to the first gate line and the second gate line, so that in the display period in the display phase of the frame, the first output signal terminal Oput1<N> in the shift register 21 may transmit the first gate signal to the pixel circuit 12 sequentially through the first gate line and the first gate signal terminal G1. In the blanking period in the display phase of the frame, the first output signal terminal Oput1<N> in the shift register 21 may transmit the second gate signal to the pixel circuit 12 sequentially through the second gate line and the second gate signal terminal G2. For another example, the first output signal terminal Oput1<N> in the shift register 21 may be electrically connected to the first gate signal terminal G1 and the second gate signal terminal G2 through a gate line, so that in the display period in the display phase of the frame, the first output signal terminal Oput1<N> in the shift register 21 may transmit the first gate signal to the pixel circuit 12 sequentially through this gate line and the first gate signal terminal G1. In the blanking period in the display phase of the frame, the first output signal terminal Oput1<N> in the shift register 21 may transmit the second gate signal to the pixel circuit 12 sequentially through the this gate line and the second gate signal terminal G2.

As shown in FIGS. 3B and 3E, the output circuit 3103 may include a fourth transistor M4, a fifth transistor M5 and a first capacitor C1.

For example, as shown in FIGS. 3B and 3E, a control electrode of the fourth transistor M4 is electrically connected to the pull-up node Q<N>, a first electrode of the fourth transistor M4 is electrically connected to the third clock signal terminal CLKD_1, and a second electrode of the fourth transistor M4 is electrically connected to the shift signal terminal CR<N>.

In the display period in the display phase of the frame, in the case where the first input circuit 3101 is turned on such that the voltage of the pull-up node Q<N> is increased, the fourth transistor M4 may be turned on under the control of the high voltage of the pull-up node Q<N>, so as to transmit the third dock signal to the shift signal terminal CR<N> and output the third clock signal as the shift signal from the shift signal terminal CR<N>.

For example, as shown in FIGS. 3B and 3E, a control electrode of the fifth transistor M5 is electrically connected to the pull-up node Q<N>, a first electrode of the fifth transistor M5 is electrically connected to the first clock signal terminal CLKE_1, and a second electrode of the fifth transistor M5 is electrically connected to the first output signal terminal Oput1<N>. A first terminal of the first capacitor C1 is electrically connected to the pull-up node Q<N>, and a second terminal of the first capacitor C1 is electrically connected to the first output signal terminal Oput1<N>.

In the display period in the display phase of the frame, when the first input circuit 3101 is turned on such that the voltage of the pull-up node Q<N> is increased, the first capacitor C1 is charged. In the case where the first input circuit 3101 is turned off, the first capacitor C1 may be discharged, so that the voltage of the pull-up node Q<N> is maintained at a high level. Thus, the fifth transistor M5 may be maintained in an on state, so as to transmit the first clock signal to the first output signal terminal Oput1<N> and output the first dock signal as the output signal (i.e., the first gate signal received by the pixel circuit 12) from the first output signal terminal Oput1<N>.

In the blanking period in the display phase of the frame, when the voltage of the pull-up node Q<N> is increased, the first capacitor C1 is charged. In a corresponding phase, the first capacitor C1 may be discharged, so that the voltage of the pull-up node Q<N> is maintained at a high level. Thus, the fifth transistor M5 may be maintained in the on state, so as to transmit the first clock signal to the first output signal terminal Oput1<N> and output the first clock signal as the output signal (i.e., the second gate signal received by the pixel circuit 12) from the first output signal terminal Oput1<N>.

For example, as shown in FIGS. 3B and 3E, the fourth reset circuit 3108 is electrically connected to the pull-down node QB_A, the shift signal terminal CR<N>, the first output signal terminal Oput1<N>, the second voltage signal terminal VGL1 and the third voltage signal terminal VGL2. The fourth reset circuit 3108 is configured to reset the shift signal terminal CR<N> and the first output signal terminal Oput1<N> under the control of the voltage of the pull-down node QB_A.

For example, in the case where the voltage of the pull-down node QB_A is at a high level, the fourth reset circuit 3108 may be turned on due to the action of the voltage of the pull-down node QB_A, so as to transmit the second voltage signal transmitted by the second voltage signal terminal VGL1 to the shift signal terminal CR<N> to pull down and reset the shift signal terminal CR<N>, and to transmit the third voltage signal transmitted by the third voltage signal terminal VGL2 to the first output signal terminal Oput1<N> to pull down and reset the first output signal terminal Oput1<N>.

As shown in FIGS. 3B and 3E, the fourth reset circuit 3108 may include a seventeenth transistor M17 and an eighteenth transistor M18.

For example, as shown in FIGS. 3B and 3E, a control electrode of the seventeenth transistor M17 is electrically connected to the pull-down node QB_A, a first electrode of the seventeenth transistor M17 is electrically connected to the shift signal terminal CR<N>, and a second electrode of the seventeenth transistor M17 is electrically connected to the second voltage signal terminal VGL1.

In the case where the voltage of the pull-down node QB_A is at a high level, the seventeenth transistor M17 may be turned on due to the action of the voltage of the pull-down node QB_A to transmit the second voltage signal transmitted by the second voltage signal terminal VGL1 to the shift signal terminal CR<N>, so as to pull down and reset the shift signal terminal CR<N>.

For example, as shown in FIGS. 3B and 3E, a control electrode of the eighteenth transistor M18 is electrically connected to the pull-down node QB_A, a first electrode of the eighteenth transistor M18 is electrically connected to the first output signal terminal Oput1<N>, and a second electrode of the eighteenth transistor M18 is electrically connected to the third voltage signal terminal VGL2.

In the case where the voltage of the pull-down node QB_A is at a high level, the eighteenth transistor M18 may be turned on due to the action of the voltage of the pull-down node QB_A to transmit the third voltage signal transmitted by the third voltage signal terminal VGL2 to the first output signal terminal Oput1<N>, so as to pull down and reset the first output signal terminal Oput1<N>.

It will be noted that as shown in FIG. 3E, the gate driving circuit 2 may further include a plurality of blanking input circuits 32. The blanking input circuit 32 may be electrically connected to at least two stages of shift registers 21 that are adjacent to each other. That is, the at least two stages of shift registers 21 share the blanking input circuit 32. The blanking input circuit 32 is configured to, in the blanking period in the display phase of the frame, control a corresponding shift register 21 to input a blanking control signal (i.e., the second gate signal) to pixel circuits 12 in a corresponding row, so that the pixel circuits 12 acquire the sensing signal.

Here, as shown in FIG. 3E, the blanking input circuit 32 may include, for example, a selection control circuit 3201, a second input circuit 3202 and at least two transmission circuits 3203.

For example, the selection control circuit 3201 in the blanking input circuit 32 in these examples may same in structure and function as the selection control circuit 3201 in the blanking input circuit 32 in some of the above examples. The second input circuit 3202 in the blanking input circuit 32 in these examples may be same in structure and function as the second input circuit 3202 in the blanking input circuit 32 in some of the above examples. The same structure and function of circuits will not be repeated here.

For example, as shown in FIG. 3E, the at least two transmission circuits 3203 may be electrically connected to at least two shift registers 21 in one-to-one correspondence. One of the transmission circuit 3203 is electrically connected to the second blanking node N, the second dock signal terminal CLKA, and the pull-up node Q<N> in a stage of shift register 21. The transmission circuit 3202 is configured to transmit the second dock signal or the first voltage signal received at the second blanking node N to the pull-up node Q<N> under the control of the second clock signal transmitted by the second dock signal terminal CLKA in the blanking period in the display phase of the frame.

For example, in the blanking period in the display phase of the frame, in the case where the level of the second clock signal transmitted by the second dock signal terminal CLKA is a high level, the transmission circuit 3202 may be turned on under the control of the second dock signal, so as to receive the second dock signal or the first voltage signal from the second blanking node N and transmit the received second clock signal or the first voltage signal to the pull-up node Q<N>, so that the voltage of the pull-up node Q<N> is increased. Thus, the output circuit 3103 is turned on, so that the first output signal terminal Oput1<N> in the output circuit 3103 outputs an output signal.

As shown in FIG. 3E, the transmission circuit 3203 may include a twenty-fifth transistor M25.

For example, as shown in FIG. 3E, a control electrode of the twenty-fifth transistor M25 is electrically connected to the second dock signal terminal CLKA, a first electrode of the twenty-fifth transistor M25 is electrically connected to the second blanking node N, and a second electrode of the twenty-fifth transistor M25 is electrically connected to the pull-up node Q<N>.

In the blanking period in the display phase of the frame, in the case where the level of the second dock signal transmitted by the second dock signal terminal CLKA is a high level, the twenty-fifth transistor M25 may be turned on due to the action of the second dock signal, so that the twenty-fifth transistor M25 may transmit the second dock signal or the first voltage signal from the second blanking node N to the pull-up node Q<N> to charge the pull-up node Q<N>. The fifth transistor M5 in the output circuit 3103 may be turned on under the control of the voltage of the pull-up node Q<N>, so as to receive the first clock signal and output the first clock signal as the output signal from the first output signal terminal Oput1<N>.

For example, as shown in FIG. 3E, in the case where the gate driving circuit 2 further includes the blanking input circuits 32, the shift register 21 may further include a sixth reset circuit 3110. The sixth reset circuit 3110 is electrically connected to the second clock signal terminal CLKA, the first blanking node H, the pull-down node QB_A and the second voltage signal terminal VGL1. The sixth reset circuit 3110 is configured to reset the pull-down node QB_A under the common control of the second dock signal transmitted by the second clock signal terminal CLKA and the voltage of the first blanking node H in the blanking period in the display phase of the frame.

For example, in the blanking period in the display phase of the frame, in the case where the level of the second clock signal is a high level, and the voltage of the first blanking node H is at a high level, the sixth reset circuit 3110 may be turned on under the common control of the second clock signal and the voltage of the first blanking node H to transmit the second voltage signal transmitted by the second voltage signal terminal VGL1 to the pull-down node QB_A, so as to pull down and reset the pull-down node QB_A.

As shown in FIG. 3E, the sixth reset circuit 3110 may include a thirty-second transistor M32 and a thirty-third transistor M33.

For example, as shown in FIG. 3E, a control electrode of the thirty-second transistor M32 is electrically connected to the first blanking node H, a first electrode of the thirty-second transistor M32 is electrically connected to the pull-down node QB_A, and a second electrode of the thirty-second transistor M32 is electrically connected to a first electrode of the thirty-third transistor M33. A control electrode of the thirty-third transistor M33 is electrically connected to the second clock signal terminal CLKA, and a second electrode of the thirty-third transistor M33 is electrically connected to the second voltage signal terminal VGL1.

In the case where the level of the second clock signal is a high level, and the voltage of the first blanking node H is at a high level, the thirty-third transistor M33 may be turned on under the control of the second clock signal to transmit the second voltage signal to the first electrode of the thirty-third transistor M33, and the thirty-second transistor M32 may be turned on under the control of the voltage of the first blanking node H to transmit the second voltage signal from the first electrode of the thirty-third transistor M33 to the pull-down node QB_A, so as to pull down and reset the pull-down node QB_A.

As shown in FIG. 3E, a structure of the gate driving circuit 2 will be schematically described in an example where two stages of shift registers 21 that are adjacent to each other share the blanking input circuit 32. Further, N represents a positive odd number.

Here, as shown in FIG. 3E, in the two stages of shift registers 21 that are adjacent to each other, an output circuit 3103 in a next stage of shift register 21 may be provided without the fourth transistor M4, and is not electrically connected to the third clock signal terminal CLKD_1.

For example, the cascade relationship of the plurality of stages of shift registers 21 in these examples may be same as the cascade relationship of the plurality of stages of shift registers 21 in some of the above examples, which will not be repeated here.

For example, in the two stages of shift registers 21 that are adjacent to each other, a previous stage (i.e., the N-th stage) of shift register 21 may be referred to as a first scan unit 21a, and a next stage (i.e., the (N+1)-th stage) of shift register 21 may be referred to as a second scan unit 21b. In this case, a pull-up node Q<N> in the first scan unit 21a may be referred to as a first pull-up node Q<N>, and a pull-up node Q<N> in the second scan unit 21b may be referred to as a second pull-up node Q<N+1>. A pull-down node QB_A in the first scan unit 21a may be referred to as a first pull-down node QB_A, and a pull-down node QB_A in the second scan unit 21b may be referred to as a second pull-down node QB_B. An anti-leakage node OFF<N> in the first scan unit 21a may be referred to as a first anti-leakage node OFF<N>, and an anti-leakage node OFF<N> in the second scan unit 21b may be referred to as a second anti-leakage node OFF<N+1>. A first clock signal terminal CLKE_1 in the second scan unit 21b may be referred to as a fifth dock signal terminal CLKE_2. A first output signal terminal Oput1<N> in the first scan unit 21a may be referred to as a first sub-output signal terminal Oput1<N>, and a first output signal terminal Oput1<N> in the second scan unit 21b may be referred to as a second sub-output signal terminal Oput1<N+1>.

For example, as shown in FIG. 3E, a control circuit 3104 in the second scan unit 21b may be electrically connected to a seventh voltage signal terminal VDD_B, so as to replace the sixth voltage signal terminal VDD_A with the seventh voltage signal terminal VDD_B. In the display phase of the frame, the sixth voltage signal transmitted by the sixth voltage signal terminal VDD_A and a seventh voltage signal transmitted by the seventh voltage signal terminal VDD_B are mutually inverted signals.

For example, a first reset circuit 3105 in the first scan unit 21a in these examples may be same in structure and function as the first reset circuit 3105 in the first scan unit 21a in some of the above examples. A first reset circuit 3105 in the second scan unit 21b in these examples may be same in structure and function as the first reset circuit 3105 in the second scan unit 21b in some of the above examples. The same structure and function of circuits will not be repeated here.

For example, as shown in FIG. 3E, a fourth reset circuit 3108 in the first scan unit 21a may be further electrically connected to the second pull-down node QB_B. The fourth reset circuit 3108 is further configured to reset the shift signal terminal CR<N> and the first sub-output signal terminal Oput1<N> under a control of a voltage of the second pull-down node QB_B.

For example, in a case where the voltage of the second pull-down node QB_B is at a high level, the fourth reset circuit 3108 may be turned on due to an action of the voltage of the second pull-down node QB_B, so as to transmit the second voltage signal transmitted by the second voltage signal terminal VGL1 to the shift signal terminal CR<N> to pull down and reset the shift signal terminal CR<N>, and to transmit the third voltage signal transmitted by the third voltage signal terminal VGL2 to the first sub-output signal terminal Oput1<N> to pull down and reset the first sub-output signal terminal Oput1<N>.

As shown in FIG. 3E, the fourth reset circuit 3108 in the first scan unit 21a may further include a twenty-ninth transistor M29 and a thirtieth transistor M30.

For example, as shown in FIG. 3E, a control electrode of the twenty-ninth transistor M29 is electrically connected to the second pull-down node QB_B, a first electrode of the twenty-ninth transistor M29 is electrically connected to the shift signal terminal CR<N>, and a second electrode of the twenty-ninth transistor M29 is electrically connected to the second voltage signal terminal VGL1.

In the case where the voltage of the second pull-down node QB_B is at a high level, the twenty-ninth transistor M29 may be turned on due to the action of the voltage of the second pull-down node QB_B to transmit the second voltage signal transmitted by the second voltage signal terminal VGL1 to the shift signal terminal CR<N>, so as to pull down and reset the shift signal terminal CR<N>.

For example, as shown in FIG. 3E, a control electrode of the thirtieth transistor M30 is electrically connected to the second pull-down node QB_B, a first electrode of the thirtieth transistor M30 is electrically connected to the first sub-output signal terminal Oput1<N>, and a second electrode of the thirtieth transistor M30 is electrically connected to the third voltage signal terminal VGL2.

In the case where the voltage of the second pull-down node QB_B is at a high level, the thirtieth transistor M30 may be turned on due to the action of the voltage of the second pull-down node QB_B to transmit the third voltage signal transmitted by the third voltage signal terminal VGL2 to the first sub-output signal terminal Oput1<N>, so as to pull down and reset the first sub-output signal terminal Oput1<N>.

For example, as shown in FIG. 3E, a fourth reset circuit 3108 in the second scan unit 21b may be further electrically connected to the first pull-down node QB_A. The fourth reset circuit 3108 is further configured to reset the second sub-output signal terminal Oput1<N+1> under a control of a voltage of the first pull-down node QB_A.

For example, in a case where the voltage of the first pull-down node QB_A is at a high level, the fourth reset circuit 3108 may be turned on due to an action of the voltage of the first pull-down node QB_A to transmit the third voltage signal transmitted by the third voltage signal terminal VGL2 to the second sub-output signal terminal Oput1<N+1>, so as to pull down and reset the second sub-output signal terminal Oput1<N+1>.

As shown in FIG. 3E, the fourth reset circuit 3108 in the second scan unit 21b may further include a thirtieth transistor M30.

For example, as shown in FIG. 3E, a control electrode of the thirtieth transistor M30 is electrically connected to the first pull-down node QB_A, a first electrode of the thirtieth transistor M30 is electrically connected to the second sub-output signal terminal Oput1<N+1>, and a second electrode of the thirtieth transistor M30 is electrically connected to the third voltage signal terminal VGL2.

In the case where the voltage of the first pull-down node QB_A is at a high level, the thirtieth transistor M30 may be turned on due to the action of the voltage of the first pull-down node QB_A to transmit the third voltage signal transmitted by the third voltage signal terminal VGL2 to the second sub-output signal terminal Oput1<N+1>, so as to pull down and reset the second sub-output signal terminal Oput1<N+1>.

Hereinafter, the structure of the gate driving circuit 2 will be further schematically described considering the structure of the shift registers 21 shown in FIG. 3C as an example.

In some examples, as shown in FIG. 3D, the gate driving circuit 2 may further include a plurality of control signal lines 33 extending in a vertical direction. A stage of shift register 21 is electrically connected to at least part of the plurality of control signal lines 33. The shift register 21 is configured to provide an output signal to pixel circuits 12 in a corresponding row under a control of the at least part of control signal lines 33 electrically connected to the shift register 21.

Here, the at least part of the plurality of control signal lines 33 may refer to some of the plurality of control signal lines 33.

For example, RS1, RS2, RS3 . . . RS6 all shown in FIG. 3D respectively represent the first stage shift register 21, the second stage shift register 21, the third stage shift register 21 . . . a sixth stage shift register 21, which are respectively connected to pixel circuits 12 in sub-pixels 1 in a first row, pixel circuits 12 in sub-pixels 1 in a second row, pixel circuits 12 in sub-pixels 1 in a third row . . . pixel circuits 12 in sub-pixels 1 in a sixth row in the display panel 100.

RS1, RS3 or RS5 may be electrically connected to first gate signal terminals G1 in pixel circuits 12 in a corresponding row through a first sub-output signal terminals Oput1<N>, and may be electrically connected to second gate signal terminals G2 in pixel circuits 12 in a corresponding row through a second sub-output signal terminal Oput2<N>. RS2, RS4 or RS6 may be electrically connected to first gate signal terminals G1 in pixel circuits 12 in a corresponding row through a third sub-output signal terminal Oput1<N+1>, and may be electrically connected to second gate signal terminals G2 in pixel circuits 12 in a corresponding row through a fourth sub-output signal terminal Oput2<N+1>.

Here, RS1, RS3 or RS5 may be referred to as the first scan unit 21a, and RS2, RS4 or RS6 may be referred to as the second scan unit 21b.

For example, as shown in FIG. 3D, the plurality of control signal lines 33 may include a first clock signal line CLK_1, a second clock signal line CLK_2 and a third clock signal line CLK_3.

A third clock signal terminal CLKD_1 in the first stage shift register 21 is electrically connected to the first clock signal line CLK_1 to receive a third dock signal. A third clock signal terminal CLKD_1 in the third stage shift register 21 is electrically connected to the second clock signal line CLK_2 to receive a third clock signal. A third clock signal terminal CLKD_1 in the fifth stage shift register 21 is electrically connected to the third clock signal line CLK_3 to receive a third clock signal.

For example, as shown in FIG. 3D, the plurality of control signal lines 33 may further include a fourth clock signal line CLK_4, a fifth clock signal line CLK_5, a sixth clock signal line CLK_6, a seventh clock signal line CLK_7, an eighth clock signal line CLK_8, a ninth clock signal line CLK_9, a tenth clock signal line CLK_10, an eleventh clock signal line CLK_11, a twelfth dock signal line CLK_12, a thirteenth clock signal line CLK_13, a fourteenth clock signal line CLK_14 and a fifteenth clock signal line CLK_15.

In the first stage shift register 21, a first clock signal terminal CLKE_1 is electrically connected to the fourth clock signal line CLK_4 to receive a first dock signal, and a fourth clock signal terminal CLKF_1 is electrically connected to the fifth clock signal line CLK_5 to receive a fourth clock signal.

In the second stage shift register 21, a fifth clock signal terminal CLKE_2 is electrically connected to the sixth clock signal line CLK_6 to receive a fifth clock signal, and a sixth clock signal terminal CLKF_2 is electrically connected to the seventh clock signal line CLK_7 to receive a sixth clock signal.

In the third stage shift register 21, a first clock signal terminal CLKE_1 is electrically connected to the eighth clock signal line CLK_8 to receive a first clock signal, and a fourth clock signal terminal CLKF_1 is electrically connected to the ninth clock signal line CLK_9 to receive a fourth clock signal.

In the fourth stage shift register 21, a fifth clock signal terminal CLKE_2 is electrically connected to the tenth dock signal line CLK_10 to receive a fifth dock signal, and a sixth dock signal terminal CLKF_2 is electrically connected to the eleventh dock signal line CLK_11 to receive a sixth clock signal.

In the fifth stage shift register 21, a first clock signal terminal CLKE_1 is electrically connected to the twelfth dock signal line CLK_12 to receive a first dock signal, and a fourth dock signal terminal CLKF_1 is electrically connected to the thirteenth dock signal line CLK_13 to receive a fourth dock signal.

In the sixth stage shift register 21, a fifth clock signal terminal CLKE_2 is electrically connected to the fourteenth dock signal line CLK_14 to receive a fifth dock signal, and a sixth clock signal terminal CLKF_2 is electrically connected to the fifteenth clock signal line CLK_15 to receive a sixth clock signal.

For example, as shown in FIG. 3D, the plurality of control signal lines 33 may further include a sixteenth dock signal line CLK_16.

A global reset signal terminal TRST in each stage of shift register 21 is electrically connected to the sixteenth clock signal line CLK_16 to receive a global reset signal.

For example, as shown in FIG. 3D, the plurality of control signal lines 33 may further include a seventeenth dock signal line CLK_17 and an eighteenth dock signal line CLK_18.

A selection control signal terminal OE in each blanking input circuit 32 is electrically connected to the seventeenth dock signal line CLK_17 to receive a selection control signal.

A second clock signal terminal CLKA in each blanking input circuit 32 is electrically connected to the eighteenth dock signal line CLK_18 to receive a second clock signal.

For example, as shown in FIG. 3D, the plurality of control signal lines 33 may further include a nineteenth clock signal line CLK_19 and a twentieth dock signal line CLK_20.

A sixth voltage signal terminal VDD_A in the first stage shift register 21, a sixth voltage signal terminal VDD_A in the third stage shift register 21 and a sixth voltage signal terminal VDD_A in the fifth stage shift register 21 are each electrically connected to the nineteenth clock signal line CLK_19 to receive a sixth voltage signal.

A seventh voltage signal terminal VDD_B in the second stage shift register 21, a seventh voltage signal terminal VDD_B in the fourth stage shift register 21 and a seventh voltage signal terminal VDD_B in the sixth stage shift register 21 are each electrically connected to the twentieth dock signal line CLK_20 to receive a seventh voltage signal.

For example, as shown in FIG. 3D, the plurality of control signal lines 33 may further include a twenty-first clock signal line CLK_21.

An input signal terminal Iput in the first stage shift register 21 and an input signal terminal Iput in the second stage shift register 21 may each be electrically connected to the twenty-first clock signal line CLK_21 to receive an initial signal as an input signal.

For example, as shown in FIG. 3D, the plurality of control signal lines 33 may further include a twenty-second dock signal line CLK_22.

Display reset signal terminals STD in last four stages of shift registers 21 in the gate driving circuit 2 may each be electrically connected to the twenty-second dock signal line CLK_22 to receive a display reset signal.

For example, in the gate driving circuit 2, in other stages of shift registers 21 except for the first stage shift register 21 and the second stage shift register 21, the shift signal terminal CR<N> in the N-th stage shift register 21 may be electrically connected to the input signal terminals Iput in the (N+2)-th stage shift registers 21 and the (N+3)-th stage shift registers 21, so that the shift signal output from the shift signal terminal CR<N> in the N-th stage shift register 21 serves as both the input signal of the (N+2)-th stage shift register 21 and the input signal of the (N+3)-th stage shift register 21. In other stages of shift registers 21 except for the last four stages of shift registers 21, the display reset signal terminals STD in the N-th stage shift register 21 and the (N+1)-th stage shift register 21 may be electrically connected to, for example, the shift signal terminal CR<N> in the (N+4)-th stage shift register 21, so that the shift signal output from the shift signal terminal CR<N> in the (N+4)-th stage shift register 21 serves as both the display reset signal of the N-th stage shift register 21 and the display reset signal of the (N+1)-th stage shift register 21.

The transistors used in the circuits in the embodiments of the present disclosure may be thin film transistors, field effect transistors (e.g., oxide thin film transistors) or other switching devices with same characteristics. In the embodiments of the present disclosure, the description is made considering the thin film transistors as an example.

In some embodiments, a control electrode of each transistor used in the shift register 21 is a gate of the transistor, a first electrode of the transistor is one of a source and a drain of the transistor, and a second electrode of the transistor is another one of the source and the drain of the transistor. Since the source and the drain of the transistor may be symmetrical in structure, the source and the drain of the transistor may be same in structure. That is, a first electrode and a second electrode of a transistor in the embodiments of the present disclosure may be same in structure. For example, in a case where the transistor is a P-type transistor, the first electrode of the transistor is a source, and the second electrode of the transistor is a drain. For example, in a case where the transistor is an N-type transistor, the first electrode of the transistor is a drain, and the second electrode of the transistor is a source.

In the circuits in the embodiments of the present disclosure, nodes such as the first pull-up node, the second pull-up node, the first pull-down node and the second pull-down node do not represent actual components, but represent junctions of related electrical connections in circuit diagrams. That is, these nodes are nodes that are equivalent to the junctions of the related electrical connections in the circuit diagrams.

In the embodiments of the present disclosure, the term "pull up" refers to charging a node or an electrode of a transistor, so that an absolute value of a voltage of the node or the electrode is increased, thereby operating (e.g., turning on) a corresponding transistor. The term "pull down" refers to discharging a node or an electrode of a transistor, so that an absolute value of a voltage of the node or the electrode is reduced, thereby operating (e.g., turning off) a corresponding transistor.

In the related art, a display panel usually has a display area and a bezel area around the display area. A plurality of sub-pixels in the display panel are provided in the display area, and a gate driving circuit is usually provided in the bezel area, and is located on a side of the display area. That is, the gate driving circuit is provided in the display panel through a gate diver on array (GOA, i.e., the gate driving circuit is integrated in an array substrate) technology.

As a resolution of a display panel becomes higher and higher, a display panel with a narrow bezel or even no bezel becomes a current development trend. In a display panel, especially for a large-sized display panel, the gate driving circuit is provided in the display panel by using the GOA technology, which makes it difficult to realize the display panel with the narrow bezel or even no bezel. Moreover, a shape of current display panel is designed to be a non-rectangular shape, which makes it more difficult to realize the display panel with the narrow bezel or even no bezel by using the above arrangement.

Figure 6:
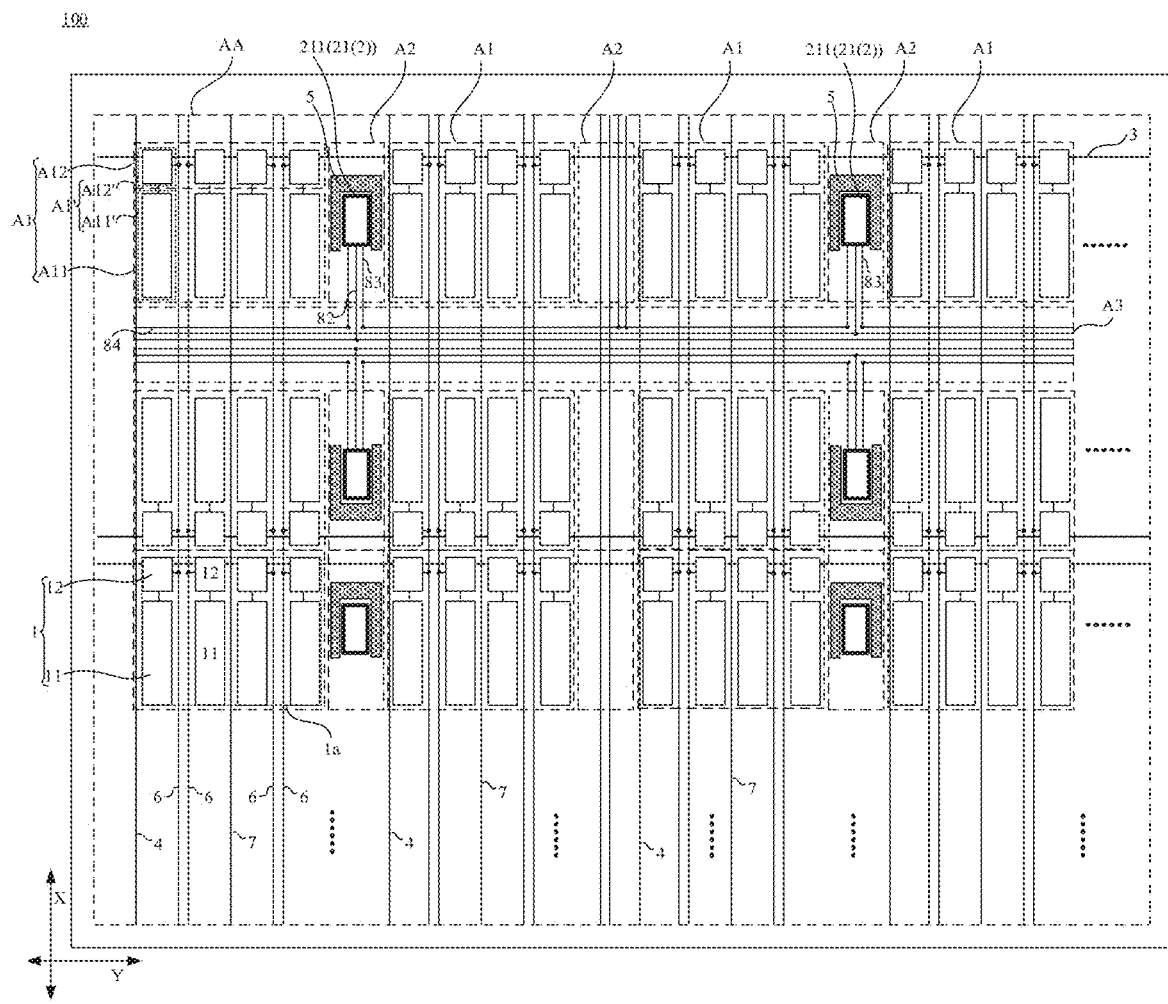
FIG. 6 is an overall structural diagram of another display panel, in accordance with some embodiments.

In some embodiments of the present disclosure, as shown in FIGS. 2 and 6, the gate driving circuit 2 is provided in a display area AA of the display panel 100 by using a gate diver in array (GIA, i.e, the gate driving circuit is integrated in a display area of an array substrate) technology, so as to realize a display panel with no bezel.

As shown in FIGS. 2 and 6, the display panel 100 has the display area AA, and the display area AA includes a plurality of pixel areas A1 arranged in an array, and a plurality of gate driving circuit areas A2. Hereinafter, a column direction of the plurality of pixel areas A1 arranged in the array is referred to as a first direction X, and a row direction of the plurality of pixel areas A1 arranged in the array is referred to as a second direction Y. The first direction X and the second direction Y intersect with each other. For example, the first direction X and the second direction Y are perpendicular to each other. It will be understood that the plurality of gate driving circuit areas A2 are also arranged in an array. The first direction X is also a column direction of the plurality of gate driving circuit areas A2 arranged in the array, and the second direction Y is also a row direction of the plurality of gate driving circuit areas A2 arranged in the array.

As shown in FIGS. 2 and 6, pixel areas A1 in each row correspond to at least two gate driving circuit areas A2, and each gate driving circuit area A2 is located between two adjacent pixel areas A1. That is, in the second direction Y, pixel areas A1 and gate driving circuit areas A2 are alternately arranged in sequence. For example, in a case where pixel areas A1 in a row include N pixel areas A1, gate driving circuit areas A2 in this row include N−1 gate driving circuit areas A2.

For example, each pixel area A1 is provided with at least two sub-pixels 1 therein. As shown in FIGS. 2 and 6, the plurality of sub-pixels 1 included in the display panel 100 are divided into a plurality of pixel units 1a, and each pixel unit 1a is provided in a pixel area A1. The pixel unit 1a may include at least three sub-pixels 1 sequentially arranged in the second direction Y.

For example, the pixel unit 1a may include three sub-pixels 1 or four sub-pixels 1 sequentially arranged in the second direction Y. In a case where the pixel unit 1a includes three sub-pixels 1 sequentially arranged in the second direction Y, the three sub-pixels 1 may include a red sub-pixel, a green sub-pixel and a blue sub-pixel, respectively. In a case where the pixel unit 1a includes four sub-pixels 1 sequentially arranged in the second direction Y, the four sub-pixels 1 may include a red sub-pixel, a green sub-pixel, a blue sub-pixel and a white sub-pixel, respectively.

As shown in FIGS. 2 and 6, it will be understood that each pixel area A1 includes at least two sub-pixel areas A1', and each sub-pixel area A1' is provided with a sub-pixel 1 therein.

In some examples, as shown in FIGS. 2 and 6, each pixel area A1 includes a pixel light-emitting sub-area A11 and a pixel circuit sub-area A12 arranged side by side in the first direction X. The pixel light-emitting sub-area A11 is provided with light-emitting devices 11 included in a pixel unit 1a therein, and the pixel circuit sub-area A12 is provided with pixel circuits 12 included in this pixel unit 1a therein. It will be understood that each sub-pixel area A1' includes a sub-pixel light-emitting sub-area A11' and a sub-pixel circuit sub-area A12' arranged side by side in the first direction X. A light-emitting device 11 and a pixel circuit 12 in a sub-pixel 1 are provided in a sub-pixel light-emitting sub-area A11' and a sub-pixel circuit sub-area A12', respectively.

In some embodiments, the gate driving circuit 2 includes a plurality of shift registers 21 that are cascaded, and each shift register 21 is electrically connected to sub-pixels 1 in a row. For example, each shift register 21 is electrically connected to a gate line 3, and each shift register 21 is able to output a scan signal to control the sub-pixels 1 in this row.

As shown in FIGS. 2, 4A, 6 and 7, each shift register 21 includes a plurality of transistor groups 211, and each transistor group 211 includes at least one transistor T. For example, as shown in FIG. 3B, the shift register includes the first transistor M1 and the second transistor M2, and the first transistor M1 and the second transistor M2 are divided into a group as a transistor group 211.

The plurality of transistor groups 211 are respectively provided in gate driving circuit areas A2 corresponding to pixel areas A1 where the sub-pixels 1 that are electrically connected to the shift register 21 are located. Each transistor group 211 is located between pixel light-emitting sub-areas A11 of two adjacent pixel areas A1.

The gate driving circuit areas A2 corresponding to the pixel areas A1 means that the pixel areas A1 and the gate driving circuit areas A2 are located in a same row.

For example, the shift register 21 is electrically connected to sub-pixels 1 in a row, and the sub-pixels 1 electrically connected to this shift register 21 are sub-pixels in an n-th row. Pixel areas A1 where the sub-pixels 1 in the n-th row are located are pixel areas A1 in the n-th row, and gate driving circuit areas A2 corresponding to the pixel areas A1 in the n-th row are gate driving circuit areas A2 in the n-th row. Thus, the plurality of transistor groups 211 in this shift register are respectively provided in gate driving circuit areas A2 in the gate driving circuit areas A2 in the n-th row.

Thus, the plurality of transistor groups 211 in the shift register 21 are respectively provided in the gate driving circuit areas A2, i.e., the plurality of transistor groups 211 are provided at gaps between the sub-pixels 1 in the display area AA, so that the gate driving circuit 2 is provided in the display area AA of the display panel 100 to narrow the bezel of the display panel.

Figure 4A:
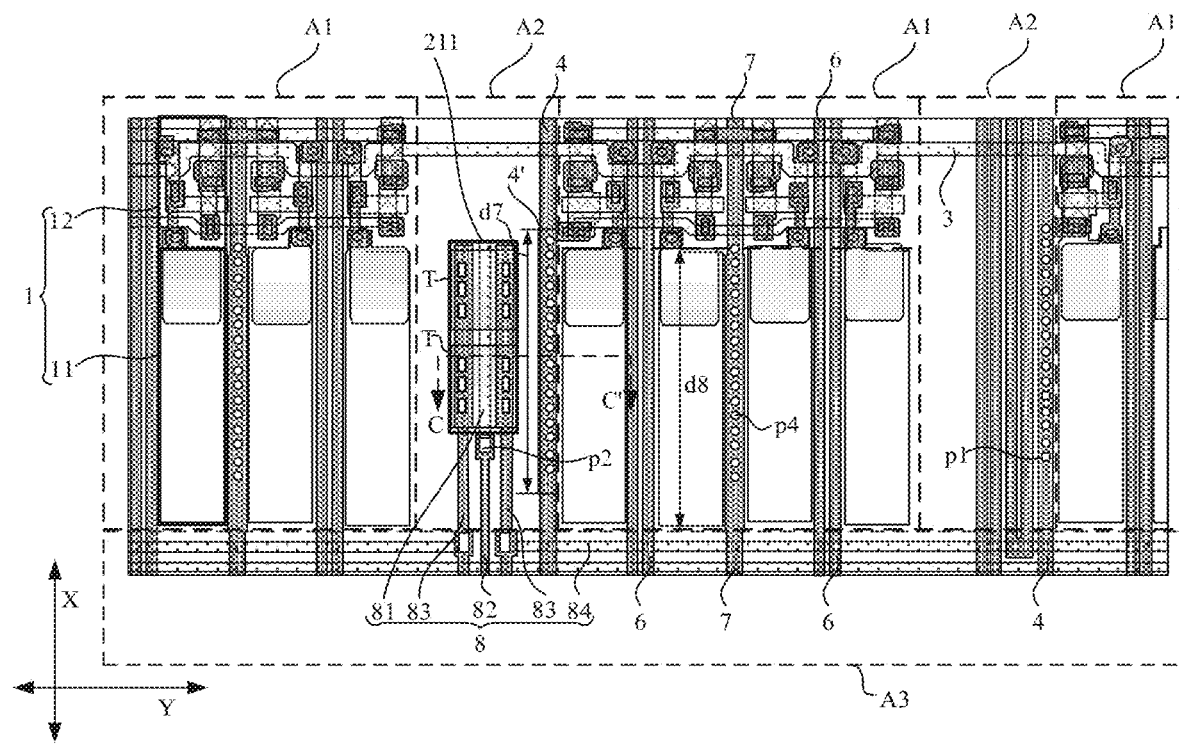
FIG. 4A is a partial structural diagram of a display panel, in accordance with some embodiments.
Figure 4B:
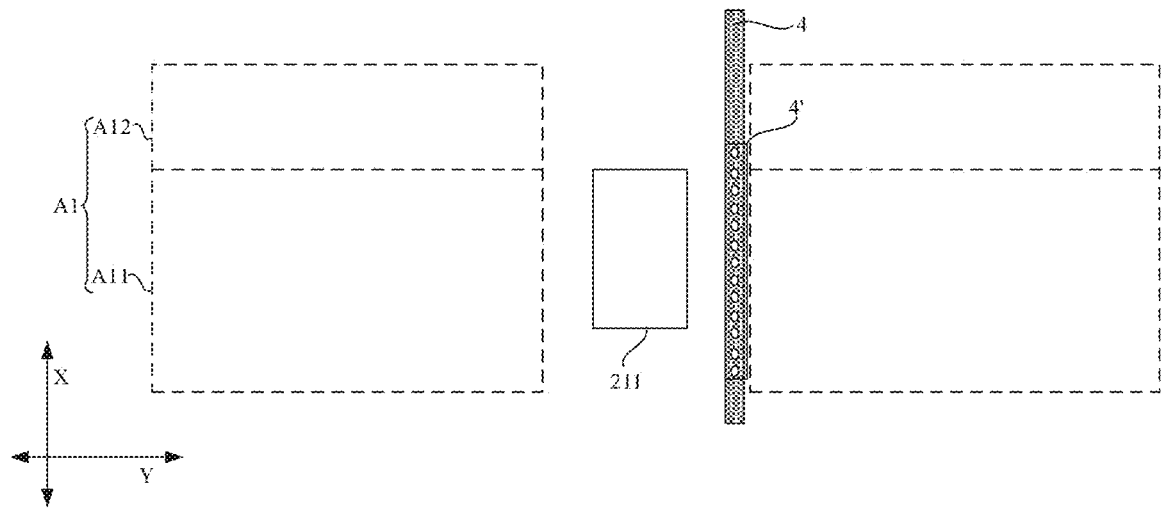
FIG. 4B is a simplified partial structural diagram of the display panel shown in FIG. 4A.

It will be noted that the gate driving circuit area A2 between two adjacent pixel areas A1 includes an area between the pixel light-emitting sub-areas A11 of the two adjacent pixel areas A1 and an area between the pixel circuit sub-areas A12 of the two adjacent pixel areas A1. A reason of providing each transistor group 211 between pixel light-emitting sub-areas A11 of two adjacent pixel areas A1 is that, as shown in FIGS. 2 and 4A, the area between the pixel circuit sub-areas A12 of the two adjacent pixel areas A1 is provided with signal line(s) therein, e.g., the gate line 3 extending in the second direction Y. The gate line 3 is electrically connected to the pixel circuits 12 in the sub-pixels 1 in this row. A film layer where the signal lines 3 are located and a film layer where structures (e.g., gates) included in the transistors T in the transistor groups 211 are located are located in a same layer. Therefore, the transistor groups 211 cannot be placed close to the pixel circuit sub-area A12, and each transistor group 211 is provided between the pixel light-emitting sub-areas A11 of the two adjacent pixel areas A1, so that the space is able to be reasonably utilized, and the gate driving circuit is provided in the display area AA on a premise of not occupying the space required for other devices or signal lines and avoiding a short circuit due to a contact of conductive structures.

In some embodiments, as shown in FIGS. 2, 4A, 4B, 6 and 7, the display panel 100 further includes a plurality of power supply signal lines 4, and each power supply signal line 4 is provided on a side of a column of pixel areas A1 in the second direction Y. In the gate driving circuit area A2 provided with the transistor group 211 therein, the power supply signal line 4 is located between a pixel area A1 corresponding to the gate driving circuit area A2 and the transistor group 211.

For example, the plurality of power supply signal lines 4 extend in the first direction X, and each power supply signal line 4 is provided on a left side of a column of pixel areas A1 in the second direction Y. In the gate driving circuit area A2 provided with the transistor group 211 therein, the power supply signal line 4 is located between the pixel area A1 corresponding to the gate driving circuit area A2 and the transistor group 211. The pixel area A1 corresponding to the gate driving circuit area A2 is a pixel area A1 located on a right side of this gate driving circuit area A2.

Each power supply signal line 4 is electrically connected to sub-pixels 1 pixel areas A1 in a column, and is configured to transmit a power supply signal to each sub-pixel 1. For example, as shown in FIGS. 2 and 6, each power supply signal line 4 is electrically connected to sub-pixels 1 in four columns in pixel areas A1 in a column, and is configured to transmit the power supply signal to each of the sub-pixels 1 in the four columns.

In some embodiments, the number of the plurality of transistor groups 211 included in the shift register 21 may be less than the number of gate driving circuit areas A2 corresponding to pixel areas A1 where sub-pixels 1 in a row that are electrically connected to this shift register 21 are located. That is, a part of the gate driving circuit areas A2 are each provided with the transistor group 211, and another part of the gate driving circuit areas A2 are not provided with the transistor group 211. For example, as shown in FIG. 2, the another part of the gate driving circuit areas A2 are provided with signal lines electrically connected to the shift register 21 therein, e.g., dock signal lines CL. Alternatively, the another part of the gate driving circuit areas A2 are provided without any device or signal line.

In some embodiments, the display area AA of the display panel 100 further includes a plurality of gap areas A3, and the gap area A3 is a gap area between sub-pixels 1 in two adjacent rows. In some examples, as shown in FIGS. 2 and 6, in a case where two adjacent stages of shifter registers 21 in the shift registers 21 included in the gate driving circuit 2 are respectively the first scan unit 21a and the second scan unit 21b (referring to the structures shown in FIGS. 3C and 3E), a gap area exists between sub-pixels 1 in two adjacent rows that are electrically connected to the two adjacent stages of shifter registers 21, and this gap area is the gap area A3.

Since the plurality of transistor groups 211 included in the shift register 21 are respectively provided in the gate driving circuit areas A2 corresponding to the pixel areas A1 where the sub-pixels 1 that are electrically connected to the shift register 21 are located, transistors T in different transistor groups 211 may be electrically connected through wires. In some examples, as shown in FIGS. 2, 4A, 6 and 7, the display panel 100 further includes a plurality of connection lines 8 disposed in the display area AA. For example, the plurality of connection lines 8 include a plurality of first connection lines 81, a plurality of second connection lines 82, a plurality of third connection lines 83 and a plurality of fourth connection lines 84. The plurality of first connection lines 81, the plurality of second connection lines 82 and the plurality of third connection lines extend in the first direction X, and the plurality of fourth connection lines 84 extend in the second direction Y.

As shown in FIGS. 2, 3, 6 and 7, the plurality of first connection lines 81, the plurality of second connection lines 82 and the plurality of third connection lines 83 are provided in gate driving circuit areas A2 provided with respective transistor groups 211. For example, a first connection line 81, a second connection line 82 and two third connection lines 83 are provided in a gate driving circuit areas A2. A gate of each transistor T in a same transistor group 211 is electrically connected to the first connection line 81, an end of the second connection line 82 is electrically connected to the first connection line 81, and another end of the second connection line 82 is connected to a fourth connection line 84, so as to be electrically connected to another transistor group 211.

A source and a drain of each transistor T in the same transistor group 211 are electrically connected to the two third connection lines 83, respectively, and each third connection line 83 is further electrically connected to the fourth connection line 84, so as to be electrically connected to another transistor group 211.

The plurality of fourth connection lines 84 are provided in the plurality of gap areas A3. For example, at least one fourth connection line 84 is provided in a gap area A3, and the plurality of fourth connection lines 84 are electrically connected to the plurality of second connection lines 82 and the plurality of third connection lines 83. For example, an end of the fourth connection line 84 is electrically connected to a third connection line 83, and this third connection line 83 is electrically connected to source(s) of transistor(s) T in a transistor group 211. Another end of the fourth connection line 84 is electrically connected to another third connection line 83, and this third connection line 83 is electrically connected to drain(s) of transistor(s) T in another transistor group 211. Thus, transistors T in different transistor groups 211 are electrically connected to each other.

Since each transistor group 211 is provided between the pixel light-emitting sub-areas A11 of the two adjacent pixel areas A1, i.e., the transistor group 211 is provided close to the pixel light-emitting sub-area A11, light emitted from the light-emitting device 11 in the pixel light-emitting sub-area A11 may reach the transistor T in the transistor group 211.

Figure 5:
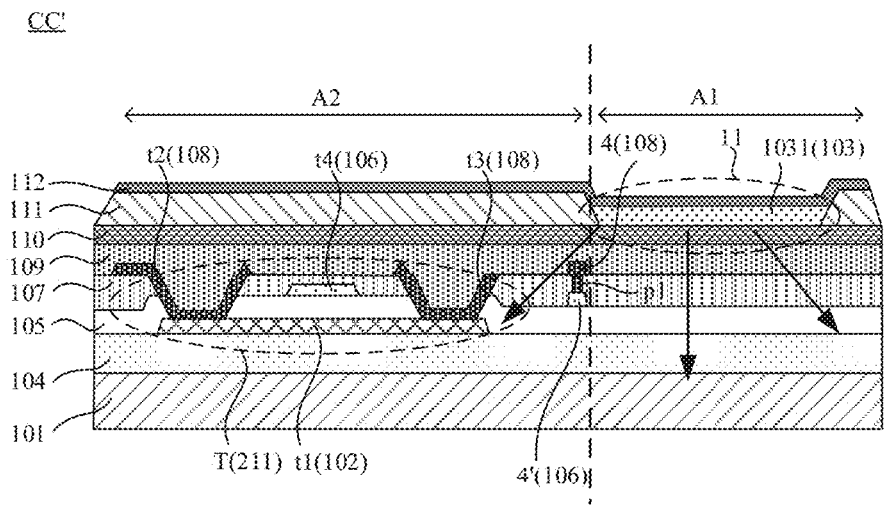
FIG. 5 is a sectional view taken along the section line CC' in FIG. 4A.

As shown in FIG. 5, in the sectional view of the display panel, no shield exists between the light-emitting device 11 and the transistor T in the transistor group 211, so that the light emitted from the light-emitting device 11 may reach an active layer t1 of the transistor T in the transistor group 211. In a GIA design, the active layer t1 of the transistor T is irradiated by light, which may cause a channel length to decrease, so that a width-to-length ratio of the active layer t1 of the transistor T changes.

As a possible design, as shown in FIGS. 6 to 16, the display panel 100 in some embodiments of the present disclosure further includes a plurality of light-shielding portions 5, and each light-shielding portion 5 is located in the gate driving circuit area A2 provided with the transistor group 211. Each light-shielding portion 5 is provided on a periphery of the transistor group 211, and is electrically connected to a power supply signal line 4. The light-shielding portion 5 is configured to block light from the pixel light-emitting sub-area A11 from reaching the active layer t1 of the transistor T in the transistor group 211.

Each light-shielding portion 5 is provided on the periphery of the transistor group 211, which means that from a top view (the planar positional relationship between the light-shielding portion 5 and the transistor group 211 is described from the top view), each light-shielding portion 5 is provided on at least one side of the transistor group 211, or is arranged around the transistor group 211, and a position of the light-shielding portion 5 is determined to ensure that the light from the pixel light-emitting sub-area A11 is blocked from reaching the active layer t1 of the transistor T in the transistor group 211.

The light-shielding portion 5 is provided in the gate driving circuit area A2 provided with the transistor group 211, and each light-shielding portion 5 is provided on the periphery of the transistor group 211, so that the light from the pixel light-emitting sub-area A11 is able to be blocked from reaching the active layer t1 of the transistor T in the transistor group 211. In this way, an influence of the light from the pixel light-emitting sub-area A11 on the active layer t1 of the transistor T in the transistor group 211 is reduced, the active layer t1 of the transistor T is protected, thereby reducing an influence on the performance of the transistor T. Thus, consistency in the design and simulation of the gate driving circuit 2 is improved, and the yield of the display panel is improved.

In addition, since each light-shielding portion 5 is provided on the periphery of the transistor group 211, and is electrically connected to the power supply signal line 4, the power supply signal flowing through the power supply signal line 4 is able to flow through the light-shielding portion 5 electrically connected to the power supply signal line 4, which is equivalent to widening a portion of the power supply signal line 4 in the gate driving circuit area A2. Thus, a resistance of the power supply signal line 4 and the light-shielding portion 5 as a whole is reduced, and a voltage drop is reduced, so that a signal loss of the power supply signal during transmission is able to be reduced, so as to ensure an integrity of the power supply signal. Moreover, since each light-shielding portion 5 is provided on the periphery of the transistor group 211, in a case where the light-shielding portion 5 is arranged around the transistor group 211, an electrostatic shielding effect is able to be exerted on the transistor group 211, so as to reduce generation of static electricity in the display panel 100 and an interference of noise to the transistor group 211.

In some embodiments, the light-shielding portion 5 is made of an opaque material. For example, the light-shielding portion 5 is made of a same material as the power supply signal line 4. For example, the light-shielding portion 5 is made of metal, such as copper, aluminum or copper-aluminum alloy.

Hereinafter, considering the transistor group 211 in the gate driving circuit area A2 as an example, several exemplary structures of the light-shielding portion 5 on the periphery of the transistor group 211 will be introduced from the top view.

Figure 7:
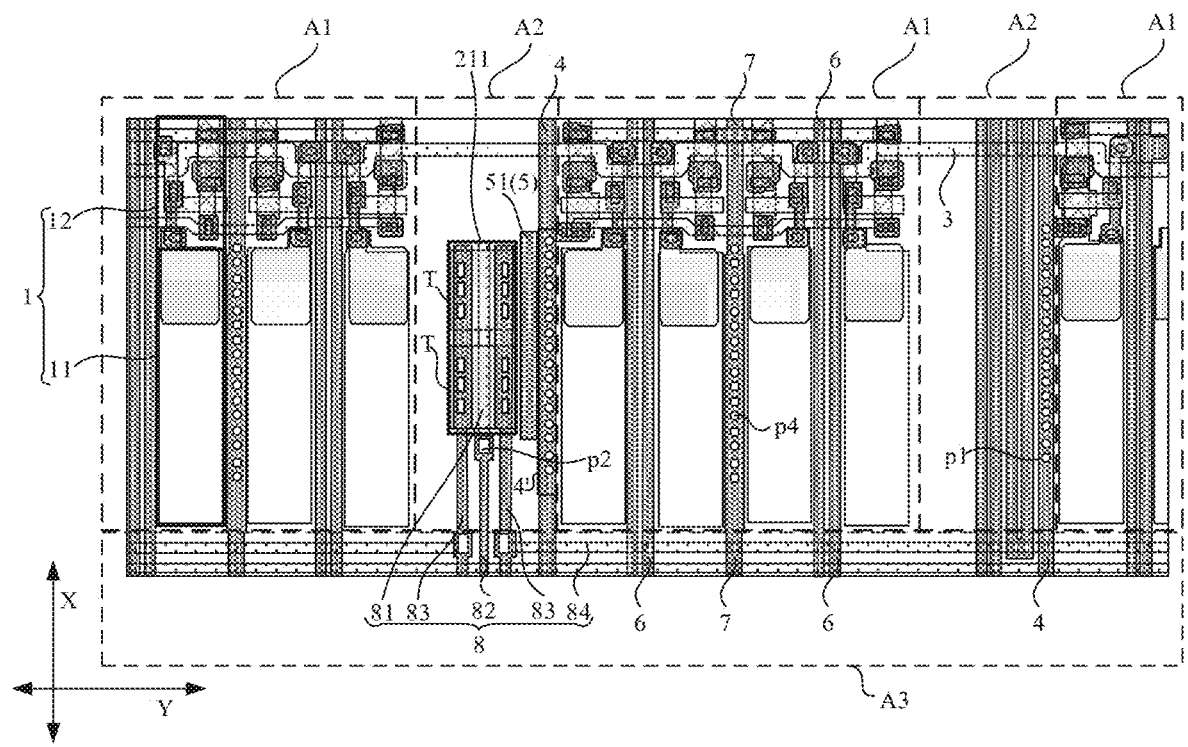
FIG. 7 is a partial structural diagram of another display panel, in accordance with some embodiments.

In some embodiments, as shown in FIG. 7, the light-shielding portion 5 includes a first sub-light-shielding portion 51 located between the transistor group 211 and the power supply signal line 4. The first sub-light-shielding portion 51 is electrically connected to the power supply signal line 4.

The first sub-light-shielding portion 51 and the power supply signal line 4 are both located on a right side of the transistor group 211, so that the first sub-light-shielding portion 51 is able to at least block light from the pixel light-emitting sub-area A11 located on the right side of the transistor group 211, so that an influence of light on the active layer t1 of the transistor T in the transistor group 211 is reduced, and the normal operation of the transistor T is ensured.

For example, the first sub-light-shielding portion 51 extends in the first direction X, and is arranged in parallel with the power supply signal line 4. A side of the first sub-light-shielding portion 51 and a side of the power supply signal line 4 that are proximate to each other are connected to each other.

Figure 9:
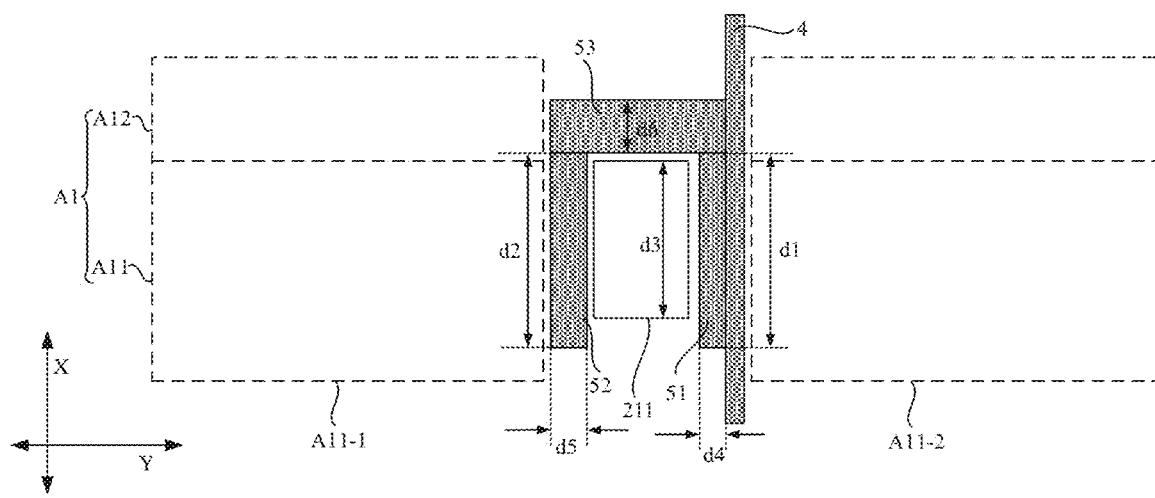
FIG. 9 is a simplified partial structural diagram of the display panel shown in FIG. 8.

In some embodiments, as shown in FIG. 9, two pixel light-emitting sub-areas A11 that are located on two sides of the transistor group 211 and adjacent to the transistor group 211 are a first pixel light-emitting sub-area A11-1 and a second pixel light-emitting sub-area A11-2, respectively. The first sub-light-shielding portion 51 and the power supply signal line 4 are located on a side of the transistor group 211 proximate to the second pixel light-emitting sub-area A11-2. That is, the first sub-light-shielding portion 21 and the power supply signal line 4 are located on the right side of the transistor group 211.

Figure 8:
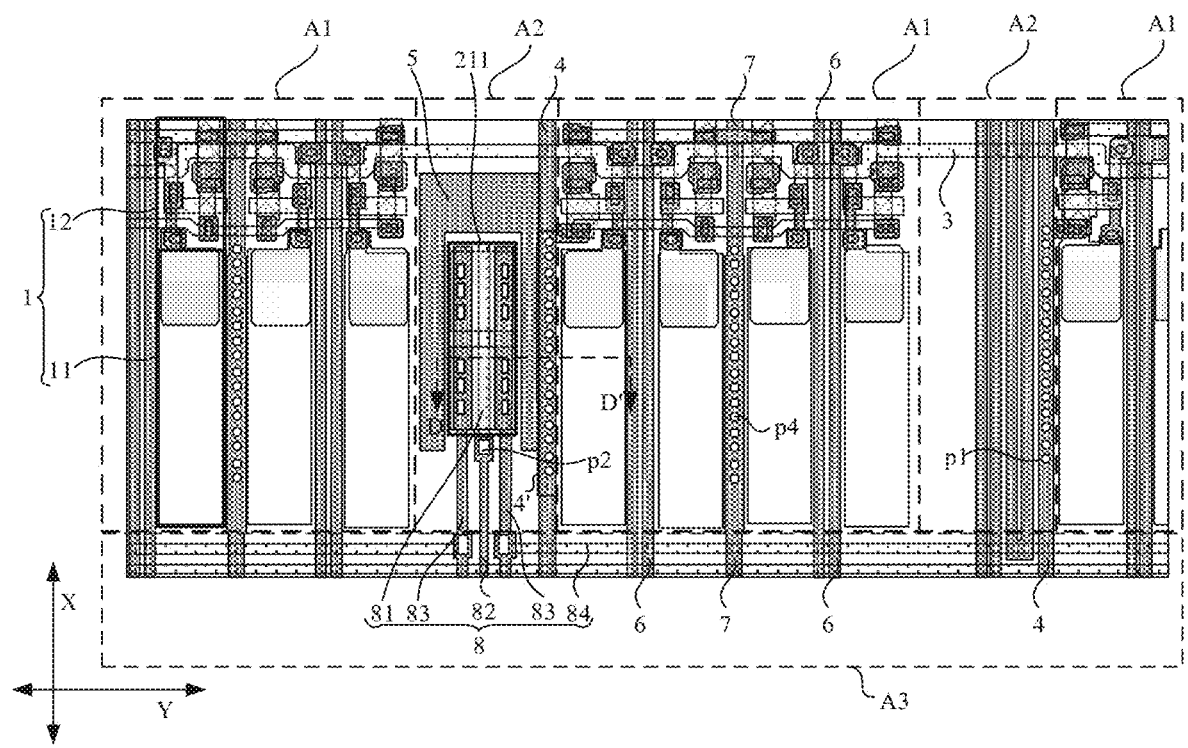
FIG. 8 is a partial structural diagram of yet another display panel, in accordance with some embodiments.

As shown in FIGS. 8 and 9, the light-shielding portion 5 further includes a second sub-light-shielding portion 52 located between the transistor group 211 and the first pixel light-emitting sub-area A11-1, and the second sub-light-shielding portion 52 is electrically connected to the first sub-light-shielding portion 51.

The second sub-light-shielding portion 52 is provided on a left side of the transistor group 211. That is, the first sub-light-shielding portion 51 and the second sub-light-shielding portion 52 are respectively located on two opposite sides of the transistor group 211, so that the first sub-light-shielding portion 51 and the second sub-light-shielding portion 52 are able to block light from the first pixel light-emitting sub-area A11-1 and the second pixel light-emitting sub-area A11-2. Thus, the influence of the light on the active layer t1 of the transistor T in the transistor group 211 is further reduced, and the normal operation of the transistor T is further ensured.

In some embodiments, as shown in FIG. 9, the first sub-light-shielding portion 51 extends in the first direction X, and/or the second sub-light-shielding portion 52 extends in the first direction X. A dimension of the first sub-light-shielding portion 51 in the first direction X is greater than or equal to a dimension of the transistor group 211 in the first direction X, and/or a dimension of the second sub-light-shielding portion 52 in the first direction X is greater than or equal to the dimension of the transistor group 211 in the first direction X.

For example, as shown in FIG. 9, the first sub-light-shielding portion 51 extends in the first direction X, and the dimension d1 of the first sub-light-shielding portion 51 in the first direction X is greater than or equal to the dimension d3 of the transistor group 211 in the first direction X. In this way, the first sub-light-shielding portion 51 is able to shield the transistor group 211a.

For example, as shown in FIG. 9, the second sub-light-shielding portion 52 extends in the first direction X, and the dimension d2 of the second sub-light-shielding portion 52 in the first direction X is greater than or equal to the dimension d3 of the transistor group 211 in the first direction X.

Alternatively, as shown in FIG. 9, the first sub-light-shielding portion 51 and the second sub-light-shielding portion 52 extend in the first direction X. The dimension d1 of the first sub-light-shielding portion 51 in the first direction X and the dimension d2 of the second sub-light-shielding portion 52 in the first direction X are each greater than or equal to the dimension d3 of the transistor group 211 in the first direction X.

In this way, the first sub-light-shielding portion 51 and the second sub-light-shielding portion 52 are able to shield the transistor group 211 as much as possible, so that the transistor group 211 is hardly irradiated by light, thereby ensuring the protection effect of the active layer in the transistor group 211.

In some embodiments, as shown in FIG. 9, a dimension d4 of the first sub-light-shielding portion 51 in the second direction Y is less than a dimension d5 of the second sub-light-shielding portion in the second direction Y.

Since the power supply signal line 4 is usually made of an opaque metal material, and the power supply signal line 4 is provided between the transistor group 211 and the pixel light-emitting sub-area A11, the power supply signal line 4 is also able to have a certain light-shielding effect. The first sub-light-shielding portion 51 is close to the power supply signal line 4, and is electrically connected to the power supply signal line 4, so that the dimension d4 of the first sub-light-shielding portion 51 in the second direction Y may be designed to be small, and the light-shielding effect on the transistor group 211 is able to be ensured as well.

In some embodiments, as shown in FIGS. 8 and 9, the light-shielding portion 5 further includes a third sub-light-shielding portion 53 disposed on a side of the transistor group 211 proximate to the pixel circuit sub-area A12. Two ends of the third sub-light-shielding portion 53 are electrically connected to the first sub-light-shielding portion 51 and the second sub-light-shielding portion 52, respectively.

The light-shielding portion 5 includes the first sub-light-shielding portion 51, the second sub-light-shielding portion 52 and the third sub-light-shielding portion 53. The first sub-light-shielding portion 51 and the second sub-light-shielding portion 52 are electrically connected through the third sub-light-shielding portion 53, so as to form a whole. The entire light-shielding portion 5 is U-shaped, and is arranged around the transistor group 211, so that the light-shielding portion 5 is able to electrostatically shield the transistor group 211 to avoid the noise interference.

As described above, the gate driving circuit area A2 between two adjacent pixel areas A1 includes the area between the pixel light-emitting sub-areas A11 of the two adjacent pixel areas A1 and the area between the pixel circuit sub-areas A12 of the two adjacent pixel areas A1. The first sub-light-shielding portion 51 and the second sub-light-shielding portion 52 of the light-shielding portion 5 are located in the area between the pixel light-emitting sub-areas A11 of the two adjacent pixel areas A1. The third sub-light-shielding portion 53 is located in the area between the pixel circuit sub-areas A12 of the two adjacent pixel areas A1. Since less structures are provided in the area between the pixel circuit sub-areas A12 of the two adjacent pixel areas A1, for example, only the signal line (e.g., the gate line) is provided therein, there is a large space for providing the third sub-light-shielding portion 53, and an area of the third sub-light-shielding portion 53 may be set large to reduce the resistance.

In some examples, as shown in FIG. 9, a dimension d6 of the third sub-light-shielding portion 53 in the first direction X is greater than the dimension d4 of the first sub-light-shielding portion 51 in the second direction Y. Similarly, the dimension d6 of the third sub-light-shielding portion 53 in the first direction X is greater than the dimension d5 of the second sub-light-shielding portion 52 in the second direction Y. In this way, the light-shielding portion 5 has a large area to reduce the resistance, so that the voltage drop of the power supply signal during transmission on the power supply signal line 4 and the light-shielding portion 5 is able to be reduced, so as to reduce the signal loss.

In some embodiments, as shown in FIGS. 2, 4A, 6 and 7, the display panel 100 further includes a plurality of data lines 6 and a plurality of sensing lines 7. The plurality of data lines 6 and the plurality of sensing lines 7 extend in the first direction X. Each data line 6 is electrically connected to each sub-pixel 1 in sub-pixels 1 in a column, and is configured to transmit the data signal to the sub-pixel. Each sensing line 7 is electrically connected to each sub-pixel 1 in pixel areas A1 in a column, and is configured to transmit the sensing signal to each sub-pixel 1 to externally compensate the sub-pixel 1.

In some examples, as shown in FIGS. 2, 4A, 6 and 7, the plurality of data lines 6 and the plurality of sensing lines 7 extend in the first direction X, and pass through the plurality of pixel areas A1. The pixel area A1 is provided with the pixel unit 1a therein. For example, the pixel unit 1a includes four sub-pixels 1 sequentially arranged in the second direction Y. The four sub-pixels 1 are sequentially a first sub-pixel, a second sub-pixel, a third sub-pixel and a fourth sub-pixel. Below, considering the pixel area A1 as an example, positions of data lines 6 and a sensing line 7 in this pixel area A1 will introduced, and positions of the structures in each of pixel areas A1 in a same column are same.

The pixel unit 1a corresponds to four data lines 6, and two data lines 6 respectively electrically connected to the first sub-pixel and the second sub-pixel are provided between the first sub-pixel and the second sub-pixel. Two data lines 6 respectively electrically connected to the third sub-pixel and the fourth sub-pixel are provided between the third sub-pixel and the fourth sub-pixel. Referring to FIG. 3A, the data line 6 is electrically connected to a pixel circuit 12 in a corresponding sub-pixel 1 through the data signal terminal Data, so as to transmit the data signal to this pixel circuit 12.

The sensing line 7 corresponding to the pixel unit 1a is provided between the second sub-pixel and the third sub-pixel. The sensing line 7 is electrically connected to the first sub-pixel, the second sub-pixel, the third sub-pixel and the fourth sub-pixel. Referring to FIG. 3A, the sensing line 7 is electrically connected to a pixel circuit 12 in a corresponding sub-pixel 1 through the sensing signal terminal Sense, so as to transmit the sensing signal to this pixel circuit 12.

A film layer structure of the display panel 100 and a position of the light-shielding portion 5 in the display panel 100 will be introduced below from side views.

Figure 10:
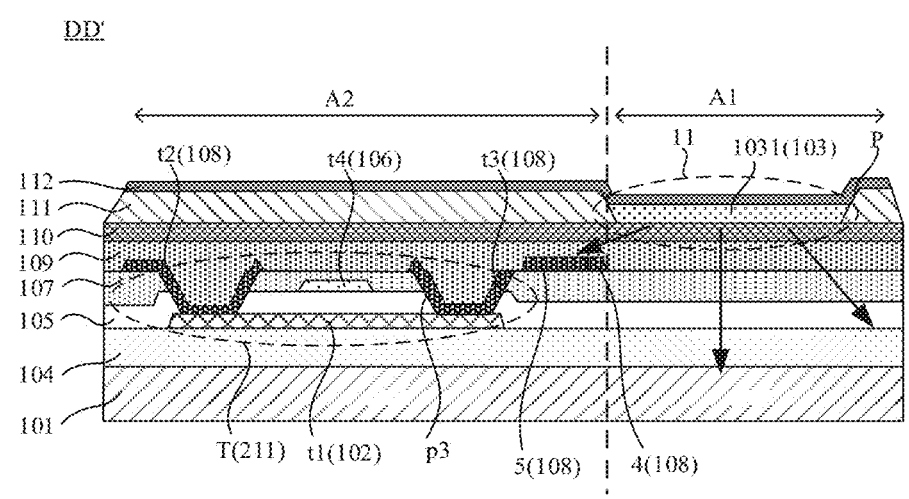
FIG. 10 is a sectional view taken along the section line DD' in FIG. 8.
Figure 13:
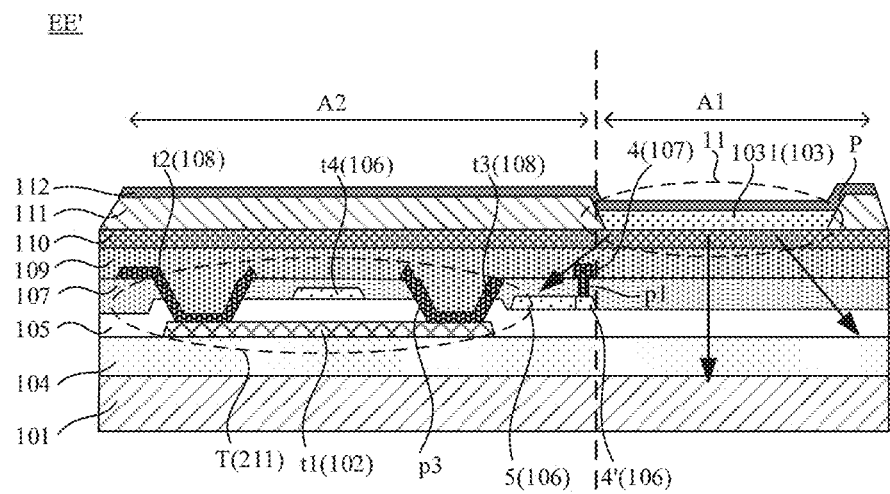
FIG. 13 is a sectional view taken along the section line EE' in FIG. 12.

In some embodiments, as shown in FIGS. 10 and 13, the display panel 100 includes a substrate 101, a semiconductor layer 102 disposed on a side of the substrate 101, and a light-emitting layer disposed on a side of the semiconductor layer 102 away from the substrate 101. The semiconductor layer 102 includes active layers t1 of transistors T in the plurality of transistor groups 211. The semiconductor layer 102 further includes active layers of transistors in pixel circuits 12 included in the plurality of sub-pixels 1.

For example, the substrate 101 may be a rigid substrate. The rigid substrate may be, for example, a glass substrate or a polymethyl methacrylate (PMMA) substrate.

For example, the substrate 101 may be a flexible substrate. The flexible substrate may be, for example, a polyethylene terephthalate (PET) substrate, a polyethylene naphthalate two formic acid glycol ester (PEN) substrate or a polyimide (PI) substrate. In this case, the display panel 100 may be a flexible display panel.

A film layer where the plurality of light-shielding portions 5 are located is located between the semiconductor layer 102 and the light-emitting layer 103 in a direction perpendicular to the substrate 101.

Light emitted from the light-emitting layer 103 includes light directed vertically toward the substrate 101 and light directed laterally toward the transistor group 211 (i.e., light directed toward the semiconductor layer 102). The film layer where the plurality of light-shielding portions 5 are located is located between the semiconductor layer 102 and the light-emitting layer 103, and the light-shielding portion 5 is located on the periphery of the transistor group 211, so that the light emitted from the light-emitting layer 103 is able to be shielded by the plurality of light-shielding portions 5, so as to prevent the light from reaching the active layers t1 of the transistors T in the plurality of transistor groups 211 in the semiconductor layer 102.

In some embodiments, as shown in FIGS. 10 and 13, the display panel 100 further includes a buffer layer 104, a gate insulating layer 105, a gate metal layer 106, an interlayer insulating layer 107, a source-drain metal layer 108, a planarization layer 109, an anode layer 110, a pixel defining layer 111 and a cathode layer 112. The gate metal layer 106 and the source-drain metal layer 108 are provided between the semiconductor layer 102 and the light-emitting layer 103, and the source-drain metal layer 108 is away from the substrate 101 relative to the gate metal layer 106.

The buffer layer 104 is provided between the substrate 101 and the semiconductor layer 102, and the semiconductor layer 102 is provided on a side of the buffer layer 104 away from the substrate 101. The semiconductor layer 102 has a plurality of patterns, and the plurality of patterns serve as the active layers t1 of the transistors T in the plurality of transistor groups 211 and the active layers of the transistors in the pixel circuits 12 included in the plurality of sub-pixels 1.

The gate insulating layer 105 is provided on the side of the semiconductor layer 102 away from the substrate 101. In an area of the buffer layer 104 on which the patterns of the semiconductor layer 102 are not provided, the gate insulating layer 105 is in contact with the buffer layer 104.

The gate metal layer 106 is provided on a side of the gate insulating layer 105 away from the substrate 101. For example, the plurality of gate lines 3, gates t4 of the transistors T in the plurality of transistor groups 211 and gates of the transistors in the plurality of pixel circuits 12 are provided in the gate metal layer 106.

In some embodiments, the plurality of first connection lines 81 and the plurality of fourth connection lines 84 are provided in the gate metal layer 106. An end of each second connection line 82 is electrically connected to a first connection line 81 through a second via hole p2, and another end of the second connection line 82 is connected to another transistor group 211 through the fourth connection line 84.

The interlayer insulating layer 107 is provided on a side of the gate metal layer 106 away from the substrate 101.

The source-drain metal layer 108 is provided on a side of the interlayer insulating layer 107 away from the substrate 101. The plurality of power supply signal lines 4, sources t2 and drains t3 of the transistors T in the plurality of transistor groups 211, and sources and drains of the transistors in the plurality of pixel circuits 12 are provided in the source-drain metal layer 108.

In some embodiments, the plurality of second connection lines 82, the plurality of third connection lines 83, the plurality of data lines 6 and the plurality of sensing lines 7 are provided in the source-drain metal layer 108.

As shown in FIGS. 10 and 13, the display panel 100 further includes a plurality of third via holes p3 penetrating through the gate insulating layer 105 and the interlayer insulating layer 107. The source t2 and the drain t3 of each transistor T are electrically connected to the active layer t1 of the transistor T through respective third via holes p3.

The planarization layer 109 is provided on a side of the source-drain metal layer 108 away from the substrate 101, and is configured to cover the structures included in the source-drain metal layer 108 and have an insulating function.

The anode layer 110 is provided on a side of the planarization layer 109 away from the substrate 101. For example, the anode layer 110 is made of indium tin oxide (ITO). The anode layer 110 includes a plurality of anode patterns, and each anode pattern is electrically connected to a transistor in a pixel circuit 12.

The pixel defining layer 111 is provided on a side of the anode layer 110 away from the substrate 101. The pixel defining layer 111 has a plurality of openings P, and the plurality of openings P are located in the pixel light-emitting sub-areas A11. The plurality of openings P define a position of the light-emitting layer 103.

The light-emitting layer 103 includes a plurality of light-emitting patterns 1031, and each light-emitting pattern 1031 is located in an opening P. Each light-emitting pattern 1031 is electrically connected to an anode pattern corresponding thereto.

The cathode layer 112 is provided on a side of the light-emitting layer 103 away from the substrate 101. The cathode layer 112 includes a portion located in the plurality of openings P and a portion located outside the plurality of openings P. The portion of the cathode layer 112 located in the plurality of openings P is in contact with the light-emitting layer 103, and the portion of the cathode layer 112 located outside the plurality of openings P is in contact with the pixel defining layer.

In a sub-pixel 1, each light-emitting device 11 includes an anode pattern, a light-emitting pattern 1031 and a portion of the cathode layer 112 corresponding to an opening P that stacked.

As a possible design, the light-shielding portion 5 may be provided in the gate metal layer 106 or the source-drain metal layer 108.

In some embodiments, as shown in FIGS. 7 to 10, the plurality of light-shielding portions 5 are provided in the source-drain metal layer 108.

The plurality of light-shielding portions 5, the plurality of power supply signal lines 4, and the sources t2 and the drains t3 of the transistors T in the transistor groups 211 are all located in the same layer. In this way, in a manufacturing process of the display panel 100, a film layer may be formed by using a same film forming process, and then is patterned by one patterning process using a same mask to form the plurality of power supply signal lines 4, the sources t2 and the drains t3 of the transistors T in the transistor groups 211, and the plurality of light-shielding portions 5, so that the process is simplified, and a manufacturing difficulty of the display panel 100 is reduced.

The plurality of light-shielding portions 5 disposed in the source-drain metal layer 108 will be introduced below.

In some examples, as shown in FIGS. 7 to 10, the first sub-light-shielding portion 51 of the light-shielding portion 5 is spaced apart from the source t2 and the drain t3 of the transistor T proximate to the first sub-light-shielding portion 51. In a case where the light-shielding portion 5 further includes the second sub-light-shielding portion 52, the second sub-light-shielding portion 52 is spaced apart from the source t2 and the drain t3 of the transistor T proximate to the second sub-light-shielding portion 52. In a case where the light-shielding portion 5 further includes the third sub-light-shielding portion 53, the third sub-light-shielding portion 53 is spaced apart from the source t2 and the drain t3 of the transistor T proximate to the third sub-light-shielding portion 53.

In this way, the first sub-light-shielding portion 51, the second sub-light-shielding portion 52 and the third sub-light-shielding portion 53 of the light-shielding portion 5 are each spaced apart from the source t2 and the drain t3 of the transistor T proximate to the light-shielding portion 5, so that the light-shielding portion 5 is not in contact with the source t2 and the drain t3 of the transistor T. Thus, signals transmitted by the light-shielding portion 5 and the transistor T are prevented from affecting each other, so as to avoid affecting the normal operation of the transistor T.

In some embodiments, as shown in FIGS. 7 and 8, the plurality of first connection lines 81 and the plurality of fourth connection lines 84 are provided in the gate metal layer 106, and the plurality of second connection lines 82 and the plurality of third connection lines 83 are provided in the source-drain metal layer 108. The end of each second connection line 82 is electrically connected to the first connection line 81 through the second via hole p2, and the another end of the second connection line 82 is connected to another transistor group 211. For example, the another end of each second connection line 82 is electrically connected to a fourth connection line 84 through a via hole to be connected to another transistor group 211. An end of each third connection line 83 is electrically connected to sources or drains of transistors in a same transistor group, and another end of the third connection line 83 is electrically connected to a fourth connection line 84. For example, each third connection line 83 is electrically connected to the fourth connection line 84 through a via hole.

The plurality of light-shielding portions 5, the plurality of second connection lines 82 and the plurality of third connection lines 83 are provided in the source-drain metal layer 108. In the gate driving circuit area A2, a positional relationship of the light-shielding portion 5, the first connection line 81, the second connection line 82 and the third connection lines 83 is that an orthographic projection of a portion of the first connection line 81, the second connection line 82 and the third connection lines 83 located in the gate driving circuit area A2 on the substrate 101 does not intersect with an orthographic projection of the light-shielding portion 5 on the substrate 101. The plurality of light-shielding portions 5 are not in contact with the second connection lines 82 and the plurality of third connection lines 83.

In some embodiments, the first sub-light-shielding portion 51 of the light-shielding portion 5 and the power supply signal line 4 adjacent to the first sub-light-shielding portion 51 are of an integrative structure. The first sub-light-shielding portion 51 of the light-shielding portion 5 and the power supply signal line 4 adjacent to the first sub-light-shielding portion 51 are of the integrative structure, which will be understood that the first sub-light-shielding portion 51 of the light-shielding portion 5 may serve as a portion of the power supply signal line 4, or the power supply signal line 4 may serve as a portion of the first sub-light-shielding portion 51 of the light-shielding portion 5.

In some other embodiments, the first sub-light-shielding portion 51, the second sub-light-shielding portion 52 and the third sub-light-shielding portion 53 of the light-shielding portion 5, and the power supply signal line 4 adjacent to the light-shielding portion 5 are of an integrative structure. That is, the first sub-light-shielding portion 51, the second sub-light-shielding portion 52 and the third sub-light-shielding portion 53 of the light-shielding portion 5 may each serve as a portion of the power supply signal line 4. Equivalently, the power supply signal line 4 extends in the gate driving circuit area A2 to form a partial structure.

In some embodiments, as shown in FIGS. 11 to 16, the plurality of light-shielding portions 5 are provided in the gate metal layer 106.

For example, the plurality of light-shielding portions 5 and structures such as the plurality of gate lines 3, the gates t4 of the transistors T in the transistor groups 211 and the plurality of second connection lines 82 are located in the same layer. In this way, in the manufacturing process of the display panel 100, a film layer may be formed by using a same film forming process, and then is patterned by one patterning process using a same mask to form the plurality of gate lines 3, the gates t4 of the transistors T in the transistor groups 211 and the plurality of light-shielding portions 5, so that the process is simplified, and the manufacturing difficulty of the display panel 100 is reduced.

The plurality of light-shielding portions 5 disposed in the gate metal layer 106 will be described below.

Figure 11:
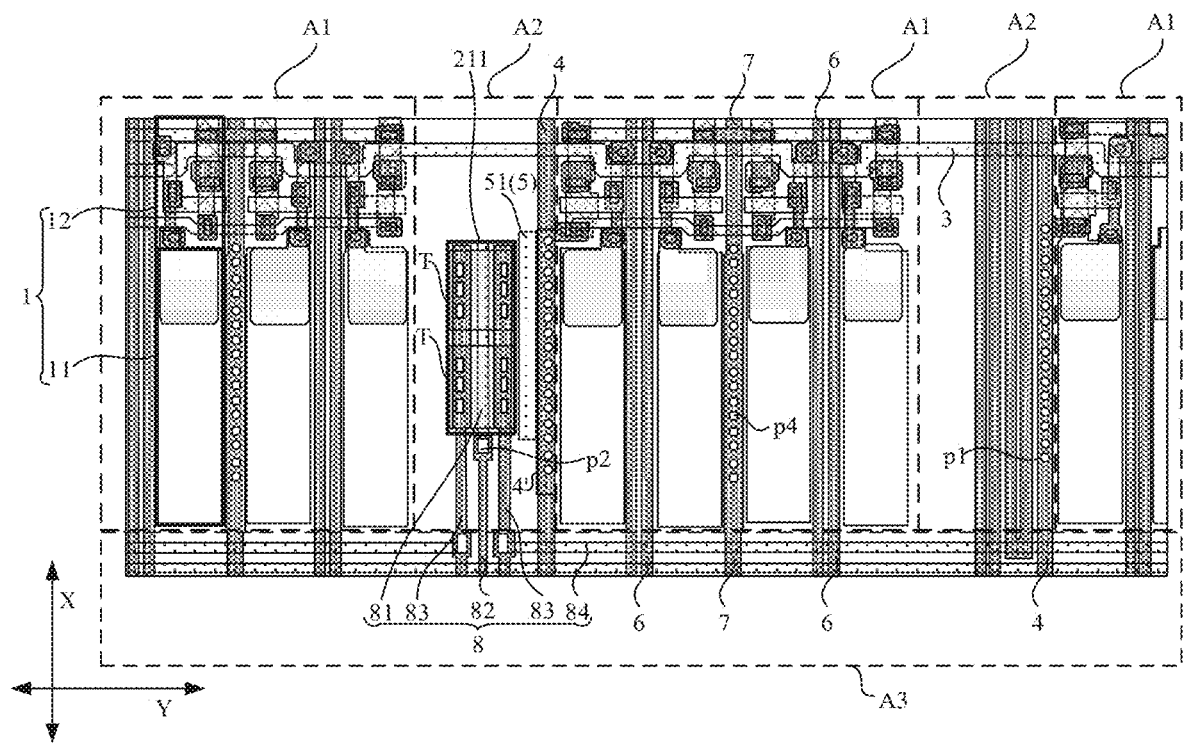
FIG. 11 is a partial structural diagram of yet another display panel, in accordance with some embodiments.

In some examples, as shown in FIG. 11, the light-shielding portion 5 includes the first sub-light-shielding portion 51 disposed between the transistor group 211 and the power supply signal line 4. The first sub-light-shielding portion 51 is electrically connected to the power supply signal line 4.

Figure 12:
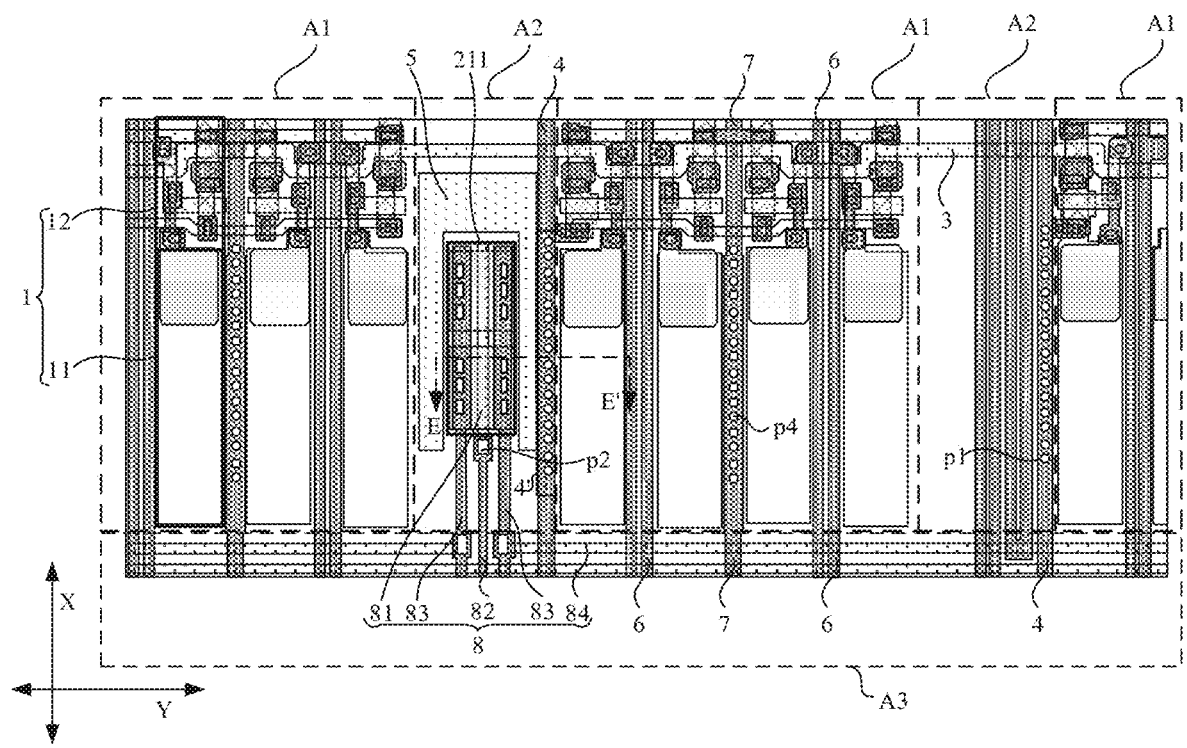
FIG. 12 is a partial structural diagram of yet another display panel, in accordance with some embodiments.

In some examples, as shown in FIG. 12, the light-shielding portion 5 includes the first sub-light-shielding portion 51, the second sub-light-shielding portion 52 and the third sub-light-shielding portion 53. The third sub-light-shielding portion 53 is provided on the side of the transistor group 211 proximate to the pixel circuit sub-area A12.

Figure 14:
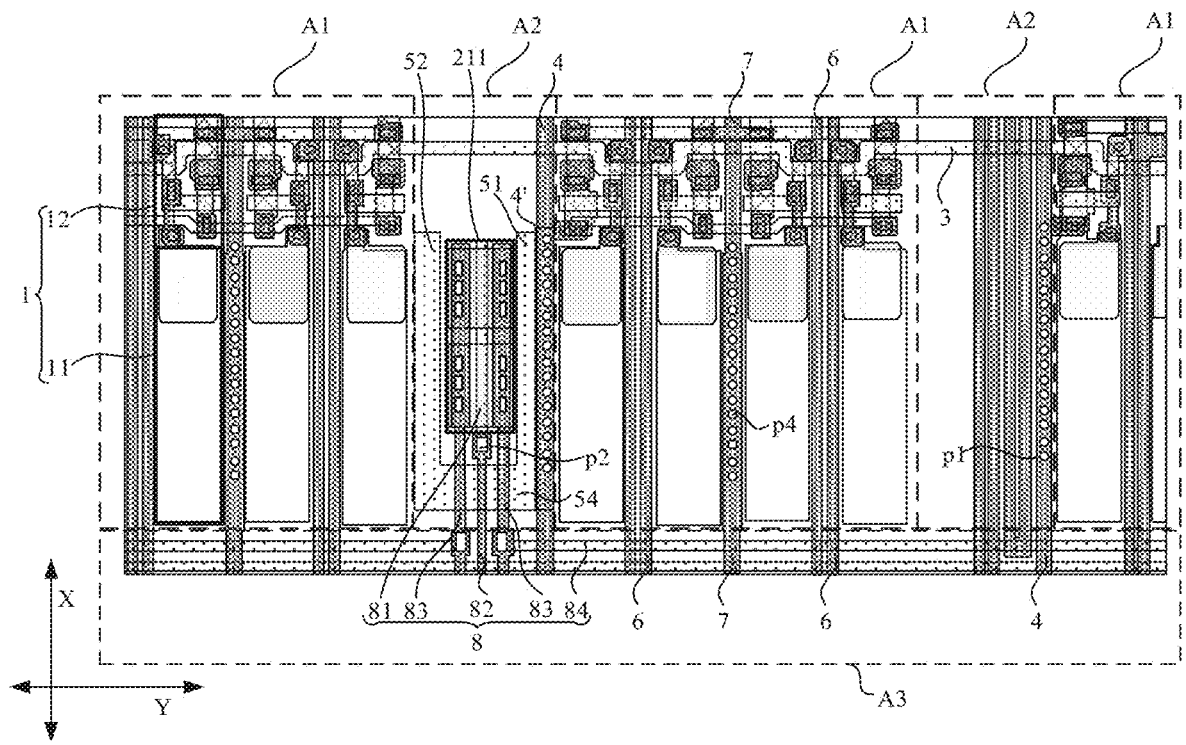
FIG. 14 is a partial structural diagram of yet another display panel, in accordance with some embodiments.

In some other examples, as shown in FIG. 14, the light-shielding portion 5 includes the first sub-light-shielding portion 51, the second sub-light-shielding portion 52 and a fourth sub-light-shielding portion 54. The fourth sub-light-shielding portion 54 is provided on a side of the transistor group 211 away from the pixel circuit sub-area A12. Two ends of the fourth sub-light-shielding portion 54 are electrically connected to the first sub-light-shielding portion 51 and the second sub-light-shielding portion 52, respectively.

The first sub-light-shielding portion 51 and the second sub-light-shielding portion 52 are electrically connected through the fourth sub-light-shielding portion 54. Since the light-shielding portions 5 are provided in the gate metal layer 106, and the plurality of second connection lines 82 and the plurality of third connection lines 83 are provided in the source-drain metal layer 108, the fourth sub-light-shielding portion 54 is able to be provided on the side of the transistor group 211 away from the pixel circuit sub-area A12. Orthographic projections of the second connection line 82 and the third connection line 83 electrically connected to the transistor group 211 on the substrate 101 intersect with an orthographic projection of the fourth sub-light-shielding portion 54 on the substrate 101. The second connection line 82 and the third connection line 83 are located in different film layers from the fourth sub-light-shielding portion 54. That is, the connection line 8 and the light-shielding portion 5 are not in contact with each other, and are not influenced by each other.

Moreover, as shown in FIG. 14, in the same gate driving circuit area A2, the fourth sub-light-shielding portion 54 is located on a side of the second via hole p2 for electrically connecting the second connection line 82 to the first connection line 81 away from the transistor group 211.

In this way, the fourth sub-light-shielding portion 54 of the light-shielding portion 5 is prevented from being in contact with the first connection line 81 and the second via hole p2, so that the fourth sub-light-shielding portion 54 and the first connection line 81 are not influenced by each other, and are able to transmit signals stably.

As shown in FIG. 14, the first sub-light-shielding portion 51, the second sub-light-shielding portion 52 and the fourth sub-light-shielding portion 54 form a whole. The entire light-shielding portion 5 is U-shaped, and is arranged around the transistor group 211, so that the light-shielding portion 5 is able to electrostatically shield the transistor group 211 to avoid the noise interference.

Figure 15:
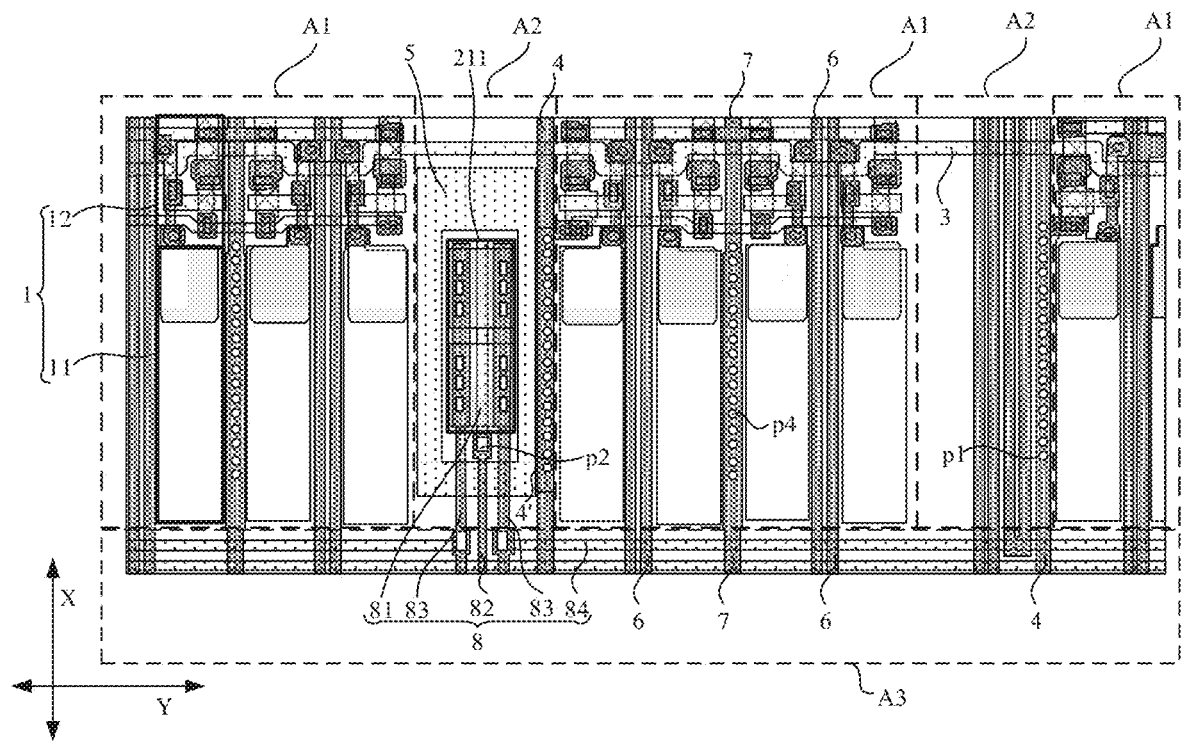
FIG. 15 is a partial structural diagram of yet another display panel, in accordance with some embodiments.
Figure 16:
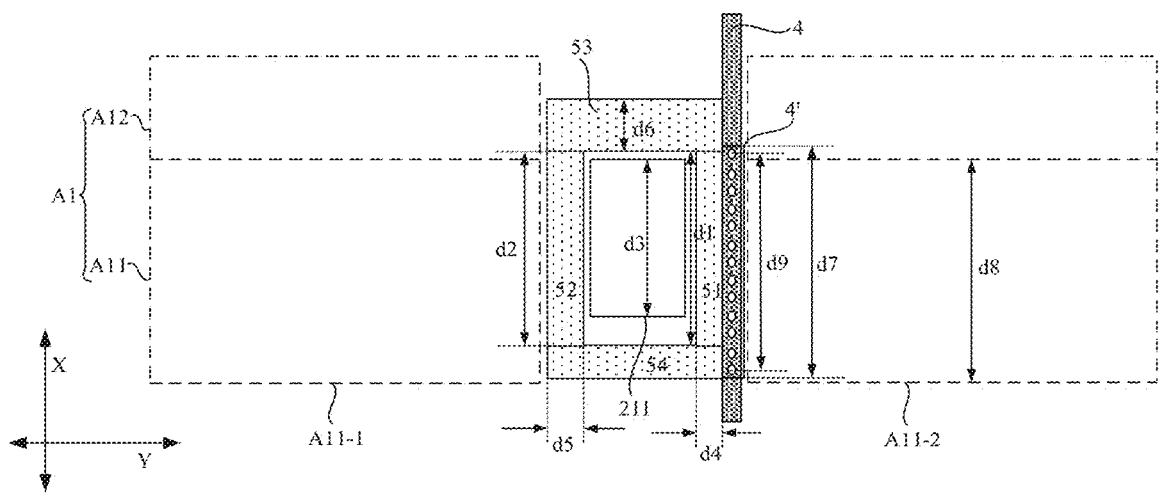
FIG. 16 is a simplified partial structural diagram of the display panel shown in FIG. 15.

In yet other examples, as shown in FIGS. 15 and 16, the light-shielding portion 5 includes the first sub-light-shielding portion 51, the second sub-light-shielding portion 52, the third sub-light-shielding portion 53 and the fourth sub-light-shielding portion 54. The third sub-light-shielding portion 53 and the fourth sub-light-shielding portion 54 are provided on two sides of the transistor group 211 in the first direction X, respectively. The first sub-light-shielding portion 51, the second sub-light-shielding portion 52, the third sub-light-shielding portion 53 and the fourth sub-light-shielding portion 54 are connected to be frame-shaped.

Thus, the light-shielding portion 5 is able to be arranged completely around the transistor group 211, so that the light-shielding portion 5 is able to electrostatically shield the transistor group 211 better to further avoid the noise interference.

In some embodiments, as shown in FIGS. 4A, 4B and 11 to 15, the display panel 100 further includes a plurality of auxiliary power supply signal lines 4' disposed in the gate metal layer 106.

The power supply signal line 4 corresponds to at least one auxiliary power supply signal line 4'. Orthographic projections of the power supply signal line 4 and the auxiliary power supply signal line 4' corresponding to each other on a plane where the display panel 100 is located are at least partially overlapped with each other. Moreover, the power supply signal line 4 and the auxiliary power supply signal line 4' corresponding to each other are electrically connected through at least one first via hole p1.

The plurality of auxiliary power supply signal lines 4' are provided, so that the power supply signal line 4 corresponds to, and is electrically connected to the at least one auxiliary power supply signal line 4'. Equivalently, the power supply signal line 4 is connected in parallel with the at least one auxiliary power supply signal line 4', so that a resistance of a whole structure composed of the power supply signal line 4 and the at least one auxiliary power supply signal line 4' is reduced, which is beneficial to reducing the voltage drop of the power supply signal during transmission, so as to reduce the signal loss.

For example, as shown in FIGS. 4A, 4B and 11 to 15, a position of each power supply signal line 4 corresponding to the pixel light-emitting sub-area A11 of each pixel area A1 is provided with an auxiliary power supply signal line 4'. The power supply signal line 4 corresponds to auxiliary power supply signal lines 4', and the number of the auxiliary power supply signal lines 4' is equal to the number of rows N of the sub-pixels 1 included in the display panel 100. The power supply signal line 4 is provided in the source-drain metal layer 108, and the auxiliary power supply signal lines 4' corresponding to the power supply signal line 4 are provided in the gate metal layer 106. Moreover, the orthographic projections of the power supply signal line 4 and the auxiliary power supply signal line 4' on the plane where the display panel 100 is located are at least partially overlapped with each other, and the power supply signal line 4 and the auxiliary power supply signal line 4' are electrically connected through the at least one first via hole p1. Equivalently, the power supply signal line 4 is connected in parallel with the auxiliary power supply signal lines 4', so that the resistance is reduced, which is beneficial to transmitting the power supply signal.

In some examples, as shown in FIG. 13, the light-shielding portions 5 and the auxiliary power supply signal lines 4' are provided in the gate metal layer 106. Each light-shielding portion 5 is electrically connected to a corresponding power supply signal line 4 through an auxiliary power supply signal line 4'.

In some embodiments, the first sub-light-shielding portion 51 of the light-shielding portion 5 and the auxiliary power supply signal line 4' are of an integrative structure.

The first sub-light-shielding portion 51 of the light-shielding portion 5 and the auxiliary power supply signal line 4' are of the integrative structure, which will be understood that the first sub-light-shielding portion 51 of the light-shielding portion 5 serves a portion of the auxiliary power supply signal line 4', or the auxiliary power supply signal line 4' serves a portion of the first sub-light-shielding portion 51 of the light-shielding portion 5. The light-shielding portion 5 and the auxiliary power supply signal line 4' may be manufactured by using a same patterning process, thereby simplifying the manufacturing process.

In some embodiments, as shown in FIG. 16, the power supply signal line 4 is electrically connected to auxiliary power supply signal lines 4'. The auxiliary power supply signal line 4' is provided at the position of each power supply signal line 4 corresponding to the pixel light-emitting sub-area A11 of each pixel area A1. A dimension d7 of each auxiliary power supply signal line 4' in the first direction X is substantially equal to a dimension d8 of the pixel light-emitting sub-area A11 in the first direction X.

Each auxiliary power supply signal line 4' is electrically connected to a corresponding power supply signal line 4 through a plurality of first via holes p1, and the plurality of first via holes p1 are arranged in the first direction X. A distance d9 between two farthest first via holes p1 is slightly less than the dimension d7 of the auxiliary power supply signal line 4' in the first direction X.

For example, the plurality of the first via holes p1 are arranged at equal intervals in the first direction X. Each auxiliary power supply signal line 4' is able to be better electrically connected to the corresponding power supply signal line 4 through the plurality of the first via holes p1, thereby further reducing the resistance, which is beneficial to transmitting the power supply signal.

In some embodiments, as shown in FIGS. 4A, 4B and 11 to 15, the plurality of sensing lines 7 also have a double-layer structure. That is, the display panel further includes a plurality of auxiliary sensing lines disposed in the gate metal layer. The sensing line 7 corresponds to at least one auxiliary sensing line. Orthographic projections of the sensing line 7 and the auxiliary sensing line corresponding to each other on the plane where the display panel 100 is located are at least partially overlapped with each other. Moreover, the sensing line 7 and the auxiliary sensing line corresponding to each other are electrically connected through at least one fourth via hole p4.

The plurality of auxiliary sensing lines are provide, so that the sensing line 7 corresponds to, and is electrically connected to the at least one auxiliary sensing line. Equivalently, the sensing line 7 is connected in parallel with the at least one auxiliary sensing line, so that a resistance of a whole structure composed of the sensing line 7 and the at least one auxiliary sensing line is reduced, which is beneficial to reducing a voltage drop of the sensing signal during transmission, so as to reduce a signal loss and improve a compensation precision.

A specific arrangement of the auxiliary sensing lines may be referred to the description of the auxiliary power supply signal lines 4', and will not be repeated here.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a display area, wherein the display area includes a plurality of pixel areas arranged in an array and a plurality of gate driving circuit areas; each pixel area includes a pixel light-emitting sub-area and a pixel circuit sub-area arranged in a first direction; pixel areas in each row correspond to at least two gate driving circuit areas each located between two adjacent pixel areas in this row, wherein the first direction is a column direction of the plurality of pixel areas arranged in the array;

the display panel comprises:
 a plurality of sub-pixels, wherein each pixel area is provided with at least two sub-pixels therein;
 a gate driving circuit including a plurality of shift registers that are cascaded, wherein each shift register is electrically connected to sub-pixels in a row, and includes a plurality of transistor groups that are respectively disposed in at least two gate driving circuit areas corresponding to pixel areas in this row, and each transistor group is located between pixel light-emitting sub-areas of two adjacent pixel areas, and includes at least one transistor;
 a plurality of power supply signal lines, wherein each power supply signal line is disposed on a side of a column of pixel areas in a second direction; and in a gate driving circuit area in which a transistor group is disposed, a power supply signal line is located between a pixel area adjacent to the gate driving circuit area and the transistor group; wherein the second direction is a row direction of the plurality of pixel areas arranged in the array; and
 a plurality of light-shielding portions, wherein each light-shielding portion is located in a gate driving circuit area in which a transistor group is disposed; the light-shielding portion is disposed on a periphery of the transistor group, and is electrically connected to a power supply signal line.

2. The display panel according to claim 1, wherein the light-shielding portion includes:
 a first sub-light-shielding portion located between the transistor group and the power supply signal line.

3. The display panel according to claim 2, wherein two pixel light-emitting sub-areas that are located on two sides of the transistor group and adjacent to the transistor group are a first pixel light-emitting sub-area and a second pixel light-emitting sub-area, respectively;
 the first sub-light-shielding portion and the power supply signal line are located on a side of the transistor group proximate to the second pixel light-emitting sub-area;
 the light-shielding portion further includes:
 a second sub-light-shielding portion disposed between the transistor group and the first pixel light-emitting sub-area; the second sub-light-shielding portion being electrically connected to the first sub-light-shielding portion.

4. The display panel according to claim 3, wherein the first sub-light-shielding portion extends in the first direction, and a dimension of the first sub-light-shielding portion in the first direction is greater than or equal to a dimension of the transistor group in the first direction, and/or
 the second sub-light-shielding portion extends in the first direction; and
 a dimension of the second sub-light-shielding portion in the first direction is greater than or equal to the dimension of the transistor group in the first direction.

5. The display panel according to claim 3, wherein a dimension of the first sub-light-shielding portion in the second direction is less than a dimension of the second sub-light-shielding portion in the second direction.

6. The display panel according to claim 3, wherein the light-shielding portion further includes:
 a third sub-light-shielding portion disposed on a side of the transistor group proximate to a pixel circuit sub-area of pixel areas adjacent to the transistor group, wherein two ends of the third sub-light-shielding portion are electrically connected to the first sub-light-shielding portion and the second sub-light-shielding portion, respectively.

7. The display panel according to claim 6, wherein a dimension of the third sub-light-shielding portion in the first direction is greater than a dimension of the first sub-light-shielding portion in the second direction.

8. The display panel according to claim 1, comprising:
 a substrate;
 a semiconductor layer disposed on the substrate, the semiconductor layer including active layers of transistors in the transistor groups; and
 a light-emitting layer disposed on a side of the semiconductor layer away from the substrate; wherein a film layer in which the plurality of light-shielding portions are located is located between the semiconductor layer and the light-emitting layer in a direction perpendicular to the substrate.

9. The display panel according to claim 8, further comprising:
a source-drain metal layer disposed between the semiconductor layer and the light-emitting layer; wherein
the plurality of power supply signal lines, sources and drains of the transistors in the transistor groups, and the plurality of light-shielding portions are disposed in the source-drain metal layer; wherein
a first sub-light-shielding portion of the light-shielding portion is spaced apart from a source and a drain of a transistor proximate to the first sub-light-shielding portion; the first sub-light-shielding portion is located between the transistor group and the power supply signal line; or
two pixel light-emitting sub-areas that are located on two sides of the transistor group and adjacent to the transistor group are a first pixel light-emitting sub-area and a second pixel light-emitting sub-area, respectively; the light-shielding portion further includes a second sub-light-shielding portion electrically connected to the first sub-light-shielding portion, the first sub-light-shielding portion and the power supply signal line are located on a side of the transistor group proximate to the second pixel light-emitting sub-area, and the second sub-light-shielding portion is disposed between the transistor group and the first pixel light-emitting sub-area, the second sub-light-shielding portion is spaced apart from a source and a drain of a transistor proximate to the second sub-light-shielding portion; or
the light-shielding portion further includes a third sub-light-shielding portion disposed on a side of the transistor group proximate to the pixel circuit sub-area: two ends of the third sub-light-shielding portion are electrically connected to the first sub-light-shielding portion and the second sub-light-shielding portion, respectively, the third sub-light-shielding portion is spaced apart from a source and a drain of a transistor proximate to the third sub-light-shielding portion.

10. The display panel according to claim 9, wherein the first sub-light-shielding portion of the light-shielding portion and the power supply signal line adjacent to the first sub-light-shielding portion are of an integrative structure.

11. The display panel according to claim 8, further comprising:
a gate metal layer and a source-drain metal layer that are disposed between the semiconductor layer and the light-emitting layer, the source-drain metal layer being away from the substrate relative to the gate metal layer; wherein
the plurality of light-shielding portions are disposed in the gate metal layer; and
the plurality of power supply signal lines, and sources and drains of the transistors in the transistor groups are disposed in the source-drain metal layer.

12. The display panel according to claim 11, wherein two pixel light-emitting sub-areas that are located on two sides of the transistor group and adjacent to the transistor group are a first pixel light-emitting sub-area and a second pixel light-emitting sub-area, respectively; the light-shielding portion includes a first sub-light-shielding portion located between the transistor group and the power supply signal line and a second sub-light-shielding portion electrically connected to the first sub-light-shielding portion: the first sub-light-shielding portion and the power supply signal line are located on a side of the transistor group proximate to the second pixel light-emitting sub-area, and the second sub-light-shielding portion is disposed between the transistor group and the first pixel light-emitting sub-area: the light-shielding portion further includes:
a fourth sub-light-shielding portion disposed on a side of the transistor group away from a pixel circuit sub-area of pixel areas adjacent to the transistor group, two ends of the fourth sub-light-shielding portion being electrically connected to the first sub-light-shielding portion and the second sub-light-shielding portion, respectively.

13. The display panel according to claim 12, wherein the light-shielding portion further includes a third sub-light-shielding portion disposed on a side of the transistor group proximate to the at least one pixel circuit sub-area, and two ends of the third sub-light-shielding portion are electrically connected to the first sub-light-shielding portion and the second sub-light-shielding portion, respectively; the first sub-light-shielding portion, the second sub-light-shielding portion, the third sub-light-shielding portion and the fourth sub-light-shielding portion are connected to be frame-shaped.

14. The display panel according to claim 11, further comprising:
a plurality of auxiliary power supply signal lines disposed in the gate metal layer; wherein
a power supply signal line corresponds to at least one auxiliary power supply signal line; orthographic projections of the power supply signal line and an auxiliary power supply signal line in the at least one auxiliary power supply signal line on a plane where the display panel is located are at least partially overlapped with each other, and the power supply signal line and the auxiliary power supply signal line are electrically connected through at least one first via hole; and
the light-shielding portion is electrically connected to the power supply signal line through an auxiliary power supply signal line.

15. The display panel according to claim 14, wherein a first sub-light-shielding portion of the light-shielding portion and the auxiliary power supply signal line are of an integrative structure; the first sub-light-shielding portion is located between the transistor group and the power supply signal line.

16. The display panel according to claim 14, wherein the power supply signal line is electrically connected to auxiliary power supply signal lines, and a dimension of each auxiliary power supply signal line in the first direction is substantially equal to a dimension of the pixel light-emitting sub-area in the first direction; and
each auxiliary power supply signal line is electrically connected to a corresponding power supply signal line through a plurality of first via holes, and the plurality of first via holes are arranged in the first direction; a distance between two farthest first via holes is less than the dimension of the auxiliary power supply signal line in the first direction.

17. The display panel according to claim 1, comprising:
a substrate; and
a gate metal layer and a source-drain metal layer that are disposed on the substrate, and the source-drain metal layer being away from the substrate relative to the gate metal layer; wherein a plurality of first connection lines are disposed in the gate metal layer and extend in the first direction; a gate of each transistor in a same transistor group is electrically connected to a first connection line; and a plurality of second connection lines are disposed in the source-drain metal layer and extend in the first direction; an end of each second connection line is electrically connected to a first connection line through a second via hole, and another end of the second connection line is electrically connected to another transistor group; wherein the light-shielding portion is disposed in the source-drain metal layer, in a same gate driving circuit area, orthographic projections of a first connection line and a portion of a second connection line located in the gate driving circuit area on the substrate do not intersect with an orthographic projection of a light-shielding portion on the substrate.

18. The display panel according to claim 1, comprising:

a substrate; and a gate metal layer and a source-drain metal layer that are disposed on the substrate, the source-drain metal layer being away from the substrate relative to the gate metal layer, wherein a plurality of first connection lines are disposed in the gate metal layer and extend in the first direction, a gate of each transistor in a same transistor group is electrically connected to a first connection line; and a plurality of second connection lines are disposed in the source-drain metal layer and extend in the first direction, an end of each second connection line is electrically connected to a first connection line through a second via hole, and another end of the second connection line is electrically connected to another transistor group; wherein two pixel light-emitting sub-areas that are located on two sides of the transistor group and adjacent to the transistor group are a first pixel light-emitting sub-area and a second pixel light-emitting sub-area, respectively; the light-shielding portion is disposed in the gate metal layer, and the light-shielding portion includes a first sub-light-shielding portion located between the transistor group and the power supply signal line, a second sub-light-shielding portion electrically connected to the first sub-light-shielding portion and a fourth sub-light-shielding portion: the first sub-light-shielding portion and the power supply signal line are located on a side of the transistor group proximate to the second pixel light-emitting sub-area, and the second sub-light-shielding portion is disposed between the transistor group and the first pixel light-emitting sub-area; in a same gate driving circuit area, a fourth sub-light-shielding portion is located on a side of a second via hole away from a transistor group, and two ends of the fourth sub-light-shielding portion are electrically connected to a first sub-light-shielding portion and a second sub-light-shielding portion, respectively.

19. The display panel according to claim 18, wherein a plurality of third connection lines are disposed in the source-drain metal layer and extend in the first direction; a source and a drain of each transistor in a same transistor group are electrically connected to two third connection lines, respectively; and a plurality of fourth connection lines are disposed in the gate metal layer and extend in the second direction; wherein each second connection line is further electrically connected to a fourth connection line, so as to be electrically connected to another transistor group; and each third connection line is further electrically connected to a fourth connection line, so as to be electrically connected to another transistor group.

20. A display device comprising the display panel according to claim 1.

* * * * *

UNITED STATES PATENT AND TRADEMARK OFFICE
CERTIFICATE OF CORRECTION

| | |
|---|---|
| PATENT NO. | : 11,798,487 B2 |
| APPLICATION NO. | : 17/769457 |
| DATED | : October 24, 2023 |
| INVENTOR(S) | : Xuehuan Feng and Yongqian Li |

It is certified that error appears in the above-identified patent and that said Letters Patent is hereby corrected as shown below:

On the Title Page

Item (73) - 2nd Assignee: BOE TECHNOLOGY GROUP CO., LTD, Beijing (CN) should be BOE TECHNOLOGY GROUP CO., LTD., Beijing (CN).

Signed and Sealed this
Twenty-third Day of April, 2024

Katherine Kelly Vidal
*Director of the United States Patent and Trademark Office*